(12) United States Patent
Frougier et al.

(10) Patent No.: US 10,546,945 B2
(45) Date of Patent: Jan. 28, 2020

(54) SUB-THERMAL SWITCHING SLOPE VERTICAL FIELD EFFECT TRANSISTOR WITH DUAL-GATE FEEDBACK LOOP MECHANISM

(71) Applicant: International Business Machines Corporation, Armonk, NY (US)

(72) Inventors: Julien Frougier, Albany, NY (US); Ruilong Xie, Schenectady, NY (US); Steven Bentley, Albany, NY (US); Kangguo Cheng, Schenectady, NY (US); Nicolas Loubet, Guilderland, NY (US); Pietro Montanini, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/226,847

(22) Filed: Dec. 20, 2018

(65) Prior Publication Data
US 2019/0259857 A1     Aug. 22, 2019

Related U.S. Application Data

(62) Division of application No. 15/898,314, filed on Feb. 16, 2018, now Pat. No. 10,388,760.

(51) Int. Cl.
*H01L 29/66*     (2006.01)
*H01L 29/423*    (2006.01)
*H01L 29/78*     (2006.01)

(52) U.S. Cl.
CPC .. *H01L 29/66787* (2013.01); *H01L 29/42384* (2013.01); *H01L 29/66484* (2013.01); *H01L 29/66666* (2013.01); *H01L 29/7827* (2013.01); *H01L 29/7831* (2013.01)

(58) Field of Classification Search
CPC ......... H01L 29/66787; H01L 29/43284; H01L 29/66484; H01L 29/66666; H01L 29/7827; H01L 29/7831
USPC ...................................................... 257/401
See application file for complete search history.

(56) References Cited

U.S. PATENT DOCUMENTS

2019/0067459 A1*   2/2019   Balakrishnan .... H01L 29/66977

OTHER PUBLICATIONS

List of All IBM Related Applications, Appendix P, 2018.

* cited by examiner

*Primary Examiner* — Tong-Ho Kim
(74) *Attorney, Agent, or Firm* — Garg Law Firm, PLLC; Rakesh Garg; Joseph Petrokaitis

(57) ABSTRACT

Fabricating a feedback field effect transistor includes receiving a semiconductor structure including a substrate, a first source/drain disposed on the substrate, a fin disposed on the first source/drain, and a hard mask disposed on a top surface of the fin. A bottom spacer is formed on a portion of the first source/drain. A first gate is formed upon the bottom spacer. A sacrificial spacer is formed upon the first gate, a gate spacer is formed on the first gate from the sacrificial spacer, and a second gate is formed on the gate spacer. The gate spacer is disposed between the first gate and the second gate. A top spacer is formed around portions of the second gate and hard mask, a recess is formed in the top spacer and hard mask, and a second source/drain is formed in the recess.

4 Claims, 53 Drawing Sheets

PRIOR-ART

*PRIOR-ART*

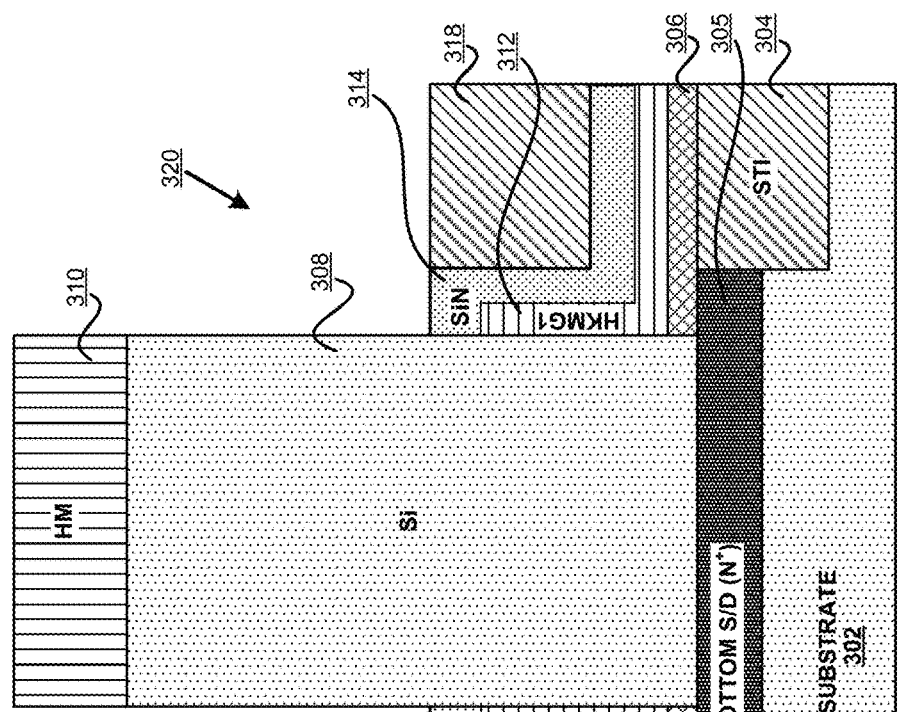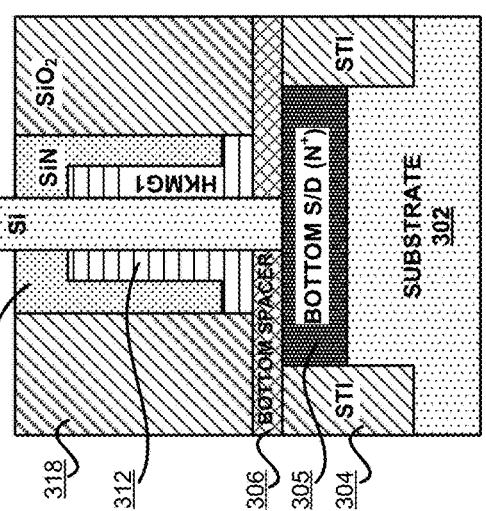
FIGURE 9

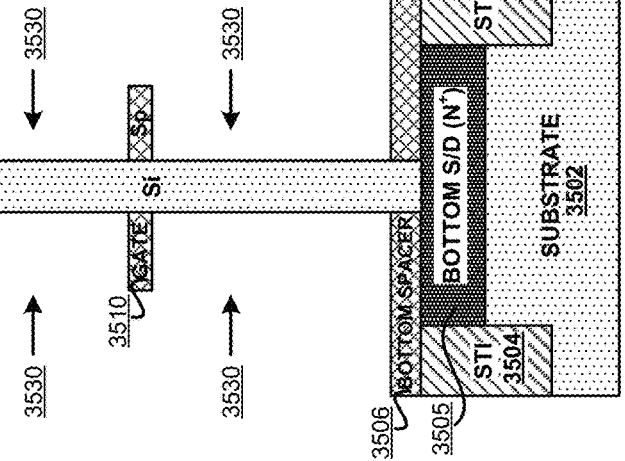
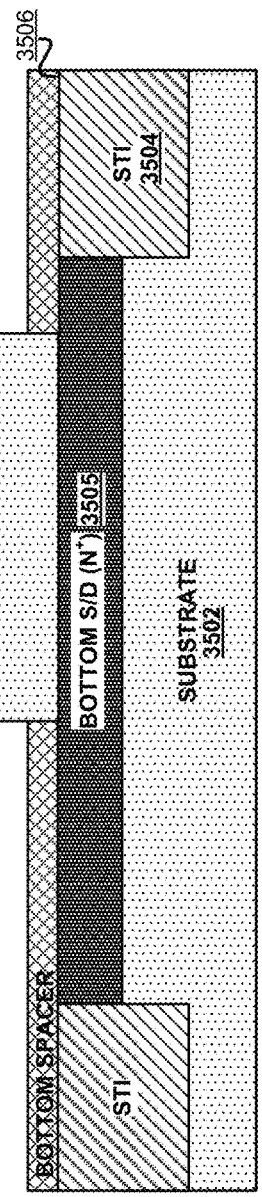
*FIGURE 42*

SUB-THERMAL SWITCHING SLOPE VERTICAL FIELD EFFECT TRANSISTOR WITH DUAL-GATE FEEDBACK LOOP MECHANISM

TECHNICAL FIELD

The present invention relates generally to a method for fabricating a vertical field effect transistor and an apparatus formed by the method. More particularly, the present invention relates to a method for fabricating a vertical field effect transistor with dual-gate feedback loop mechanism exhibiting sub-kT/q sub-threshold slope and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in rigid plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation is controlled to achieve the desired shape and electrical characteristics on the wafer.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the free charged carriers and consequently the electrical conductivity of a channel between the source and the drain. The channel is a charge carrier pathway constructed using a semiconductor material. A vertical field effect transistor (VFET) is a FET having a fin structure disposed on a semiconductor substrate and extending vertically from the substrate. In the VFET the channel extends vertically from a source/drain region disposed on substrate.

SUMMARY

The illustrative embodiments provide a method and apparatus. An embodiment of a method for fabricating a feedback field effect transistor includes receiving a semiconductor structure including a substrate, a first source/drain disposed on the substrate, a fin disposed on the first source/drain, and a hard mask disposed on a top surface of the fin. The embodiment further includes forming a bottom spacer on a portion of the first source/drain. The embodiment further includes forming a first gate upon the bottom spacer. The embodiment further includes forming a sacrificial spacer upon the first gate, forming a gate spacer on the first gate from the sacrificial spacer, and forming a second gate on the gate spacer, the gate spacer disposed between the first gate and the second gate. The embodiment further includes forming a top spacer around portions of the second gate and hard mask, forming a recess in the top spacer and hard mask, and forming a second source/drain in the recess.

An embodiment further includes depositing a dielectric material upon portions of the bottom spacer, first gate, and second gate. In an embodiment, the dielectric material includes an inter-layer dielectric material. An embodiment further includes forming a first gate contact within the dielectric material and in contact with the first gate, and forming a second gate contact within the dielectric material and in contract with the second gate. The embodiment further includes forming a first source/drain contact within the dielectric material and in contact with the first source/drain, and forming a second source/drain contact within the dielectric material and in contact with the second source/drain.

In an embodiment forming the first gate further includes depositing a conformal gate material upon the bottom spacer and portions of the fin, and recessing a portion of the gate material upon the bottom spacer to form the first gate. In an embodiment, forming the second gate further includes depositing a conformal gate material upon a top surface of the sacrificial spacer, and recessing a portion of the gate material to form the second gate.

In an embodiment, the first source/drain is formed of an n-type semiconductor material. In an embodiment, the second source/drain is formed of a p-type semiconductor material. In an embodiment, the first gate is formed of a high dielectric constant gate material. In an embodiment, the gate spacer is formed of a silicon nitride (SiN) material.

An embodiment of a method for fabricating a feedback field effect transistor includes receiving a semiconductor structure including a substrate, a first source/drain disposed on the substrate, a fin disposed on the first source/drain, and a hard mask disposed on a top surface of the fin. The embodiment further includes forming a bottom spacer on a portion of the first source/drain, depositing a first dielectric layer on the bottom spacer, and forming a gate spacer upon the first dielectric layer. The embodiment further includes depositing a second dielectric layer on the gate spacer, forming a top spacer on the second dielectric layer, and forming a sidewall spacer on the top spacer around a portion of the hard mask. The embodiment further includes depositing a gate material on portions of the bottom spacer, the fin, and the gate spacer, forming a first gate between the bottom spacer and gate spacer by removing portions of the gate material, and forming a second gate between the gate spacer and the top spacer by removing portions of the gate material. The embodiment further includes forming a recess in the sidewall spacer and hard mask, and forming a second source/drain in the recess.

An embodiment further includes depositing a first contact material in contact with the first gate, depositing a first dielectric material in contact with the first contact material, and depositing a second contact material on the first dielectric material in contact with the second gate. In an embodiment, the first contact material includes tungsten. In an embodiment, the dielectric material includes an inter-layer dielectric material.

An embodiment further includes forming a first gate contact within the first dielectric material and in contact with the first contact material, and forming a second gate contact within the first dielectric material and in contract with the second contact material.

An embodiment further includes forming a first source/drain contact within the first dielectric material and in contact with the first source/drain, and forming a second source/drain contact within the first dielectric material and in contact with the second source/drain.

An embodiment of a method for fabricating a feedback field effect transistor includes receiving a semiconductor structure including a substrate and a first source/drain disposed on the substrate, and forming a bottom spacer on a portion of the first source/drain. The embodiment further includes depositing a first dielectric layer on the bottom spacer, forming a gate spacer upon the first dielectric layer, and depositing a second dielectric layer on the gate spacer. The embodiment further includes forming a top spacer on the second dielectric layer, and depositing a third dielectric layer upon the top spacer. The embodiment further includes forming a fin trench through the third dielectric layer, the top spacer, the second dielectric layer, the gate spacer, the first dielectric layer, and the bottom spacer to a top surface of the first source/drain. The embodiment further includes forming a fin within the fin trench, forming a second source/drain on a top surface of the fin, and forming a hard mask on a top surface of the second source/drain. The embodiment further includes removing portions of the third dielectric layer, the top spacer, the second dielectric layer, the gate spacer, and the first dielectric layer. The embodiment further includes depositing a gate material on portions of the bottom spacer, the fin, and the gate spacer. The embodiment further includes forming a first gate between the bottom spacer and gate spacer by removing portions of the gate material, and forming a second gate between the gate spacer and the top spacer by removing portions of the gate material.

An embodiment further includes forming a sidewall spacer on the top spacer around a portion of the hard mask. An embodiment further includes depositing a first dielectric material on the bottom spacer in contact with the first gate, and depositing a contact material on the first dielectric material and in contact with the second gate. In an embodiment, the first contact material includes tungsten.

An embodiment further includes forming a first gate contact within the first dielectric material and in contact with the first gate, and forming a second gate contact within the first dielectric material and in contract with the contact material.

An embodiment further includes forming a first source/drain contact within the first dielectric material and in contact with the first source/drain, and forming a second source/drain contact within the first dielectric material and in contact with the second source/drain.

An embodiment of an apparatus includes a semiconductor structure including a substrate, a first source/drain disposed on the substrate, a fin disposed on the first source/drain, and a hard mask disposed on a top surface of the fin. The embodiment further includes a bottom spacer formed on a portion of the first source/drain, a first gate formed upon the bottom spacer, a gate spacer disposed on the first gate, and a second gate on the gate spacer, the gate spacer disposed between the first gate and the second gate. The embodiment further includes a top spacer disposed around portions of the second gate and hard mask, a recess formed in the top spacer and hard mask, and a second source/drain formed in the recess. An embodiment further includes a dielectric material deposited upon portions of the bottom spacer, first gate, and second gate.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 9 depicts another portion of the process;
FIG. 17 depicts another portion of the process;
FIG. 18 depicts another portion of the process.

FIG. 42 depicts another portion of the process.

DETAILED DESCRIPTION

Figure 1:
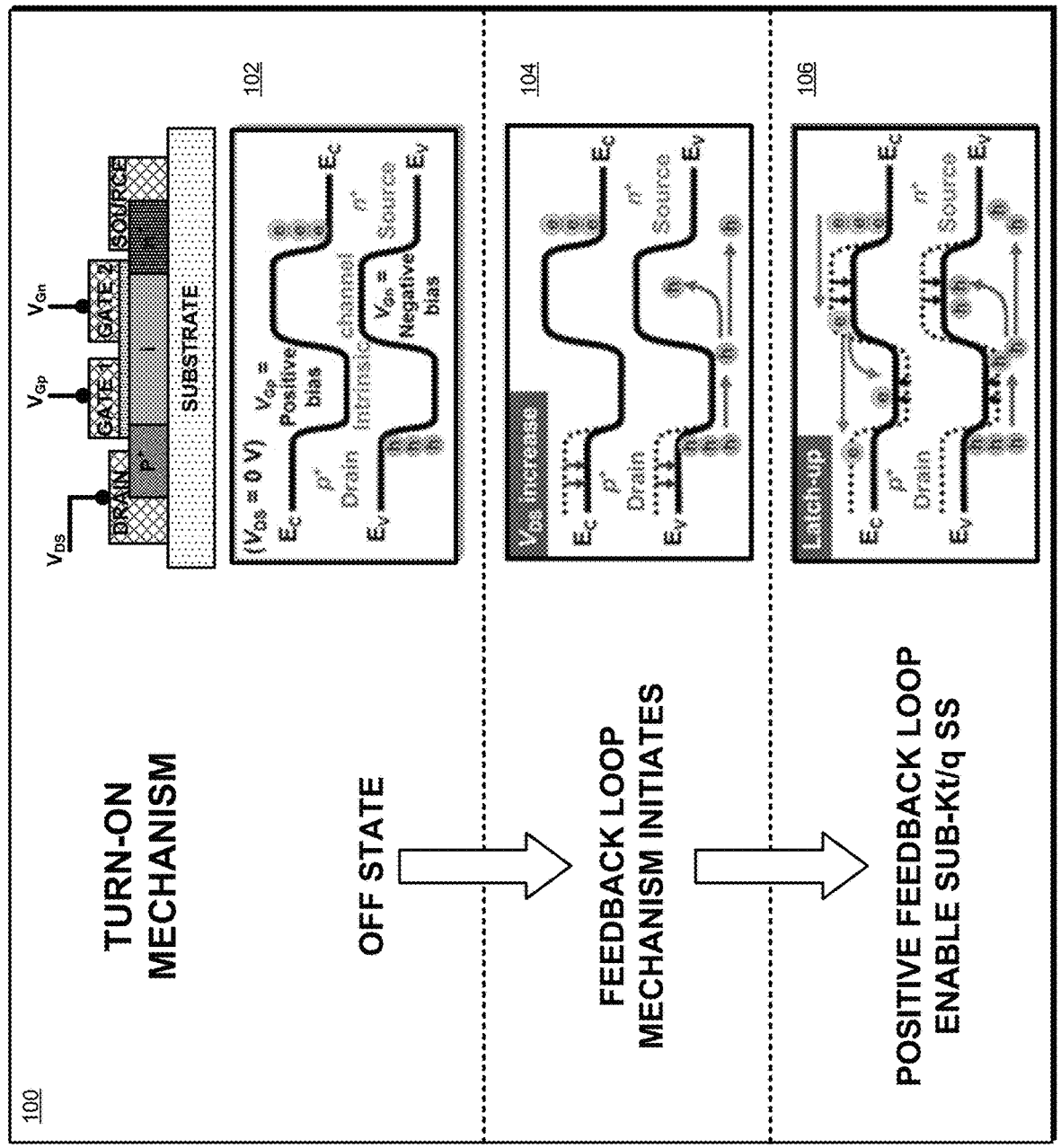
FIG. 1 illustrates a simplified illustration of example operating principles of a feedback FET (FB-FET)

One or more embodiments of the present invention are directed to a process for fabricating a vertical field effect transistor (VFET) with dual-gate feedback loop mechanism (FB-VFET) and an apparatus formed by the process. Conventional metal-oxide-semiconductor field effect transistors ("MOSFETs") typically have a subthreshold slope that is thermally limited to about 60-70 mV per decade at room temperature (about 300 Kelvin). In other words, for typical FET transistors, increasing the gate voltage by about 60 mV results in a corresponding drain current increase of less than about a factor of 10. This limited subthreshold slope cannot provide arbitrarily fast transitions between "OFF" (low current) and "ON" (high current) states of the FET transistor. Accordingly, the use of conventional FETs results in a trade-off between low power and high performance.

A semiconductor fabrication process typically includes a front-end-of-line (FEOL) stage, a middle-of-the-line (MOL) stage, and back-end-of-line (BEOL) stage. Typical FEOL processes include wafer preparation, well formation, channel formation, Shallow Trench Isolation (STI) formation, gate patterning, spacer, extension implantation, Source/Drain Epitaxy formation and implantation, and silicide formation. Typical MOL processes are mainly directed to source/drain (S/D) contact (CA) formation and gate contact (CB) formation. The MOL level of semiconductor manufacturing includes forming local interconnects within a device. In a typical MOL stage of a manufacturing process, an interface material, such as nickel silicide, is deposited on the source, drain, and gate of a transistor structure and contacts are then formed on top of the structures. In a typical BEOL stage of a manufacturing process, interconnects are formed on top of the contacts formed during the MOL stage to interconnect individual transistors and/or other semiconductor devices on the wafer.

One or more embodiments of the invention provide a VFET with a dual-gate feedback loop mechanism (FB-VFET) in which a turn-on/turn-off mechanism based upon a positive feedback loop between potential barriers and charge carries in the channel of the VFET is achieved through a dual-gate architecture. In one or more embodiments, the recursive feedback loop enables for a sub-kT/q sub-threshold slope. In one or more embodiments, a feedback loop FET device is provided that can operate in both an n-type FET (nFET) and p-type FET (pFET) polarities by adjusting a voltage configuration of the dual-gate. In particular embodiments, the dual mode operational capabilities may lead to fabrication process flow simplification compared to standard CMOS flow technologies.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate feedback VFET devices as described herein.

For the clarity of the description, and without implying any limitation thereto, the illustrative embodiments are described using a single feedback VFET (FB-VFET) device. An embodiment can be implemented with a different number of feedback VFETs within the scope of the illustrative embodiments. Furthermore, a transistor channel of various embodiments can have its shape and geometrical orientation other than the ones found in the feedback VFETs described herein including but not limiting to planar, surround-gate, multiple-gate, nano-wire or nano-sheet, and vertical channels. The feedback VFETs can be wired into a number of useful circuits such as CMOS logic circuits (e.g. NAND and NOR), memory cells (e.g. SRAM), analog circuits (e.g. PLL), and input/output (I/O) circuits.

Furthermore, simplified diagrams of the example feedback VFET devices are used in the figures and the illustrative embodiments. In an actual fabrication of an feedback VFET device, additional structures that are not shown or described herein may be present without departing the scope of the illustrative embodiments. Similarly, within the scope of the illustrative embodiments, a shown or described structure in the example feedback VFET devices may be fabricated differently to yield a similar operation or result as described herein.

Differently shaded portions in the two-dimensional drawing of the example feedback VFETs are intended to represent different structures in the example feedback VFETs, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a feedback VFET according to the illustrative embodiments.

Furthermore, the illustrative embodiments are described with respect to a feedback VFET only as an example. The steps described by the various illustrative embodiments can be adapted for fabricating other planar and non-planar devices, and such adaptations are contemplated within the scope of the illustrative embodiments.

An embodiment when implemented in a software application causes a fabrication system to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a manufacturing device, tool, or data processing system, comprises substantial advancement of the functionality of that manufacturing device, tool, or data processing system in fabricating feedback VFETs devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, FIG. 1 illustrates a simplified illustration of example operating principles of a feedback FET. A feedback FET includes a substrate, an intrinsic channel on the substrate, a doped n-type (n+) source in contact with the intrinsic channel, a doped p-type (p+) drain in contact with the intrinsic channel, a first gate (GATE1) located on top of the channel and overlapping both the intrinsic channel region and the p-type (p+) drain region, and a second gate (GATE 2) located on top of the channel and overlapping both the intrinsic channel region and the n-type (n+) source region. In an OFF state 102, a positive gate voltage $V_{Gp}$ and a negative gate voltage $V_{Gn}$ are applied to Gate 1 and Gate 2, respectively. The energy band structure of the feedback FET of FIG. 1 is similar to a band diagram of a p-n-p-n diode. Potential barriers in the intrinsic channel region are high enough to block the injection of electrons (or holes) from the source (or the drain) to the channel. As a result, the feedback FET device remains in the OFF state, even when a low drain-to-source voltage, $V_{DS}$, is applied.

In an initiation state 104 in which the feedback loop mechanism begins to initiate, increasing $V_{DS}$ reduces the energy level of the p+ drain. As a result, some holes flow toward the n+ source and others fall and accumulate in the potential well generated by $V_{Gn}$ (GATE 2). The accumulation of holes in the potential well of GATE 2 reduces the effective height of the potential barrier seen by the electrons on the source side, thereby allowing electrons from the n+ source to flow toward the intrinsic channel region.

In an enabled state 106 in which the positive feedback loop enables sub-kT/q sub-threshold slope, similarly, electrons start to flow toward the p+ drain across the intrinsic channel region and others fall and accumulate in the potential well generated by $V_{Gp}$ (GATE 1). The accumulation of electrons in the potential well of GATE 2 reduces the effective height of the potential barrier seen by the holes on the drain side, thereby allowing more holes from the p+ drain to flow toward the intrinsic channel region. As charge carriers are further injected, the charge carriers continue to accumulate in the potential wells of GATE 1 and GATE 2 resulting in the height of potential barriers being lowered exponentially. A positive feedback loop is produced as a result of the recursive and mutual interaction between the potential barriers and charge carriers. The positive feedback loop eliminates the potential barriers and triggers an abrupt increase in the diode current in the feedback FET.

Figure 2:
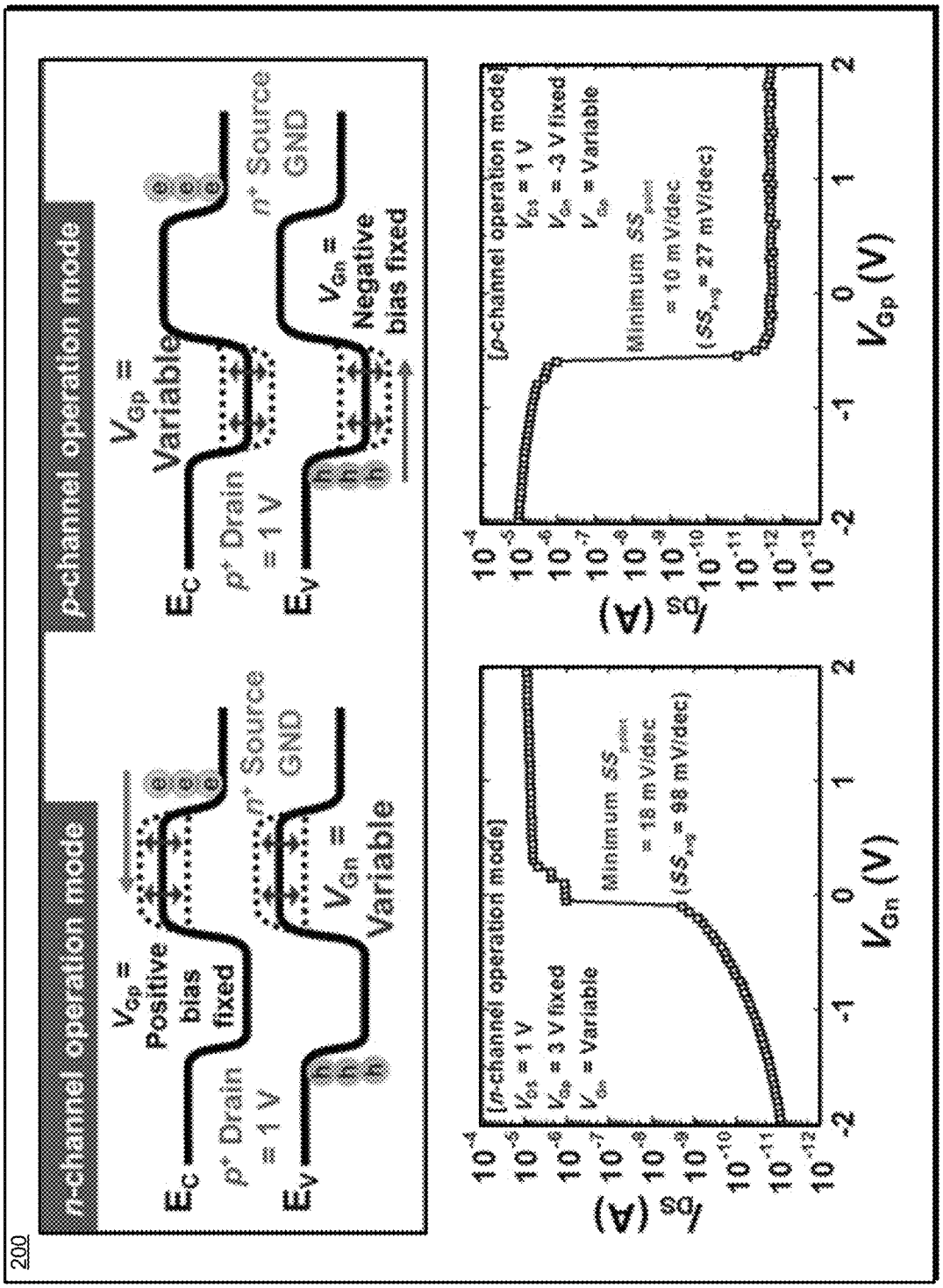
FIG. 2 illustrates a simplified illustration of example operating principles of the feedback FET (FB-FET) of FIG. 1 in n-FET and p-FET operating configurations.

With reference to FIG. 2, FIG. 2 illustrates a simplified illustration of example operating principles of the feedback FET of FIG. 1 in n-FET and p-FET operating configurations. In the nFET operation mode configuration, $V_{Gp}$ for Gate 1 is fixed to a positive bias and $V_{Gn}$ for Gate 2 is modulated. In the p-channel operation mode configuration, $V_{Gn}$ for Gate 2 is fixed to a negative bias and $V_{Gp}$ for Gate 1 is modulated.

With reference to FIGS. 3-16, these figures depict an example process for fabricating a vertical field effect transistor (VFET) with dual-gate feedback loop mechanism (FB-VFET) in accordance with an embodiment. In the embodiment illustrated in FIGS. 8-13, a fabrication system (not shown) fabricates a VFET with dual-gate feedback loop using a gate first process.

Figure 3:
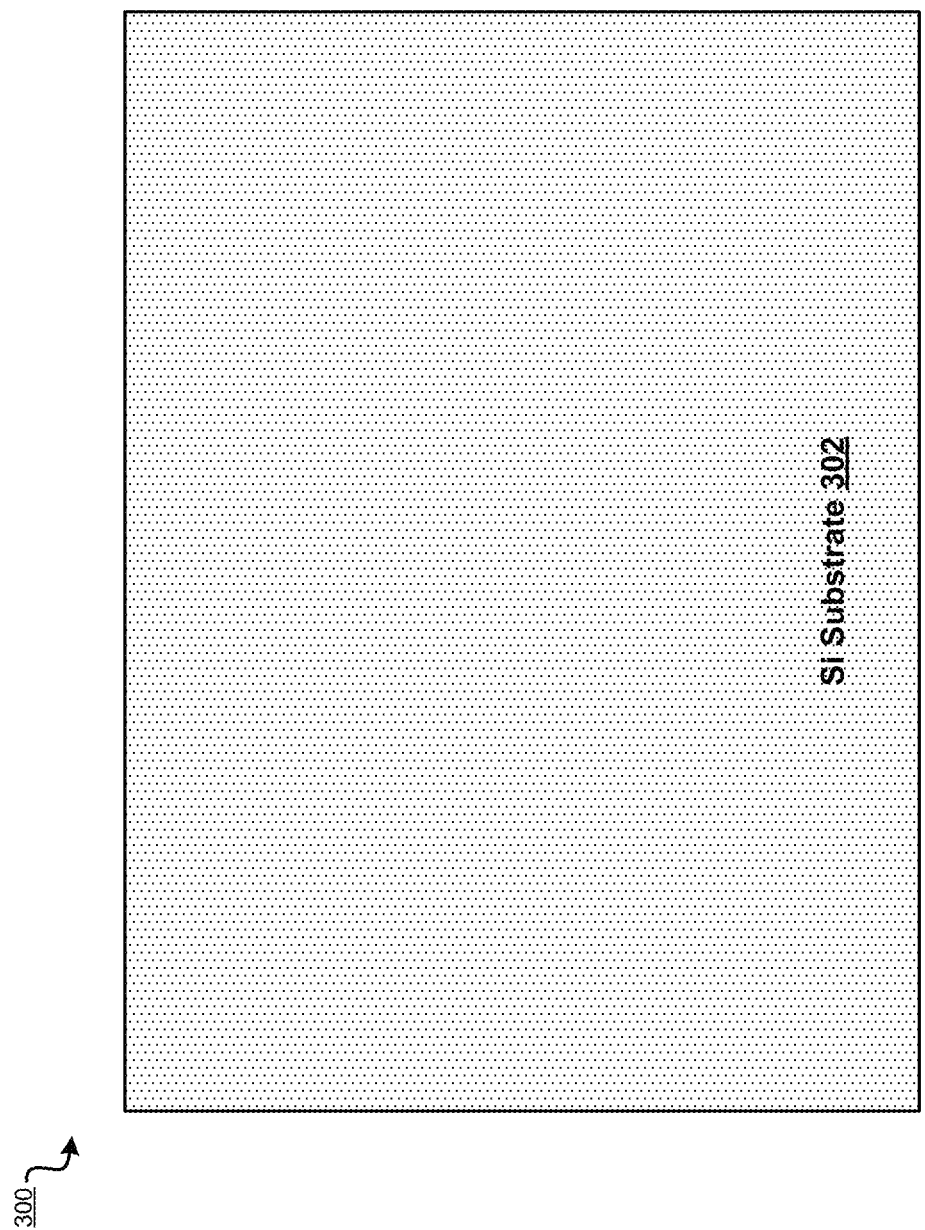
FIG. 3 depicts a portion of a process for fabricating a vertical field effect transistor with dual-gate feedback loop mechanism (FB-VFET) according to an embodiment.

With reference to FIG. 3, this figure depicts a portion of the process in which a semiconductor structure 300 is received. The semiconductor structure includes a silicon (Si) substrate 302.

Figure 4:
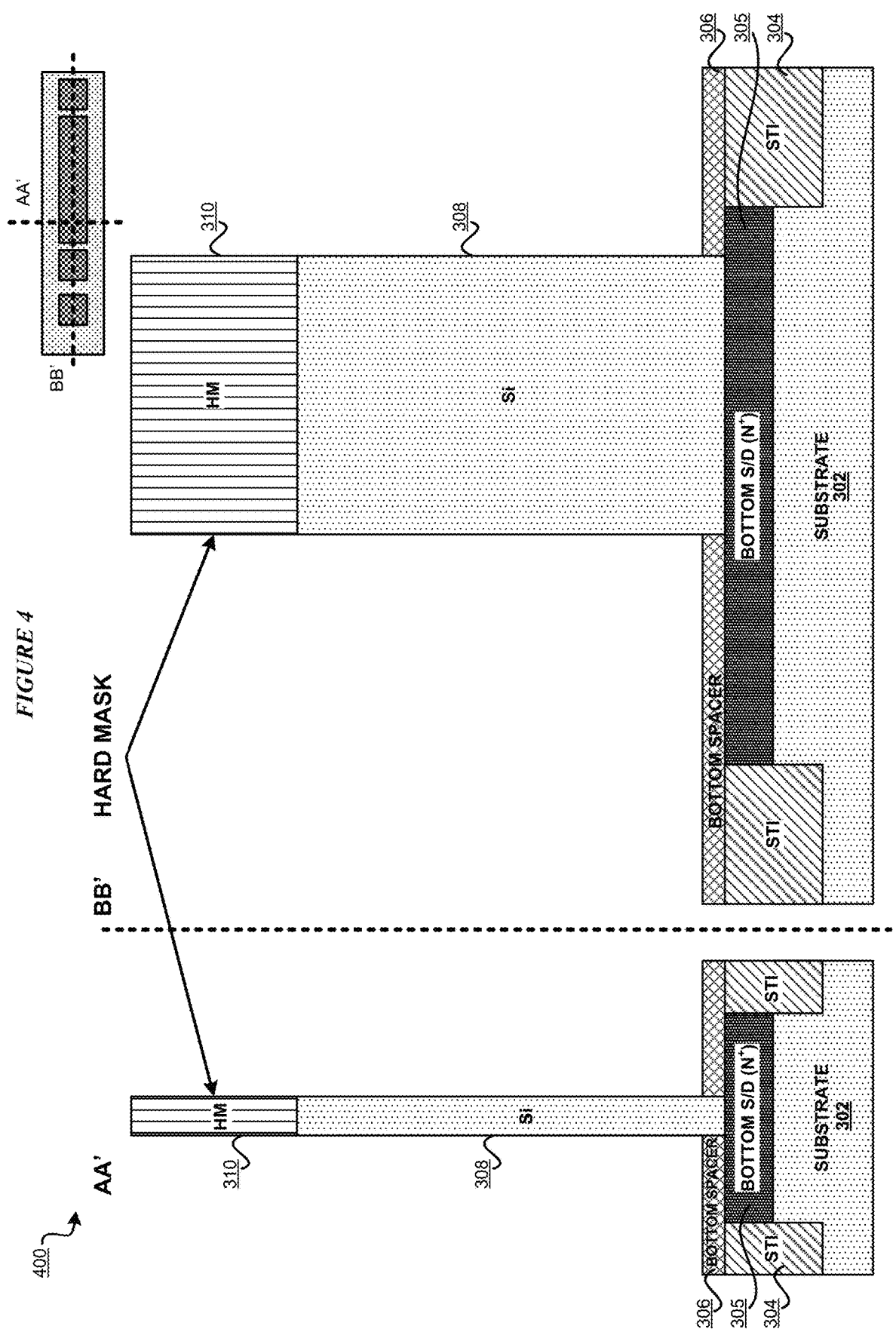
FIG. 4 depicts another portion of the process.

With reference to FIG. 4, this figure depicts another portion of the process in which a structure 400 is formed. FIG. 4 shows a first cross section view AA' along a first cross section of structure 400 and a second cross section view BB' along a second cross section of structure 400. Structure 400 includes substrate 302 having a shallow trench isolation (STI) layer 304 disposed upon substrate 302. Structure 400 further includes a bottom source/drain (S/D) 305 disposed upon substrate 302. In one or more embodiments, bottom S/D 305 is formed of an n-type (n+) semiconductor material. Structure 400 further includes a bottom spacer 306 disposed upon a portion of STI 304 and bottom S/D 305. Structure 400 further includes a fin 308 disposed vertically upon a portion of bottom S/D 305 and a hard mask 310 disposed upon a top of fin 308. In particular embodiments, STI layer 304, bottom S/D 305, bottom spacer 306, fin 308, and hard mask 310 are formed using conventional processes that are well-known in the art.

Figure 5:
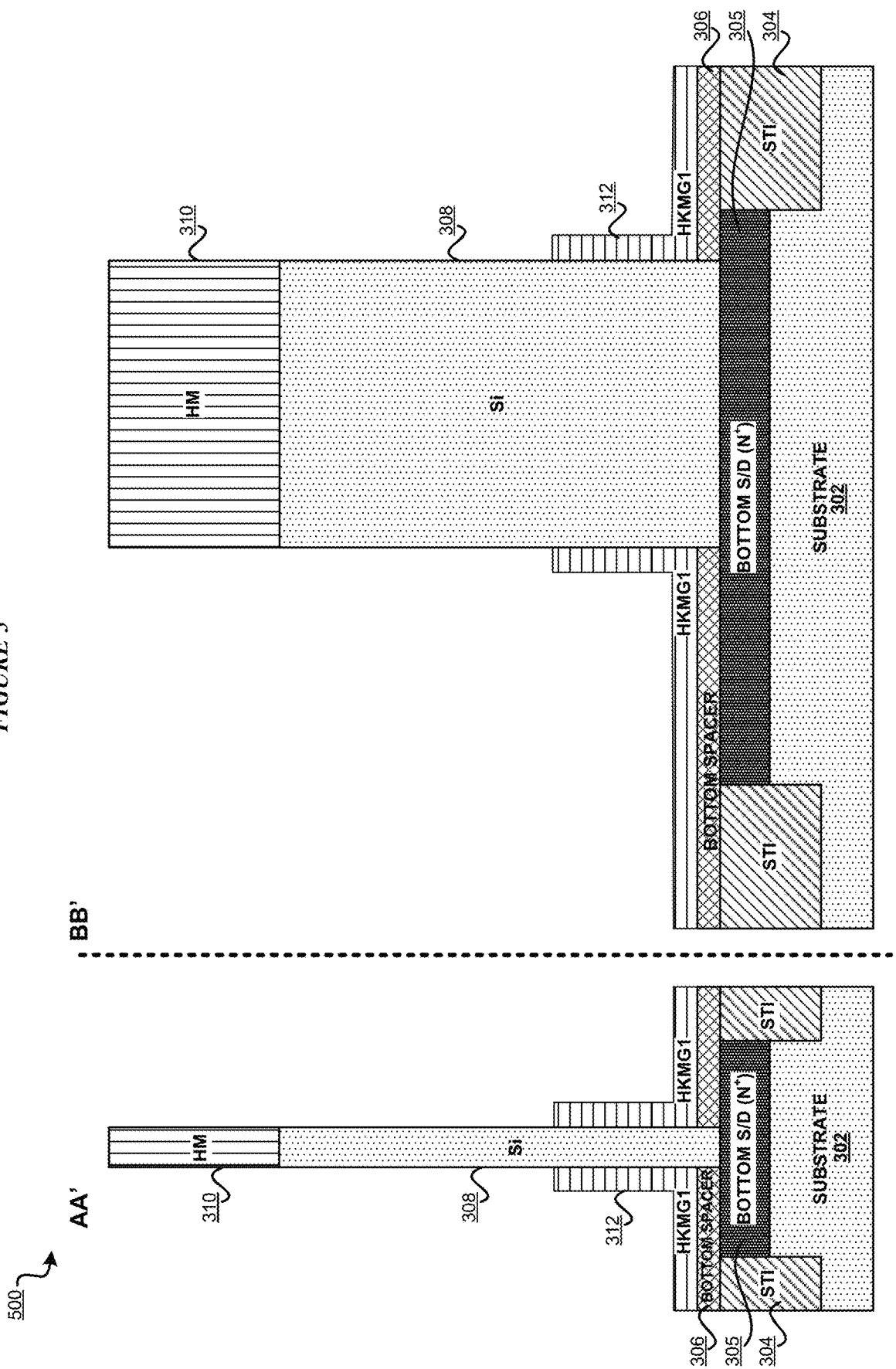
FIG. 5 depicts another portion of the process.

With reference to FIG. 5, this figure depicts another portion of the process in which a structure 500 is formed. FIG. 5 shows a first cross section view AA' along a first cross section of structure 500 and a second cross section view BB' along a second cross section of structure 500. In the embodiment of FIG. 5, the fabrication system deposits a conformal gate material upon bottom spacer 306 and portions of fin 308 and recesses a portion of the gate material upon fin 308 to form a first gate 312. In a particular embodiment, the gate stack (HKMG) includes an Interlayer Oxide (IL), a gate oxide with high dielectric constant (High-K material such as HfO2) and one or several layers of work function metals (such as TiN, TiC, . . . ).

Figure 6:
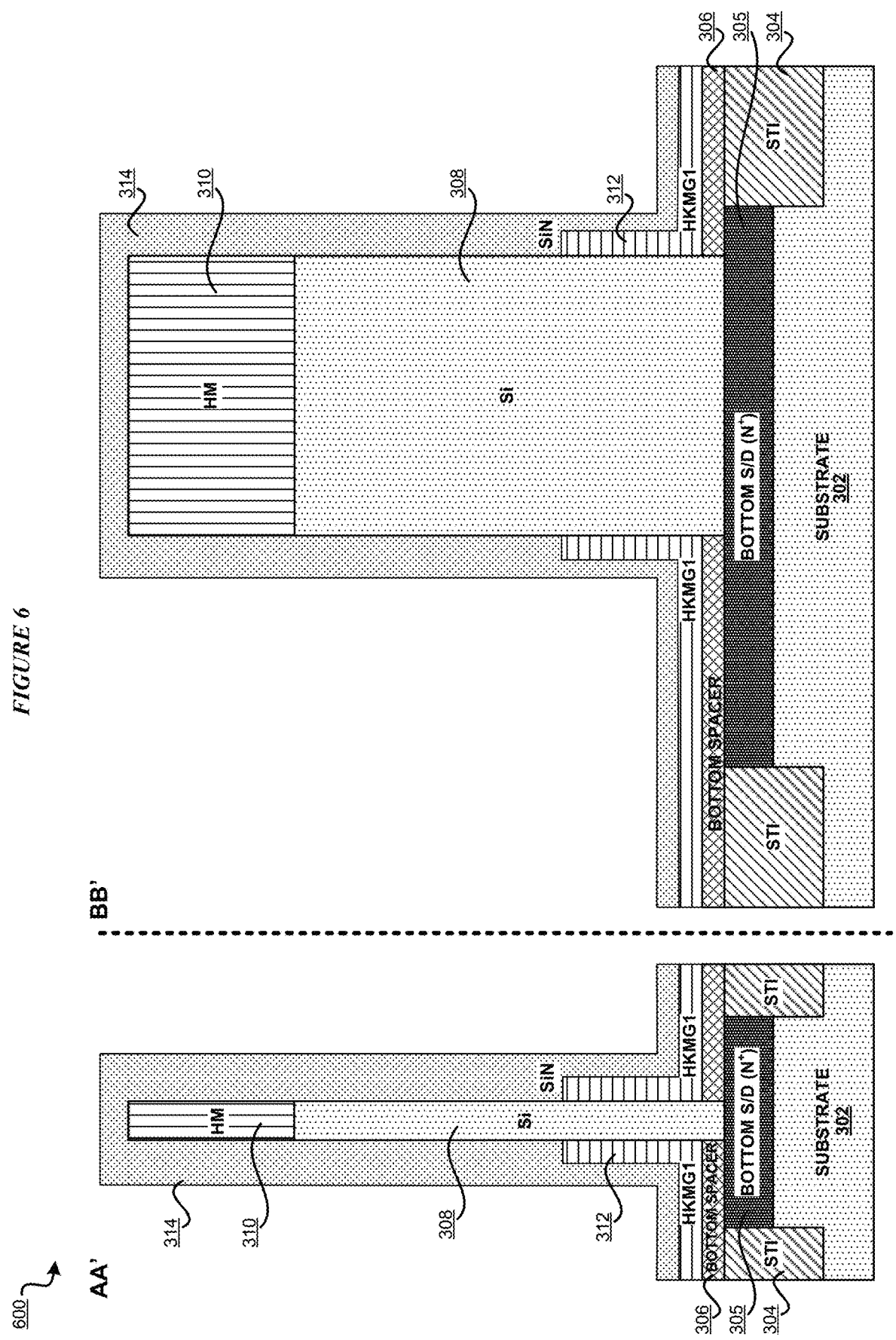
FIG. 6 depicts another portion of the process.

With reference to FIG. 6, this figure depicts another portion of the process in which a structure 600 is formed. FIG. 6 shows a first cross section view AA' along a first cross section of structure 600 and a second cross section view BB' along a second cross section of structure 600. In the embodiment of FIG. 6, the fabrication system deposits a sacrificial spacer 314 upon first gate 312, fin 308, and hard mask 310. In a particular embodiment, sacrificial spacer 314 is formed of a silicon nitride (SiN) material.

Figure 7:
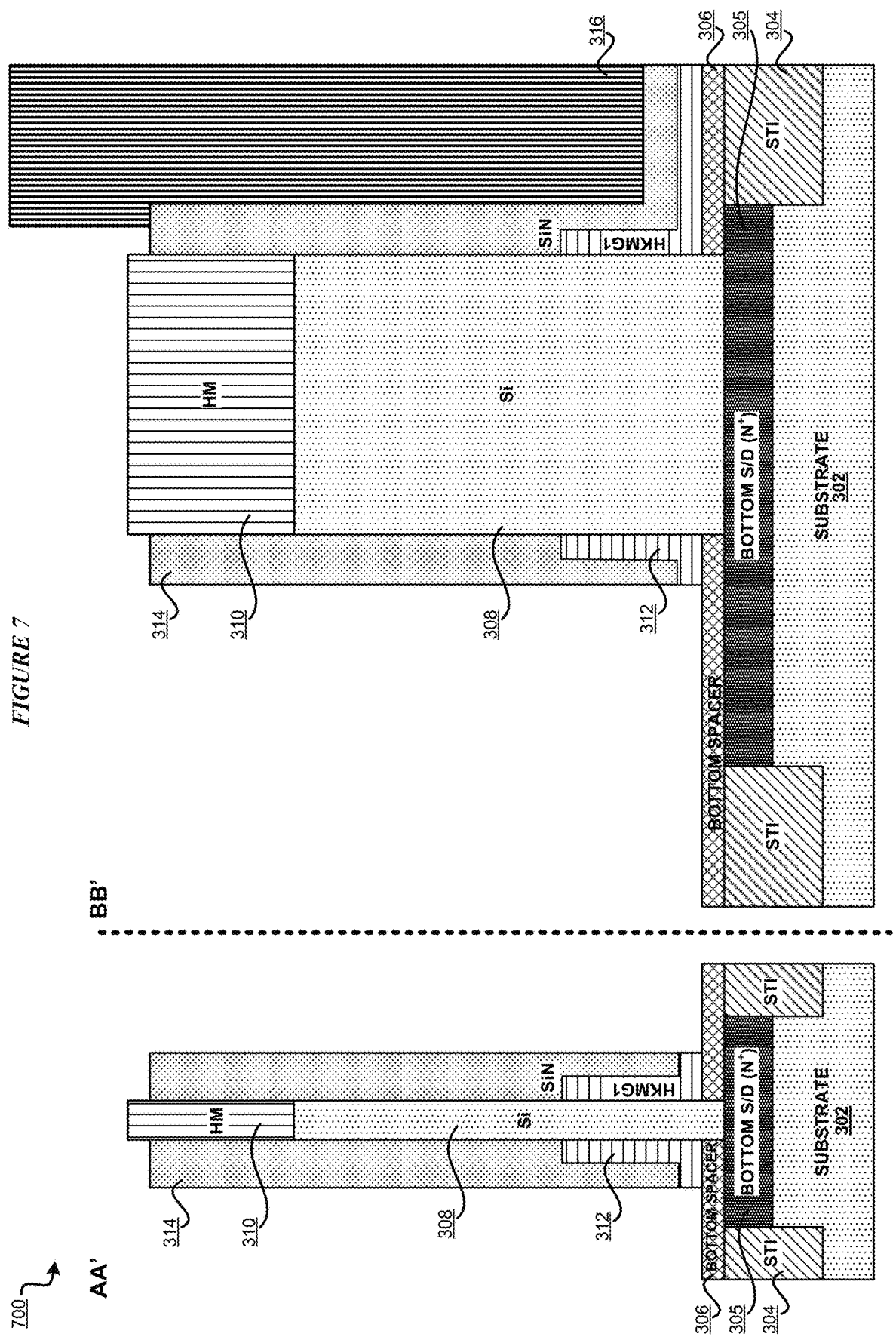
FIG. 7 depicts another portion of the process.

With reference to FIG. 7, this figure depicts another portion of the process in which a structure 700 is formed. FIG. 7 shows a first cross section view AA' along a first cross section of structure 700 and a second cross section view BB' along a second cross section of structure 700. In the embodiment of FIG. 7, the fabrication system recesses sacrificial spacer 314 to remove portions of sacrificial spacer 314 from first gate 312 and hard mask 310 while leaving portions of sacrificial spacer 314 upon portions of first gate 312 and fin 308. In the embodiment, the fabrication system further applies a photoresist 316 to a portion of sacrificial spacer 314 and performs lithographic patterning on portions of first gate 312. In the embodiment, the fabrication system further recesses the sacrificial spacer 314 and the first gate 312 to remove portions of first gate 312 from bottom spacer 306.

Figure 8:
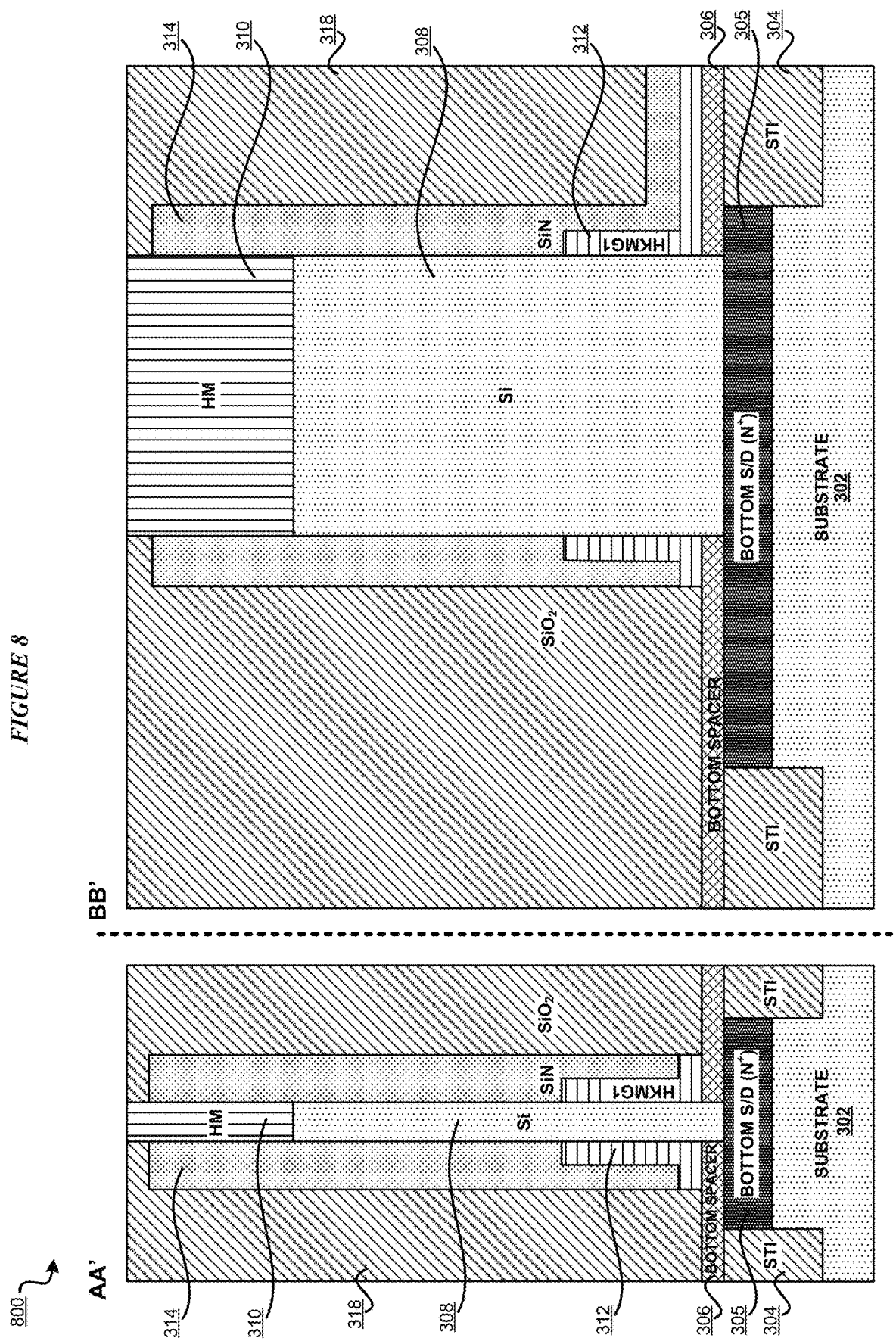
FIG. 8 depicts another portion of the process.

With reference to FIG. 8, this figure depicts another portion of the process in which a structure 800 is formed. FIG. 8 shows a first cross section view AA' along a first cross section of structure 800 and a second cross section view BB' along a second cross section of structure 800. In the embodiment of FIG. 8, the fabrication system strips photoresist 316 and fills recesses of structure 800 with a first inter-layer dielectric (ILD) 318 to a top surface of hard mask 310. In at least one embodiment, first ILD layer 318 is formed of silicon dioxide ($SiO_2$). In the particular embodiment, the fabrication system further performs a chemical mechanical planarization (CMP) process to planarize the surface of structure 800.

With reference to FIG. 9, this figure depicts another portion of the process in which a structure 900 is formed. FIG. 9 shows a first cross section view AA' along a first cross section of structure 900 and a second cross section view BB' along a second cross section of structure 900. In the embodiment of FIG. 9, the fabrication system forms a gate spacer recess 320 within sacrificial spacer 314 and first ILD 318 to expose portions of fin 308 and hard mask 310.

Figure 10:
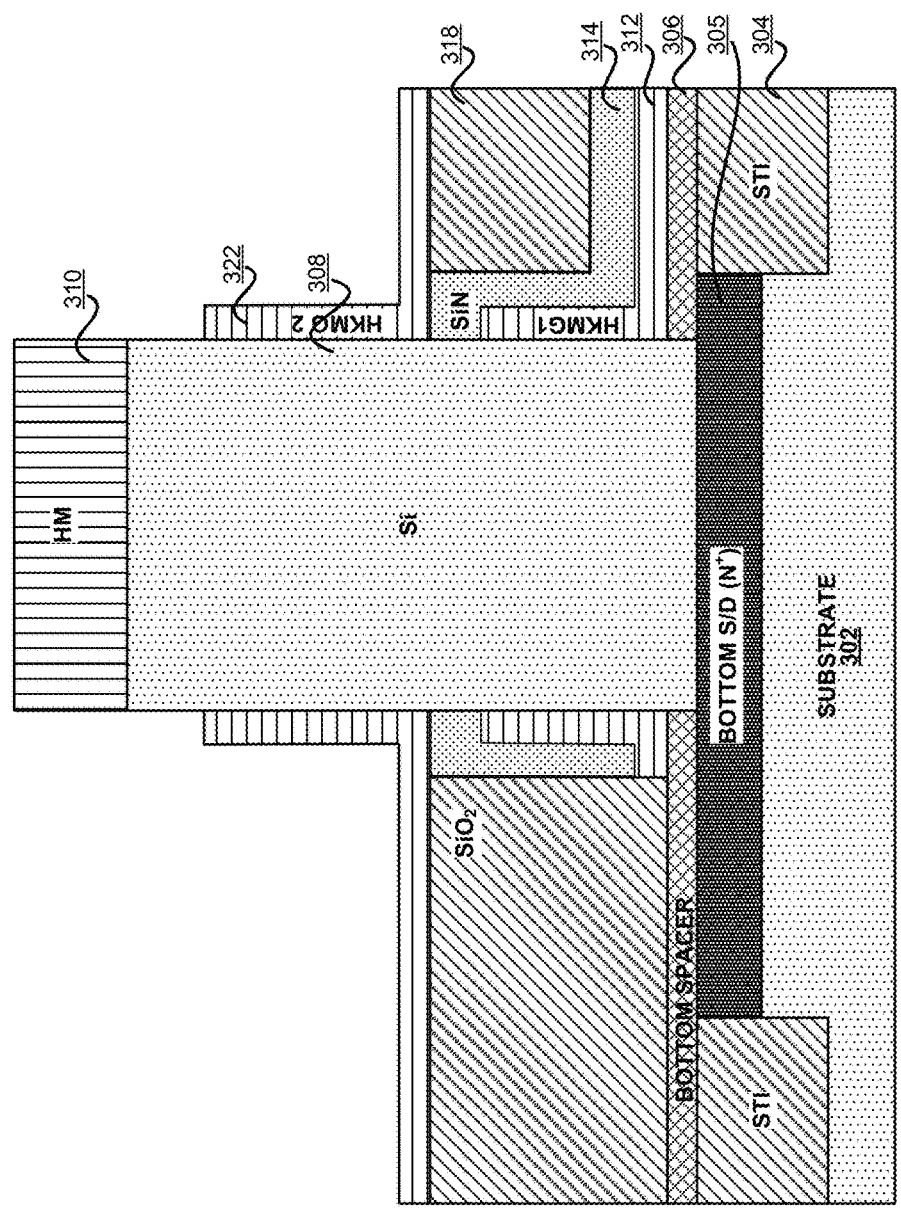
FIG. 10 depicts another portion of the process.

With reference to FIG. 10, this figure depicts another portion of the process in which a structure 1000 is formed. FIG. 10 shows a first cross section view AA' along a first cross section of structure 1000 and a second cross section view BB' along a second cross section of structure 1000. In the embodiment of FIG. 10, the fabrication system deposits a conformal gate material upon a top surface of first ILD 318 and sacrificial spacer 314 and recesses a portion of the gate material upon fin 308 to form a second gate 322. In a particular embodiment, the gate stack (HKMG) includes an Interlayer Oxide (IL), a gate oxide with high dielectric constant (High-K material such as HfO2) and one or several layers of work function metals (such as TiN, TiC, . . . ).

Figure 11:
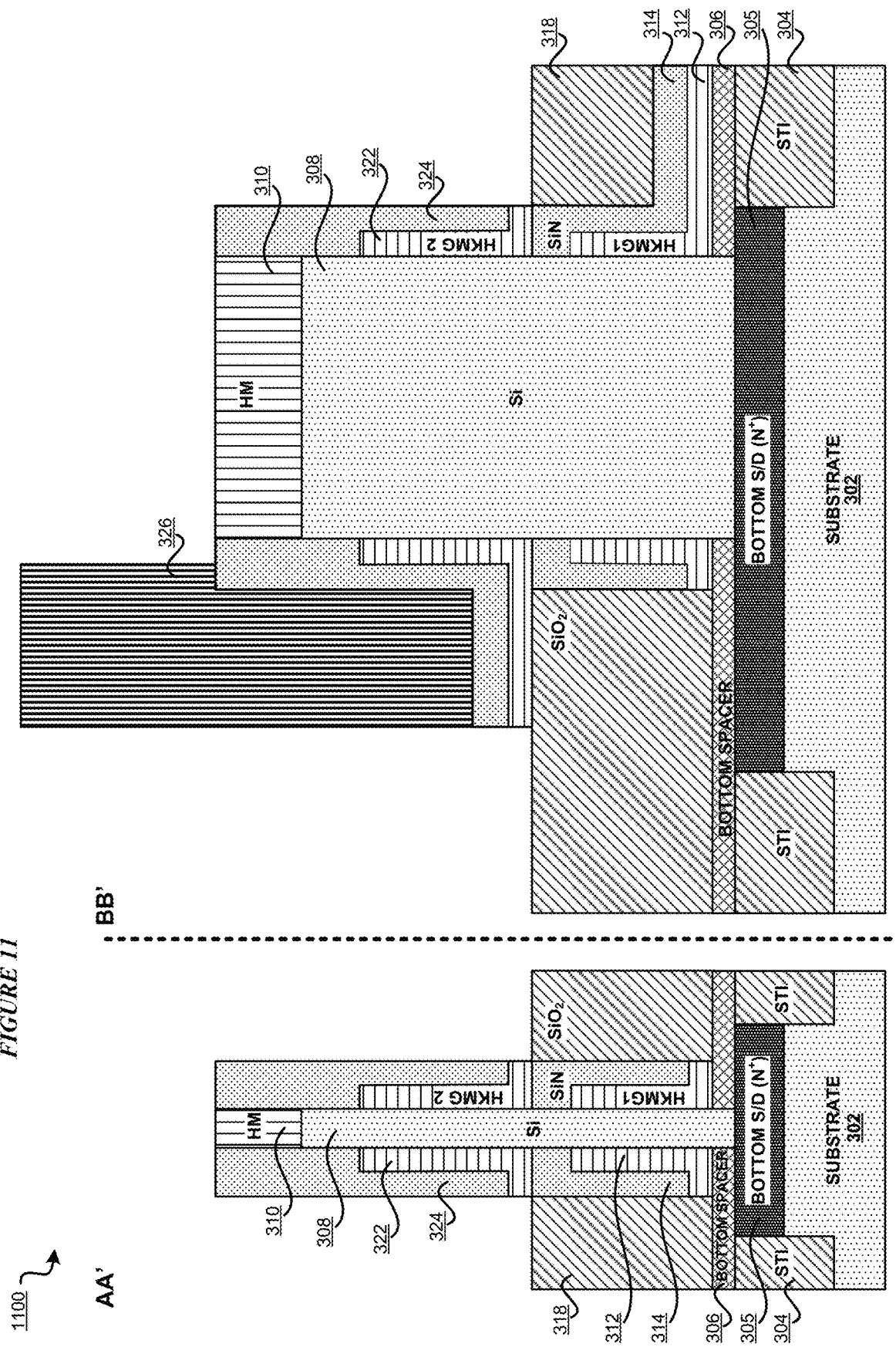
FIG. 11 depicts another portion of the process.

With reference to FIG. 11, this figure depicts another portion of the process in which a structure 1100 is formed. FIG. 11 shows a first cross section view AA' along a first cross section of structure 1100 and a second cross section view BB' along a second cross section of structure 1100. In the embodiment of FIG. 11, the fabrication system deposits a top spacer 324 around portions of second gate 322, fin 308, and hard mask 310. In the embodiment, the fabrication system further applies a photoresist 326 to a portion of second gate 322 and performs lithographic patterning on portions of second gate 322. In the embodiment, the fabrication system further recesses second gate 322 to remove portions of second gate 322 from first ILD 318.

Figure 12:
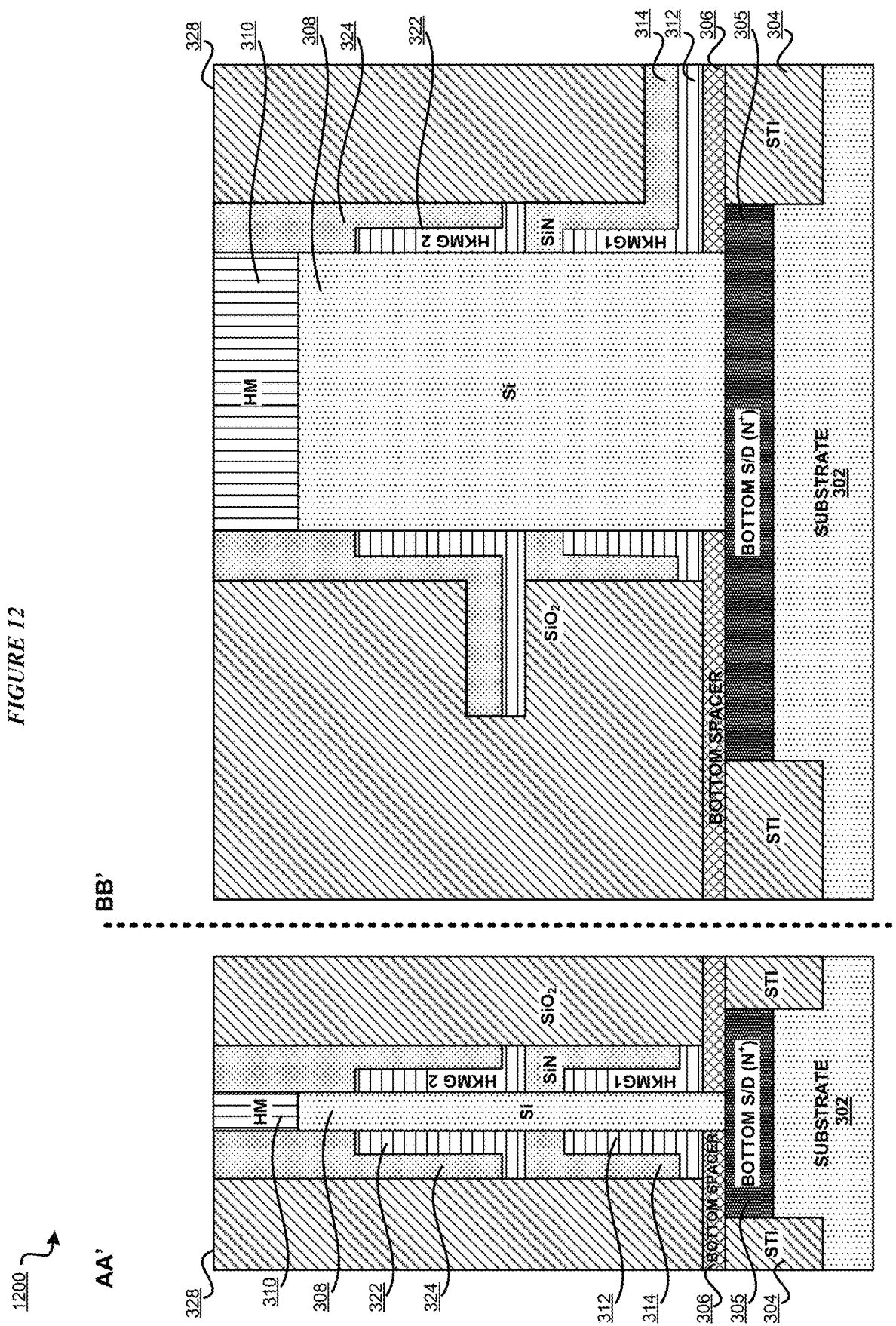
FIG. 12 depicts another portion of the process.

With reference to FIG. 12, this figure depicts another portion of the process in which a structure 1200 is formed. FIG. 12 shows a first cross section view AA' along a first cross section of structure 1200 and a second cross section view BB' along a second cross section of structure 1200. In the embodiment of FIG. 12, the fabrication system strips photoresist 326 and refills recesses of structure 1200 with a second inter-layer dielectric (ILD) 328 to the top surface of hard mask 310. In the particular embodiment, the fabrication system further performs a chemical mechanical planarization (CMP) process to planarize the surface of structure 1200.

Figure 13:
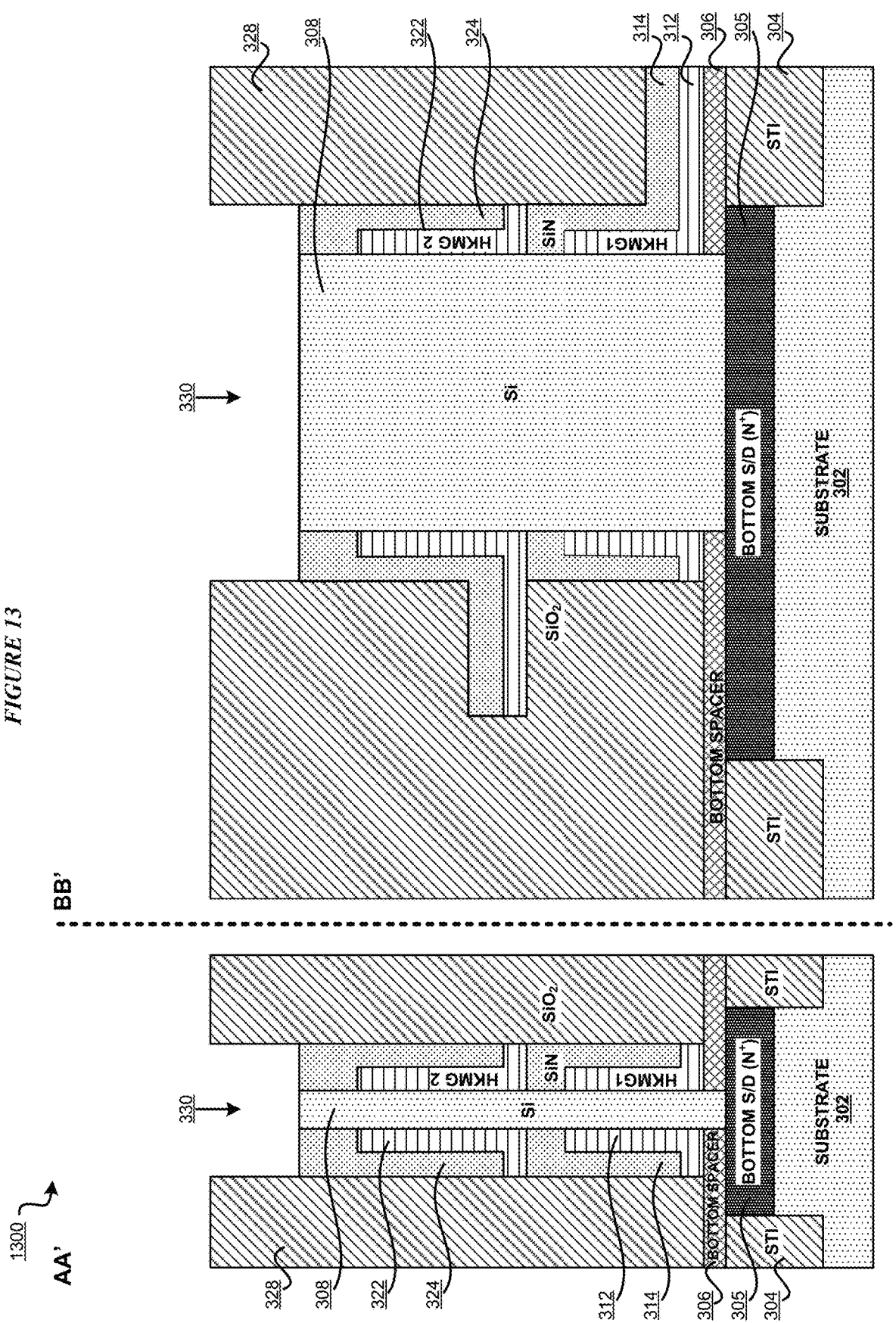
FIG. 13 depicts another portion of the process.

With reference to FIG. 13, this figure depicts another portion of the process in which a structure 1300 is formed. FIG. 13 shows a first cross section view AA' along a first cross section of structure 1300 and a second cross section view BB' along a second cross section of structure 1300. In the embodiment of FIG. 13, the fabrication system recesses portions of top spacer 324 and etches back hard mask 310 to form a top S/D recess 330.

Figure 14:
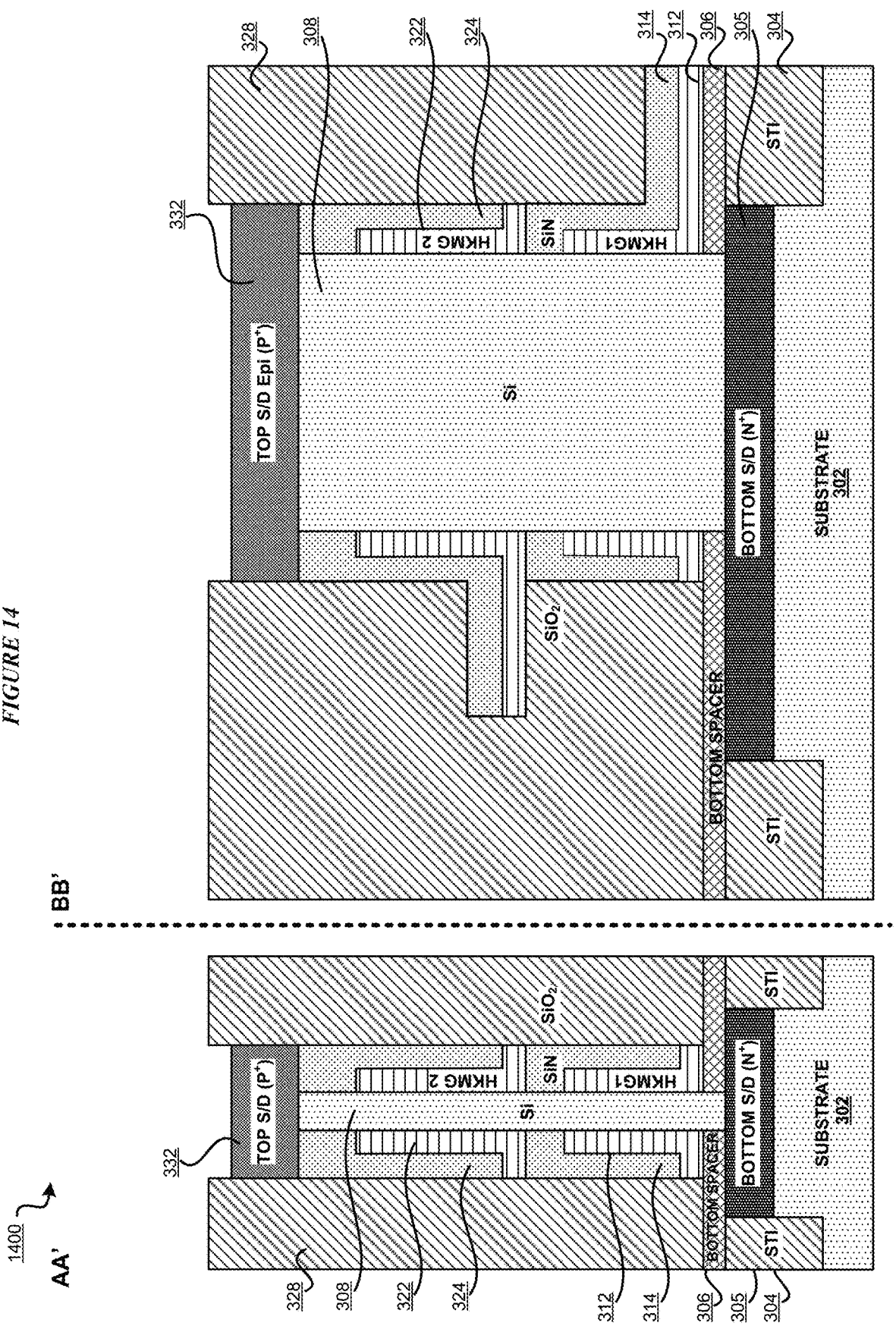
FIG. 14 depicts another portion of the process.

With reference to FIG. 14, this figure depicts another portion of the process in which a structure 1400 is formed. FIG. 14 shows a first cross section view AA' along a first cross section of structure 1400 and a second cross section view BB' along a second cross section of structure 1400. In the embodiment of FIG. 14, the fabrication system forms a top source/drain (S/D) 332 within top spacer recess 330. In one or more embodiments, top S/D 332 is formed using a epitaxy process. In one or more embodiments, top S/D 332 is formed of a p-type (p+) semiconductor material.

Figure 15:
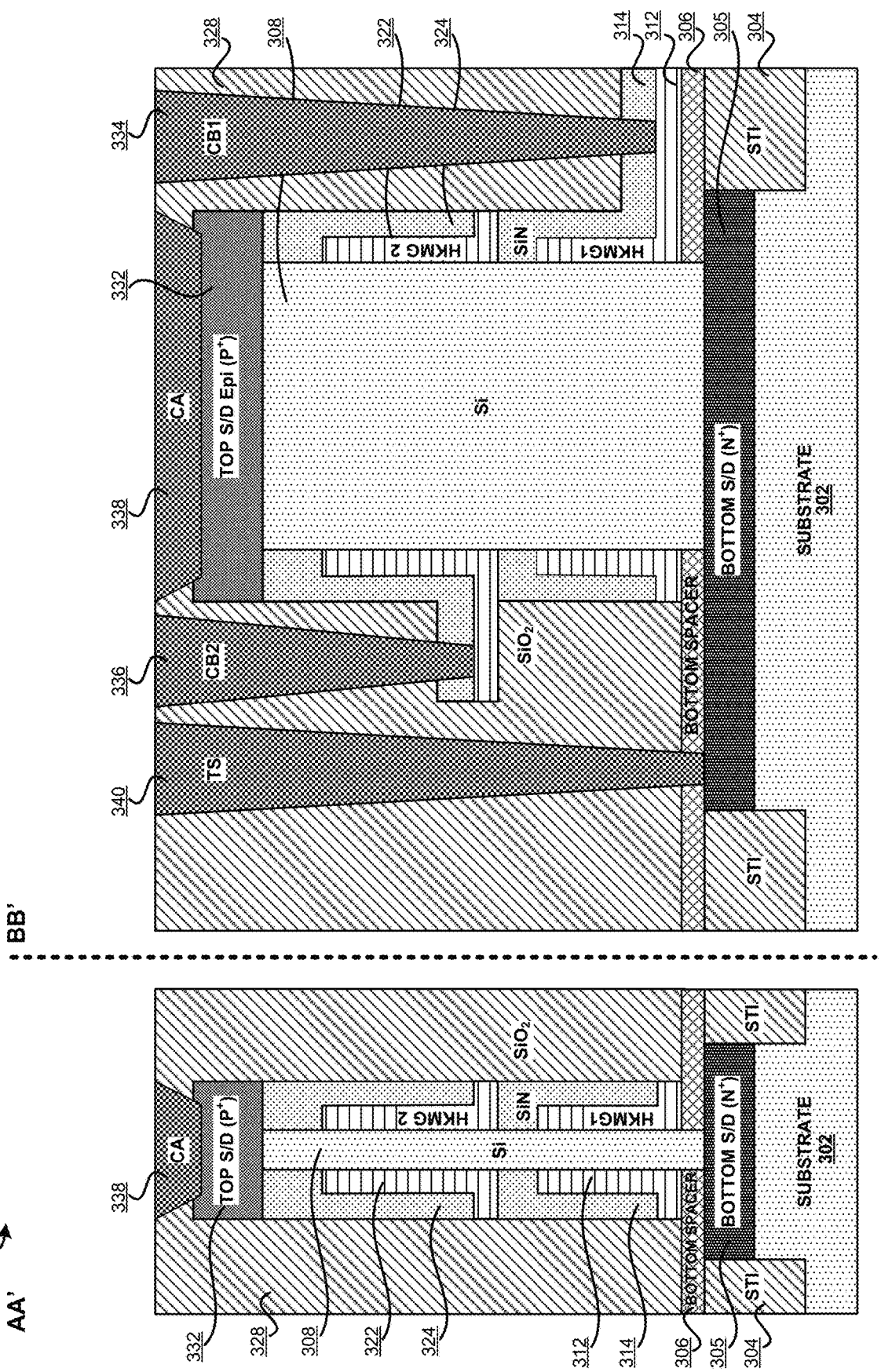
FIG. 15 depicts another portion of the process.

With reference to FIG. 15, this figure depicts another portion of the process in which a structure 1500 is formed. FIG. 15 shows a first cross section view AA' along a first cross section of structure 1500 and a second cross section view BB' along a second cross section of structure 1500. In the embodiment of FIG. 15, the fabrication system forms a first gate contact 334, a second gate contact 336, a top S/D contact 338, and a bottom S/D contact 340 within second ILD 328. First gate contact 334 is formed in contact with first gate 312 and extends to a top surface of second ILD 328. Second gate contact 336 is formed in contact with second gate 322 and extends to the top surface of second ILD 328. Top S/D contact 338 is formed in contact with top S/D 332 and extends to the top surface of second ILD 328, and bottom S/D contact 340 is formed in contact with bottom S/D 305 and extends to the top surface of second ILD 328. Accordingly, a VFET with dual-gate feedback loop is fabricated in accordance with an embodiment.

Figure 16:
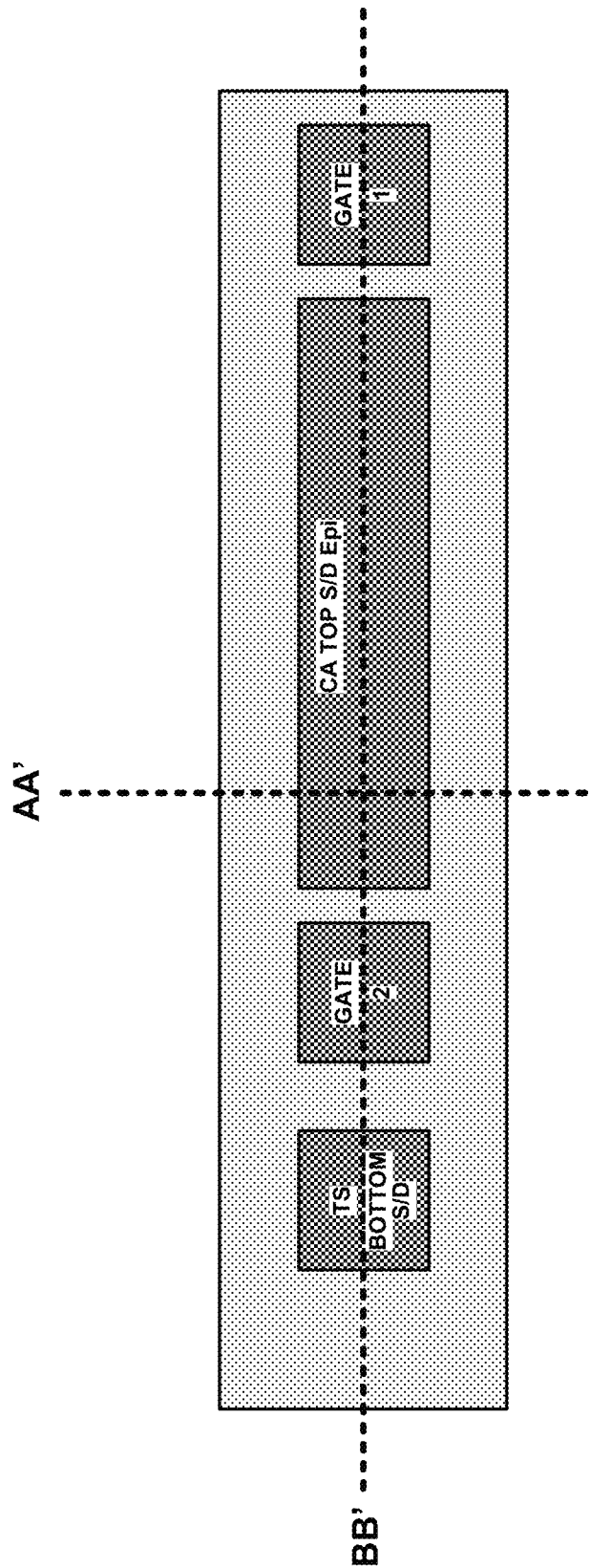
FIG. 16 depicts a top view of the VFET with dual-gate feedback loop mechanism of FIG. 15.

With reference to FIG. 16, this figure depicts a top view 1600 of the VFET with dual-gate feedback loop of FIG. 15. FIG. 16 further illustrates in a top view the first cross-section AA' line and second cross-section BB' line of FIG. 15.

Figure 17:
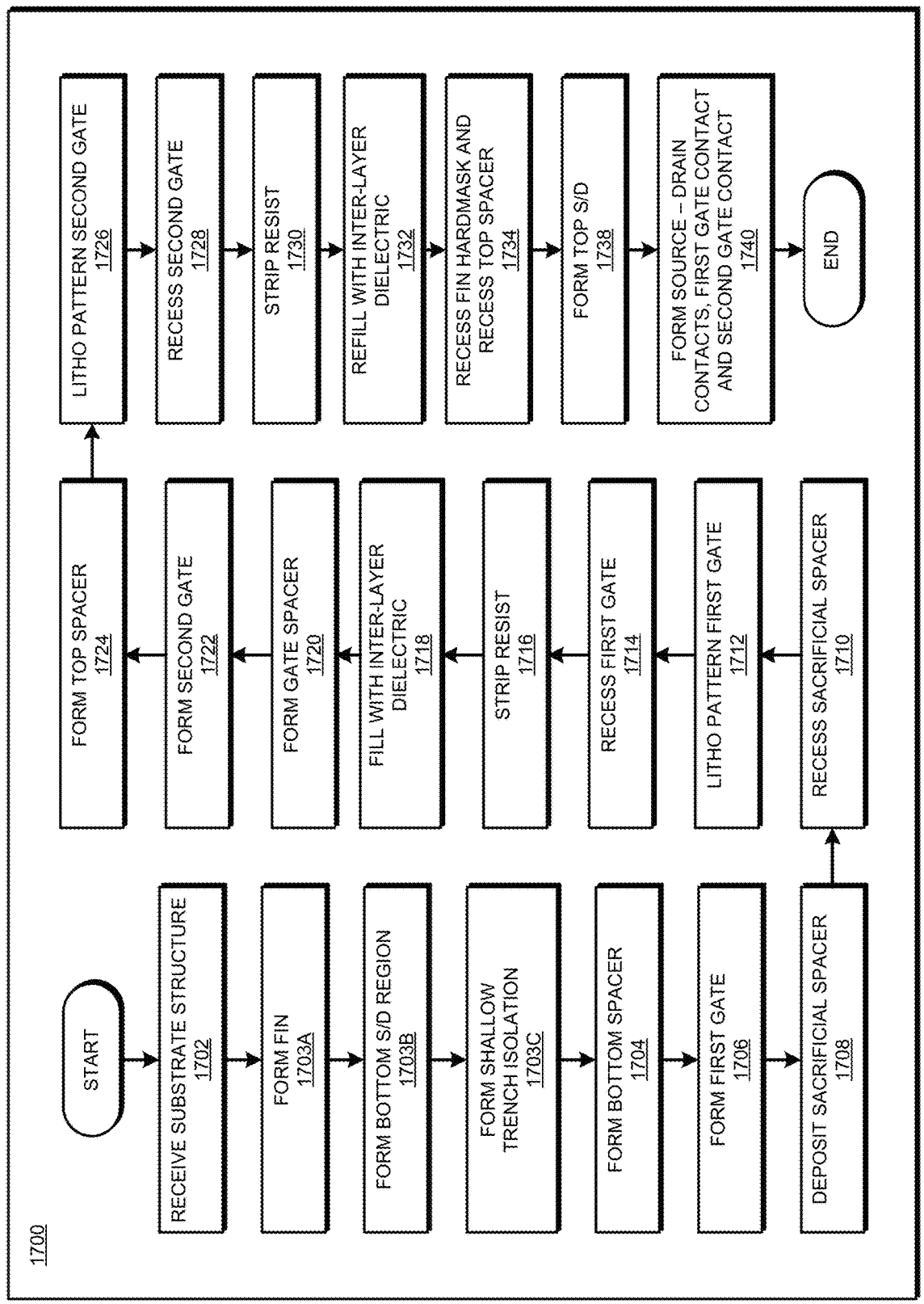
FIG. 17 depicts a flowchart of an example process for fabricating a VFET with dual-gate feedback loop in accordance with an illustrative embodiment.

With reference to FIG. 17, this figure depicts a flowchart of an example process 1700 for fabricating a VFET with dual-gate feedback loop in accordance with an illustrative embodiment. In block 1702, the fabrication system receives a substrate structure including substrate 302. In block 1703A, the fabrication system forms fin 308 disposed vertically upon a portion of substrate 302 and hard mask 310 disposed upon a top of fin 308. In block 1703B, the fabrication system forms bottom S/D 305 upon substrate 302. In one or more embodiments, bottom S/D 305 is formed of a n-type (n+) material. In block 1703C, the fabrication system forms shallow trench isolation (STI) layer 304 upon substrate 302.

In block 1704, the fabrication system forms bottom spacer 306 upon a portion of STI 304 and bottom S/D 305. In block 1706, the fabrication system forms first gate 312 upon bottom spacer 306. In a particular embodiment, the fabrication system forms first gate 312 by depositing a conformal gate material upon bottom spacer 306 and portions of fin 308 and recessing a portion of the gate material upon fin 308 to form a first gate 312. In a particular embodiment, the gate stack (HKMG) includes an Interlayer Oxide (IL), a gate oxide with high dielectric constant (High-K material such as HfO2) and one or several layers of work function metals (such as TiN, TiC, . . . ).

In block 1708, the fabrication system deposits sacrificial spacer 314 upon first gate 312, fin 308, and hard mask 310. In a particular embodiment, sacrificial spacer 314 is formed of a silicon nitride (SiN) material. In block 1710, fabrication system recesses sacrificial spacer 314 to remove portions of sacrificial spacer 314 from first gate 312 and hard mask 310 while leaving portions of sacrificial spacer 314 upon portions of first gate 312 and fin 308. In block 1712, the fabrication system further applies photoresist 316 to a portion of first gate 312 and performs lithographic patterning on portions of first gate 312. In block 1714, the fabrication system further recesses first gate 312 to remove portions of first gate 312 from bottom spacer 306.

In block 1716, the fabrication system strips photoresist 316. In block 1718, the fabrication system fills recesses of the structure with first inter-layer dielectric (ILD) 318 to a top surface of hard mask 310. In the particular embodiment, the fabrication system further performs a chemical mechanical planarization (CMP) process to planarize the surface of the structure.

In block 1720, the fabrication system forms a gate spacer recess 320 within sacrificial spacer 314 and first ILD 318 to expose portions of fin 308 and hard mask 310 to form a gate spacer on the first gate from sacrificial spacer 314. In block 1722, the fabrication system forms second gate 3322 by depositing a conformal gate material upon a top surface of first ILD 318 and sacrificial spacer 314 and recesses a portion of the gate material upon fin 308 to form a second gate 322. In a particular embodiment, the typical gate stack (HKMG) includes an Interlayer Oxide (IL), a gate oxide with high dielectric constant (High-K material such as HfO2) and one or several layers of work function metals (such as TiN, TiC, . . . ).

In block 1724, the fabrication system deposits top spacer 324 around portions of second gate 322, fin 308, and hard mask 310. In block 1726, the fabrication system further applies a photoresist 326 to a portion of second gate 322 and performs lithographic patterning on portions of second gate 322. In block 1728, the fabrication system further recesses second gate 322 to remove portions of second gate 322 from first ILD 318.

In block 1730, the fabrication system strips photoresist 326. In block 1732, the fabrication system refills recesses of the structure with second inter-layer dielectric (ILD) 328 to the top surface of hard mask 310. In the particular embodiment, the fabrication system further performs a chemical mechanical planarization (CMP) process to planarize the surface of the structure.

In block 1734, the fabrication system recesses hard mask 310 and portions of top spacer 324 to form top spacer recess 330. In 1738, the fabrication system forms top S/D 332 within top spacer recess 330. In one or more embodiments, top S/D 332 is formed using a epitaxy process. In one or more embodiments, top S/D 332 is formed of a p-type (p+) material.

In block 1740, the fabrication system forms first gate contact 334, second gate contact 336, top S/D contact 338, and bottom S/D contact 340 within second ILD 328. First gate contact 334 is formed in contact with first gate 312 and extends to a top surface of second ILD 328. Second gate contact 336 is formed in contact with second gate 322 and extends to the top surface of second ILD 328. Top S/D contact 338 is formed in contact with top S/D 332 and extends to the top surface of second ILD 328, and bottom S/D contact 340 is formed in contact with bottom S/D 305 and extends to the top surface of second ILD 328. The process then ends. Accordingly, a VFET with dual-gate feedback loop is fabricated by the process in accordance with an embodiment.

With reference to FIGS. 18-33, these figure depict another example process for fabricating a vertical field effect transistor (VFET) with dual-gate feedback loop mechanism in accordance with an embodiment. In the embodiment illustrated in FIGS. 18-33, a fabrication system (not shown) fabricates a VFET with dual-gate feedback loop using a gate last process.

Figure 18:
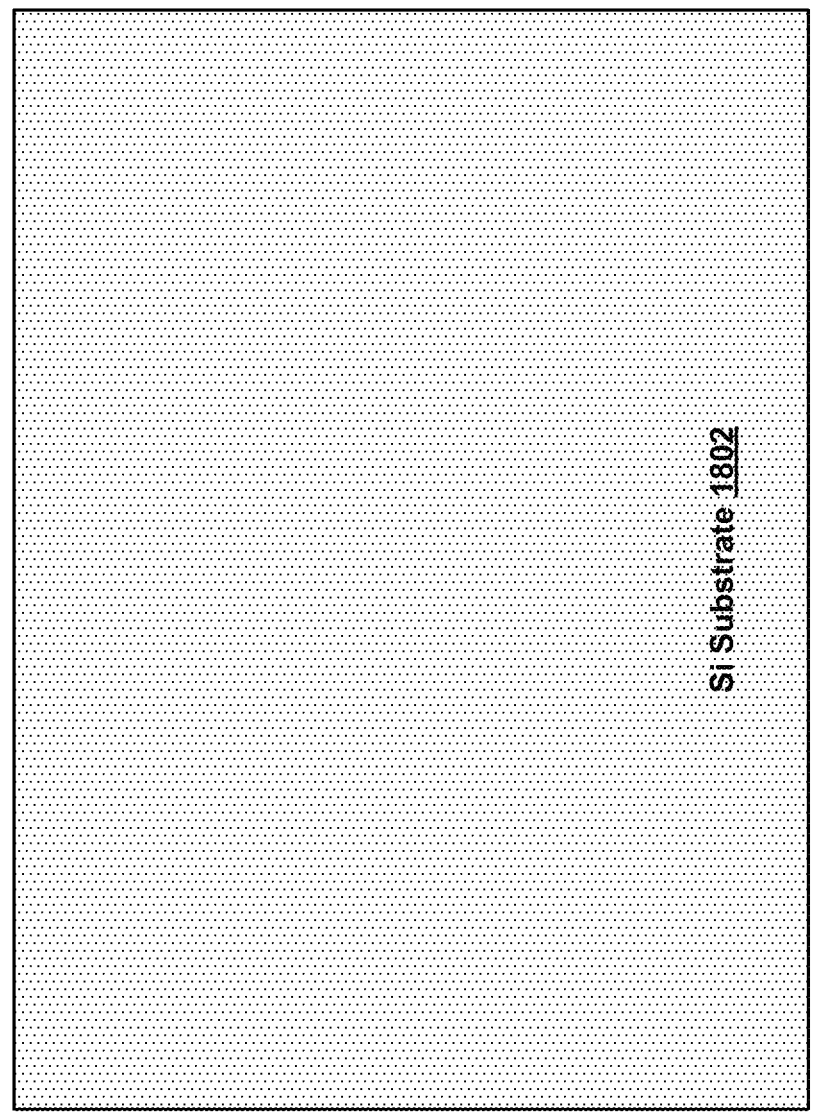
FIG. 18 depicts another example process for fabricating a vertical field effect transistor (VFET) with dual-gate feedback loop mechanism in accordance with an embodiment.

With reference to FIG. 18, this figure depicts a portion of the process in which a semiconductor structure 1800 is received. The semiconductor structure includes a silicon (Si) substrate 1802.

Figure 19:
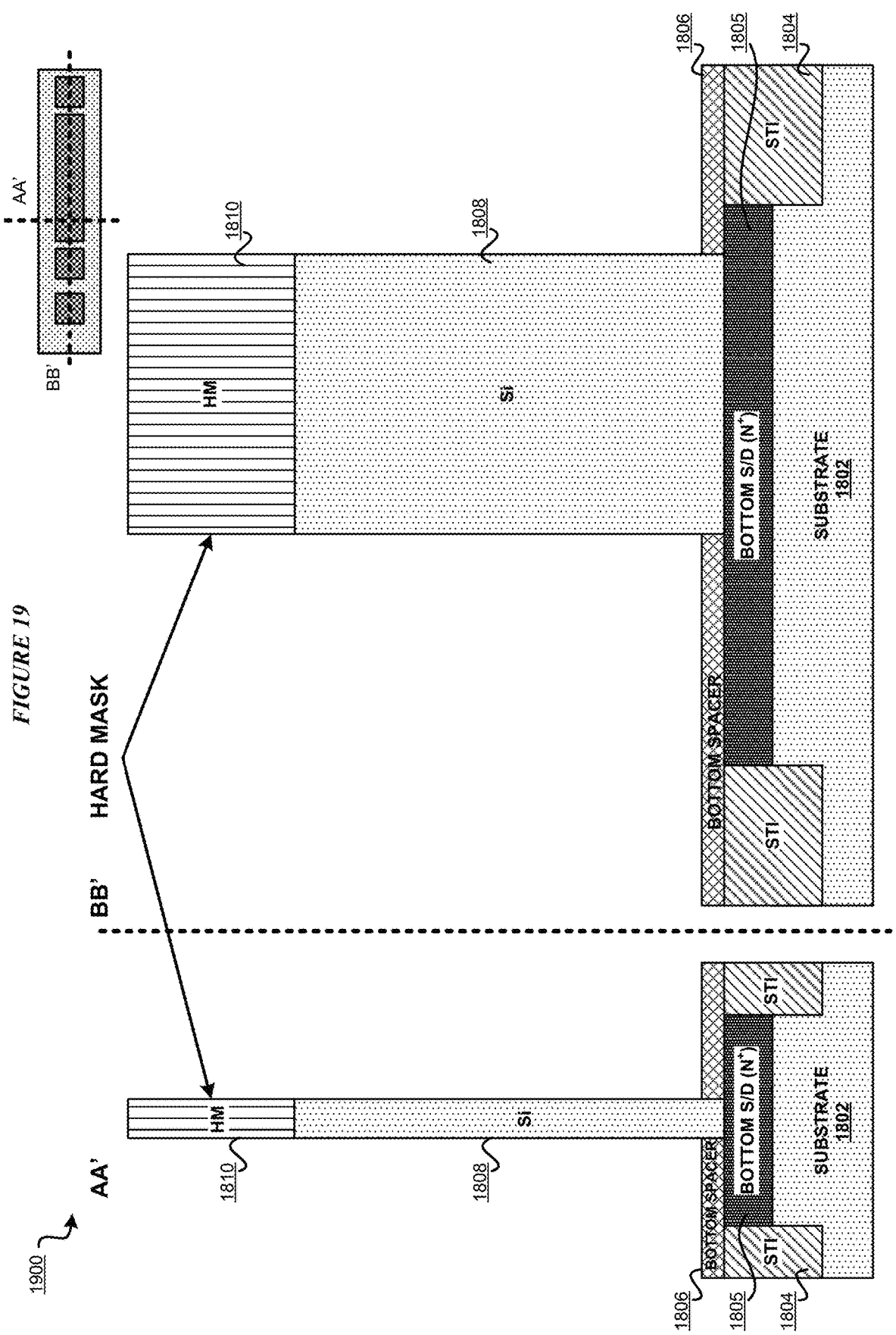
FIG. 19 depicts another portion of the process.

With reference to FIG. 19, this figure depicts a portion of the process in which a structure 1900 is formed. FIG. 19 shows a first cross section view AA' along a first cross section of structure 1900 and a second cross section view BB' along a second cross section of structure 1900. Structure 1900 includes substrate 1802 having a shallow trench isolation (STI) layer 1804 disposed upon substrate 1802. Structure 1900 further includes a bottom source/drain (S/D) 1805 disposed upon substrate 1802. In one or more embodiments, bottom S/D 1805 is formed of a n-type (n+) material. Structure 1900 further includes a bottom spacer 1806 disposed upon a portion of STI 1804 and bottom S/D 1805. Structure 1900 further includes a fin 1808 disposed vertically upon a portion of bottom S/D 1805 and a hard mask 1810 disposed upon a top of fin 1808. In particular embodiments, STI layer 1804, bottom S/D 1805, bottom spacer 1806, fin 1808, and hard mask 1810 are formed using conventional processes that are well-known in the art.

Figure 20:
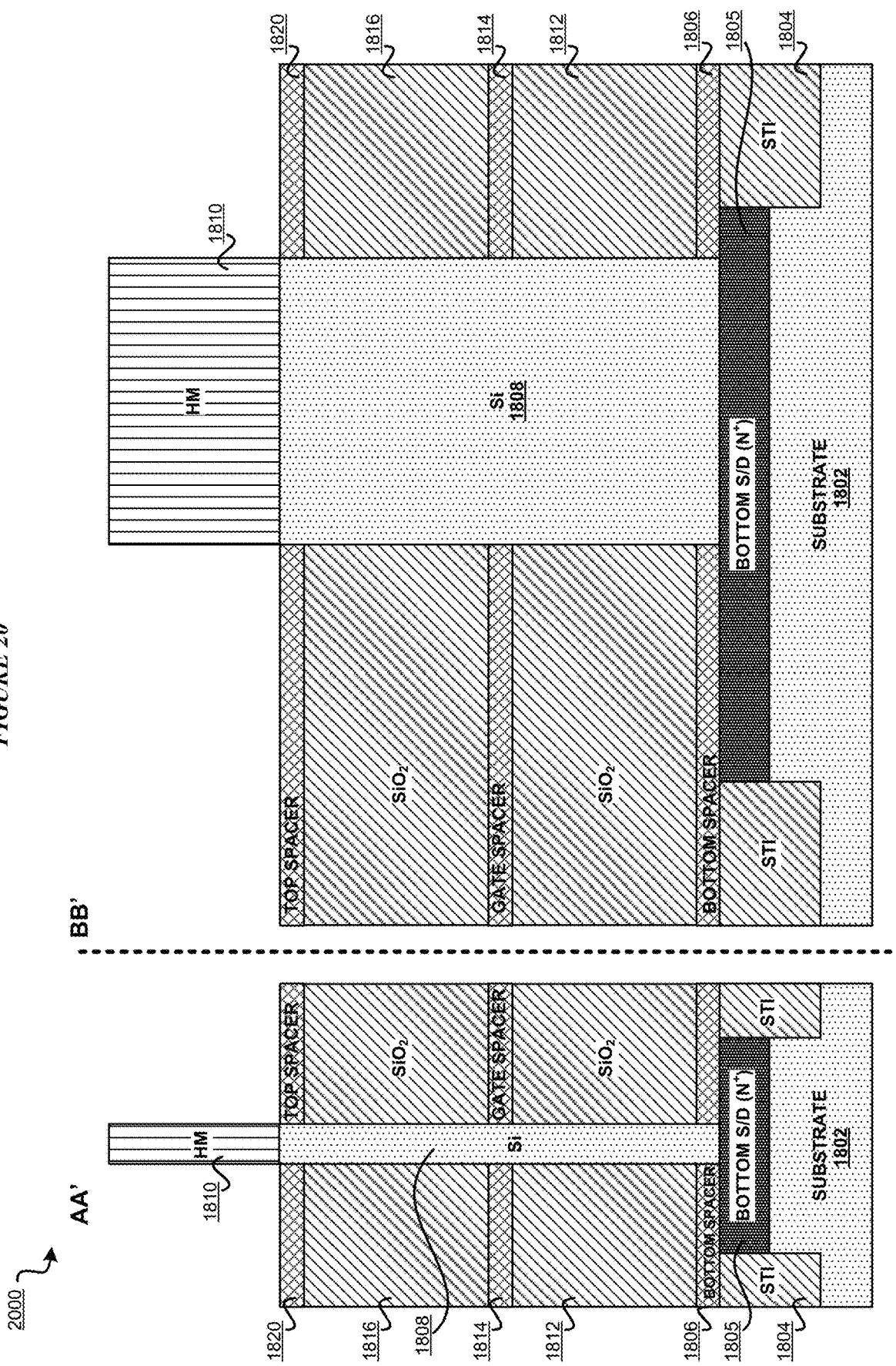
FIG. 20 depicts another portion of the process.

With reference to FIG. 20, this figure depicts a portion of the process in which a structure 2000 is formed. FIG. 20 shows a first cross section view AA' along a first cross section of structure 2000 and a second cross section view BB' along a second cross section of structure 2000. In the embodiment of FIG. 20, the fabrication system deposits a first ILD layer 1812 upon bottom spacer 1806, and a gate spacer layer 1814 upon first ILD layer 1812. The fabrication system further deposits a second ILD layer 1816 upon gate spacer layer 1814, and a top spacer layer 1820 upon second ILD layer 1816. In at least one embodiment, first ILD layer 1812 and second ILD layer 1816 is formed of silicon dioxide (SiO₂). In at least one embodiment, bottom spacer 1806, gate spacer layer 1814, and top spacer layer 1820 are formed of a low dielectric constant (low-K) material. In particular embodiments, one or more of bottom spacer 1806, first ILD layer 1812, gate spacer layer 1814, second ILD layer 1816, and top spacer 1820 are formed using an anisotropic deposition process.

Figure 21:
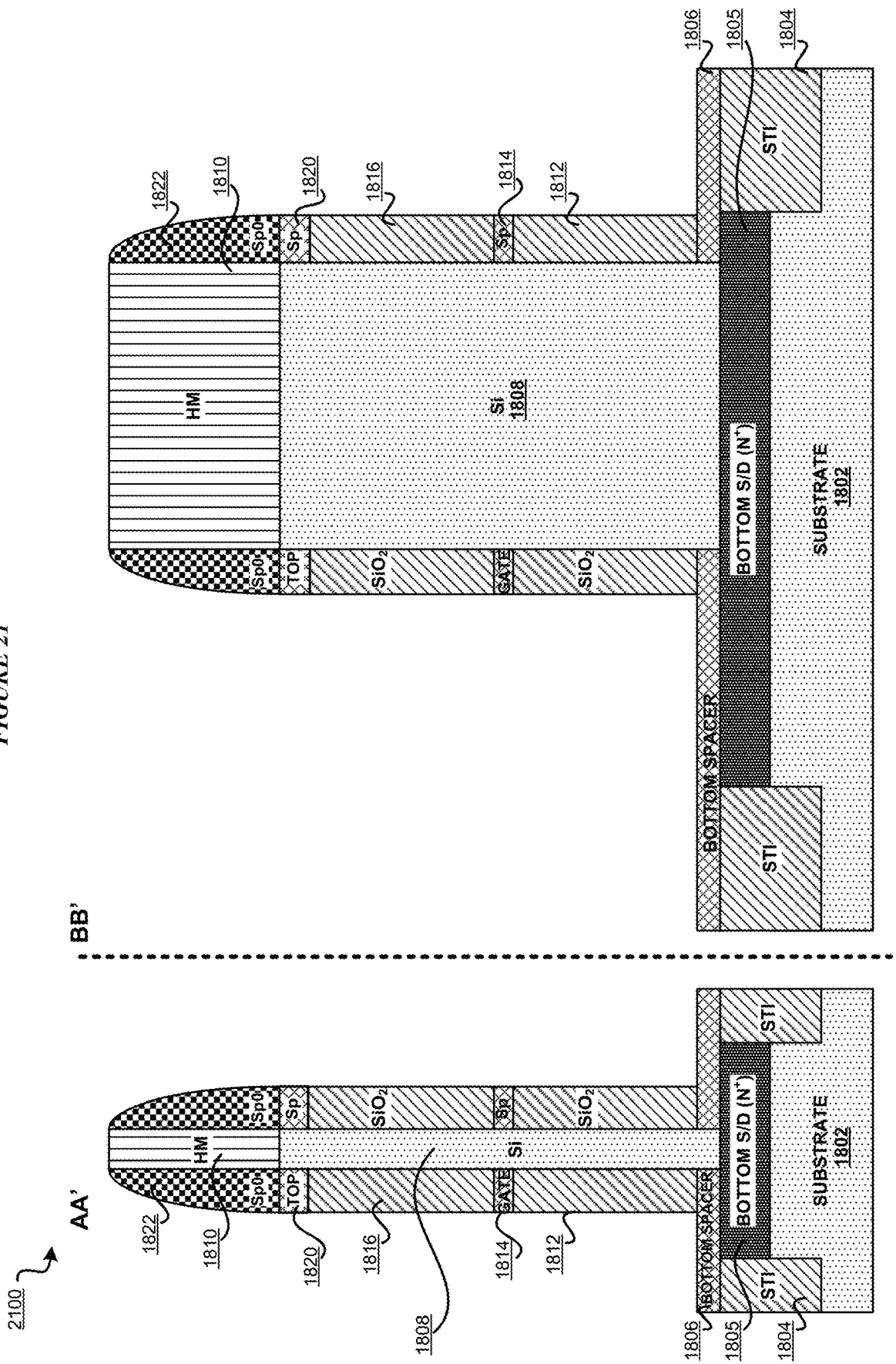
FIG. 21 depicts another portion of the process.

With reference to FIG. 21, this figure depicts a portion of the process in which a structure 2100 is formed. FIG. 21 shows a first cross section view AA' along a first cross section of structure 2100 and a second cross section view BB' along a second cross section of structure 2100. In the embodiment of FIG. 21, the fabrication system deposits a conformal low-K dielectric material and performs an etching process on the low-K dielectric material to form a sidewall spacer (main spacer) 1822 upon top spacer 1820 around an upper portion of fin 1808 and hard mask 1810. In a particular embodiment, the etching process is a reactive-ion etching (RIE) process.

Figure 22:
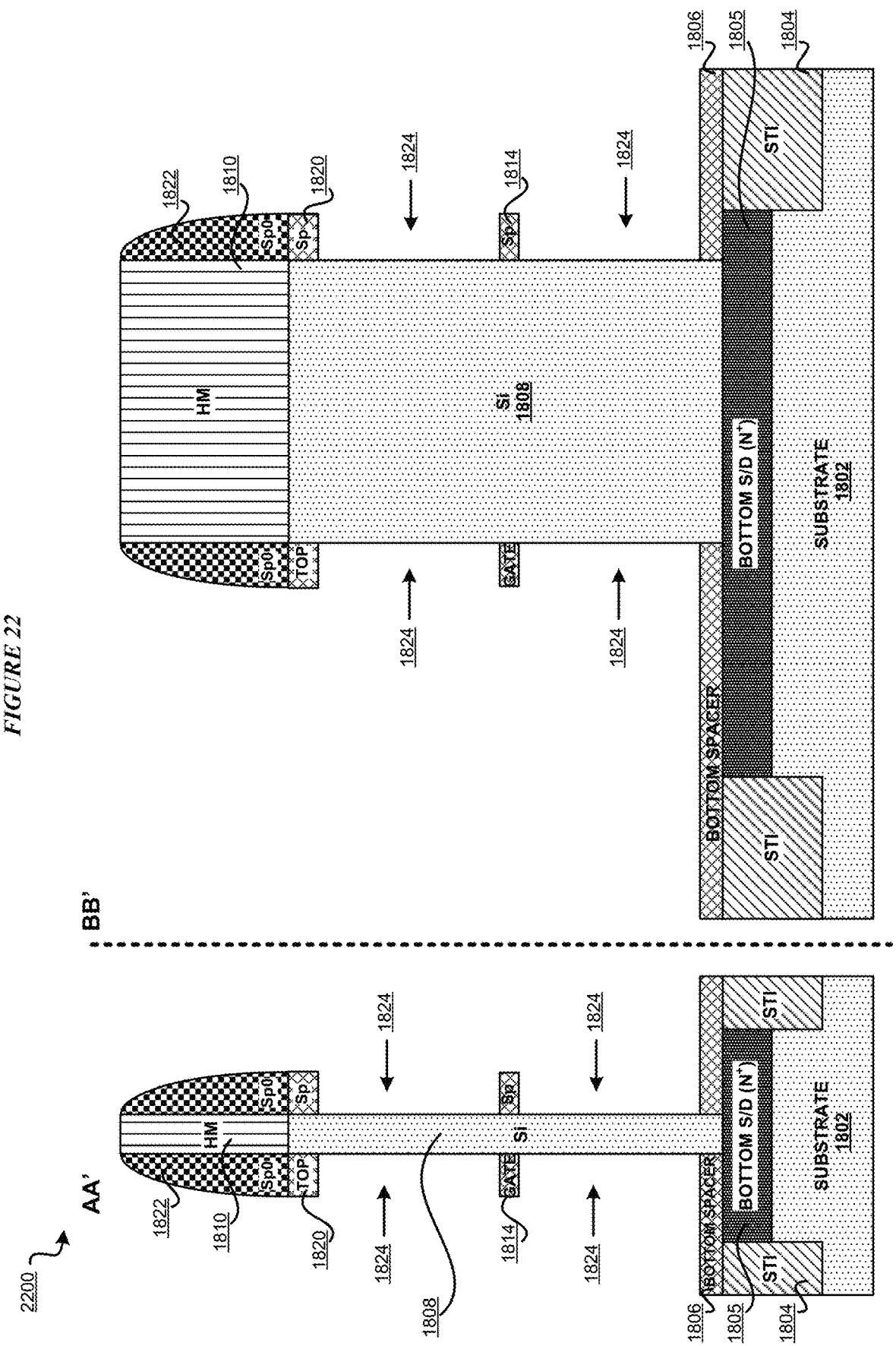
FIG. 22 depicts another portion of the process.

With reference to FIG. 22, this figure depicts a portion of the process in which a structure 2200 is formed. FIG. 22 shows a first cross section view AA' along a first cross section of structure 2200 and a second cross section view BB' along a second cross section of structure 2200. In the embodiment of FIG. 22, the fabrication system selectively removes the second ILD layer 1816 using an isotropic etch back process leaving gate spacer 1814 disposed along fin 1808.

Figure 23:
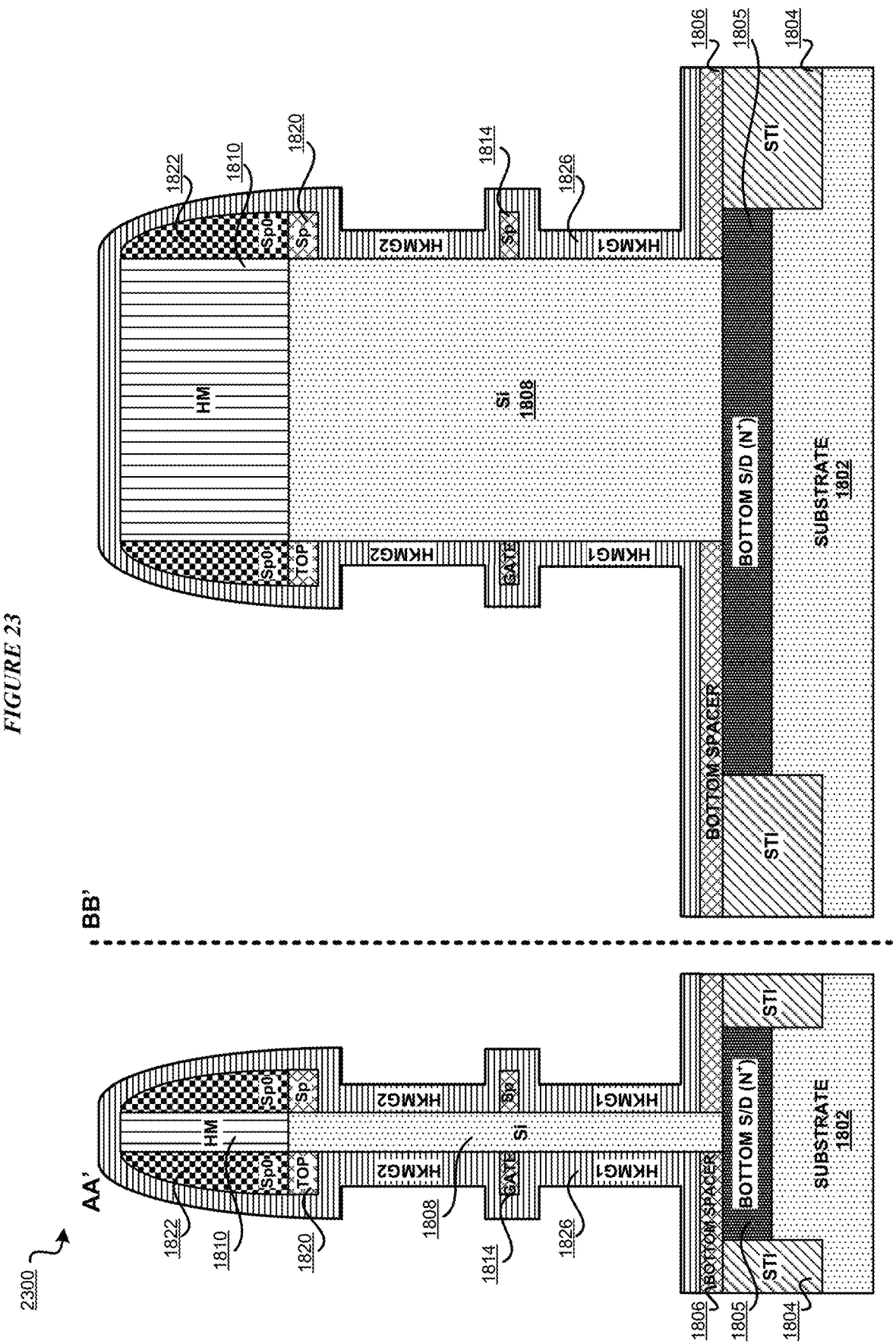
FIG. 23 depicts another portion of the process.

With reference to FIG. 23, this figure depicts a portion of the process in which a structure 2300 is formed. FIG. 23 shows a first cross section view AA' along a first cross section of structure 2300 and a second cross section view BB' along a second cross section of structure 2300. In the embodiment of FIG. 23, the fabrication system deposits a gate material 1826 upon bottom spacer 1806, fin 1808, gate spacer 1814, top spacer 1820, sidewall spacer 1822, and hard mask 1810. In particular embodiments, gate material 1826 includes an Interlayer Oxide (IL), a gate oxide with high dielectric constant (High-K material such as HfO2) and one or several layers of work function metals (such as TiN, TiC, ... ).

Figure 24:
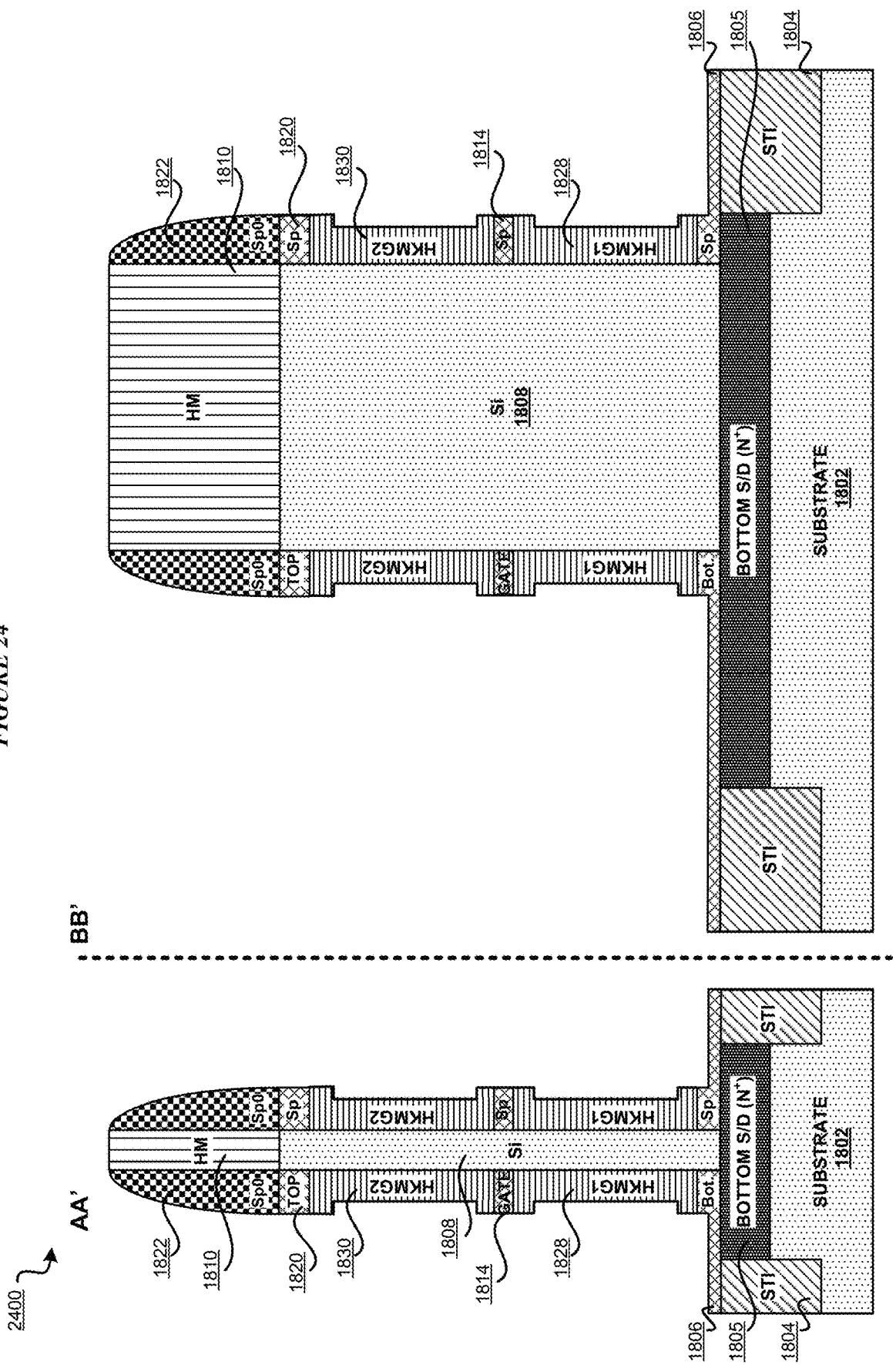
FIG. 24 depicts another portion of the process.

With reference to FIG. 24, this figure depicts a portion of the process in which a structure 2400 is formed. FIG. 24 shows a first cross section view AA' along a first cross section of structure 2400 and a second cross section view BB' along a second cross section of structure 2400. In the embodiment of FIG. 24, the fabrication system forms a first gate 1828 between bottom spacer 1806 and gate spacer 1814, and a second gate 1830 between gate spacer 1814 and top spacer 1820 by removing portions of gate material 1826. In a particular embodiment, the fabrication system removes portions of gate material 1826 using an anisotropic RIE process.

Figure 25:
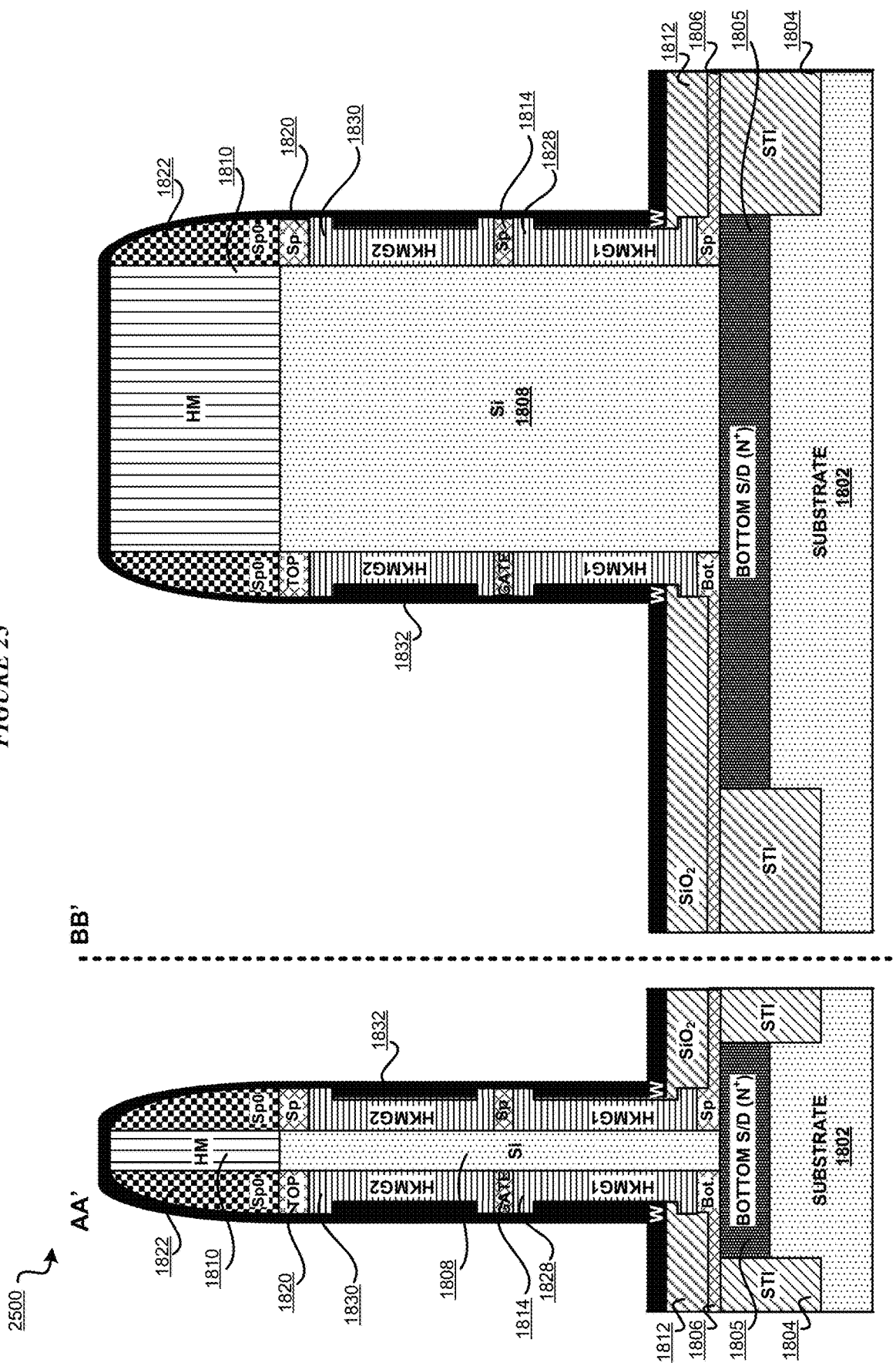
FIG. 25 depicts another portion of the process.

With reference to FIG. 25, this figure depicts a portion of the process in which a structure 2500 is formed. FIG. 25 shows a first cross section view AA' along a first cross section of structure 2500 and a second cross section view BB' along a second cross section of structure 2500. In the embodiment of FIG. 25, the fabrication system deposits first ILD layer 1812 upon bottom spacer 1814 and a portion of first gate 1828. In the embodiment, the fabrication system further conformally deposits a first tungsten (W) contact material 1832 on first ILD layer 1812, a portion of first gate 1828, gate spacer 1814, second gate 1830, top spacer 1820, and sidewall spacer 1822.

Figure 26:
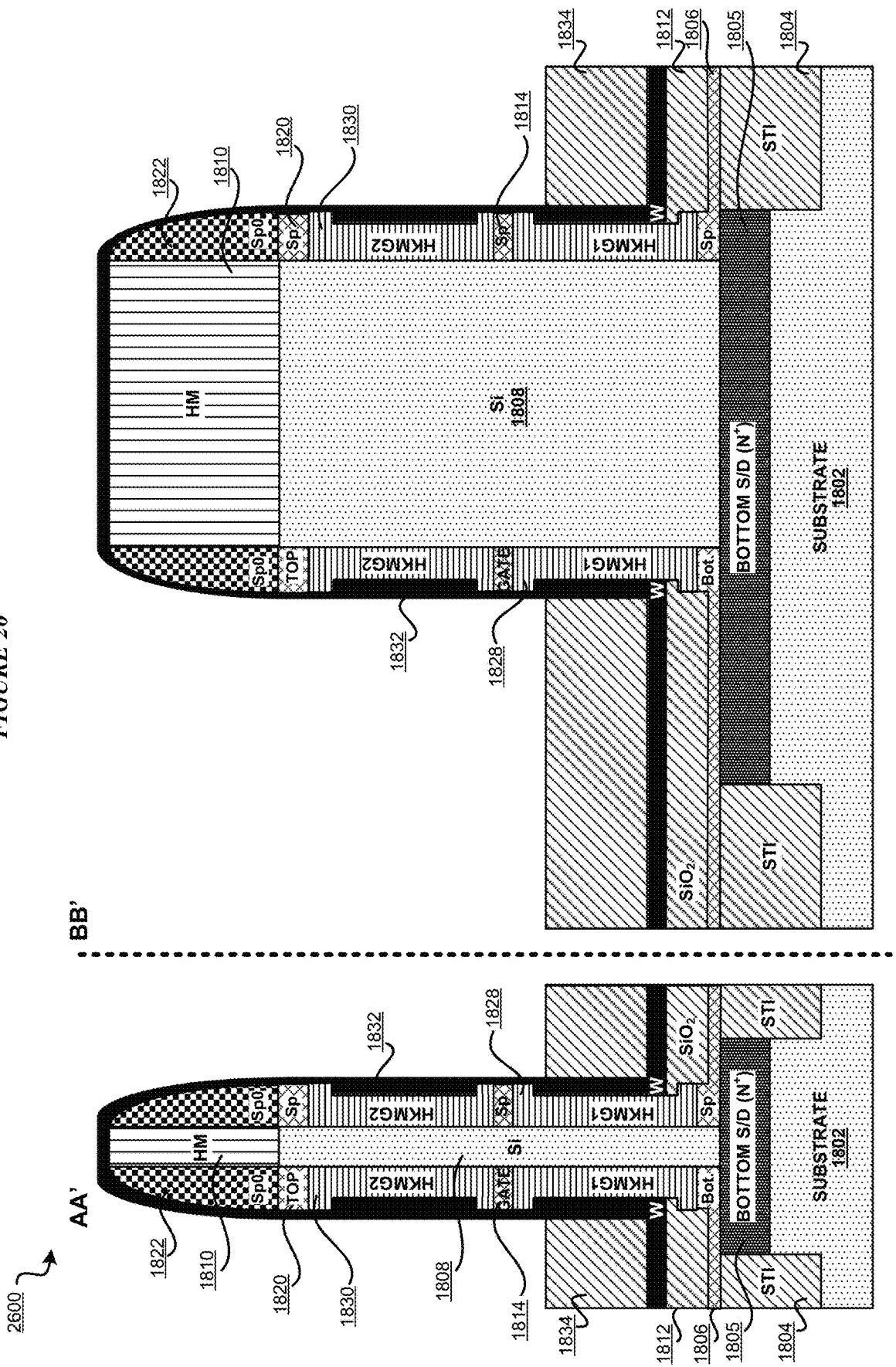
FIG. 26 depicts another portion of the process.

With reference to FIG. 26, this figure depicts a portion of the process in which a structure 2600 is formed. FIG. 26 shows a first cross section view AA' along a first cross section of structure 2600 and a second cross section view BB' along a second cross section of structure 2600. In the embodiment of FIG. 26, the fabrication system deposits second ILD material 1834 upon a lower portion of first tungsten (W) contact material 1832. In a particular embodiment, ILD material 1834 is formed of $SiO_2$.

Figure 26A:
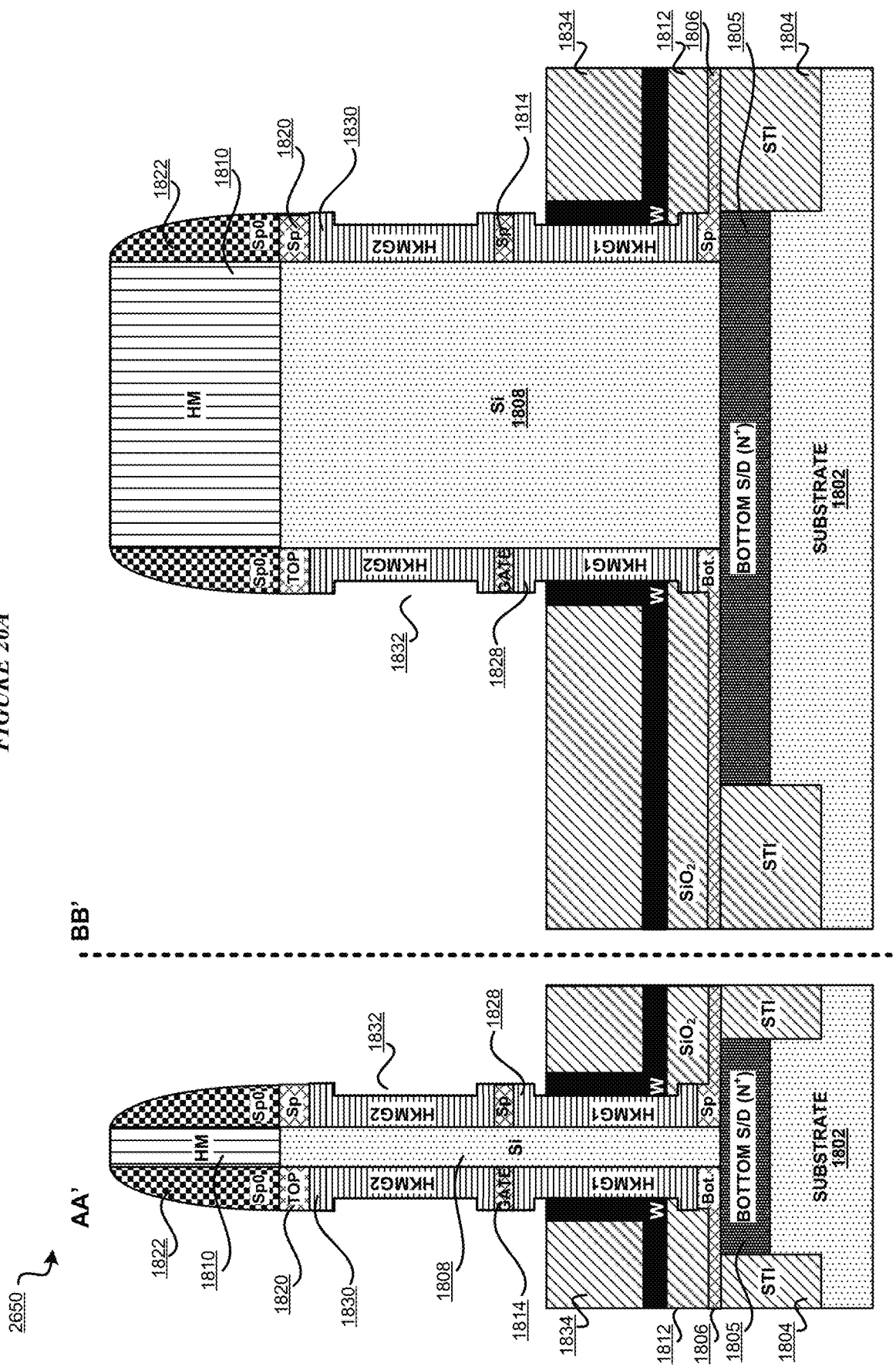
FIG. 26A depicts another portion of the process.

With reference to FIG. 26A, this figure depicts a portion of the process in which a structure 2650 is formed. FIG. 26A shows a first cross section view AA' along a first cross section of structure 2650 and a second cross section view BB' along a second cross section of structure 2650. In the embodiment of FIG. 26A, the fabrication system etches first tungsten (W) contact material 1832 to substantially remove first tungsten (W) contact material 1832 from gate spacer 1814, second gate 1830, top spacer 1820, and sidewall spacer 1822.

Figure 27:
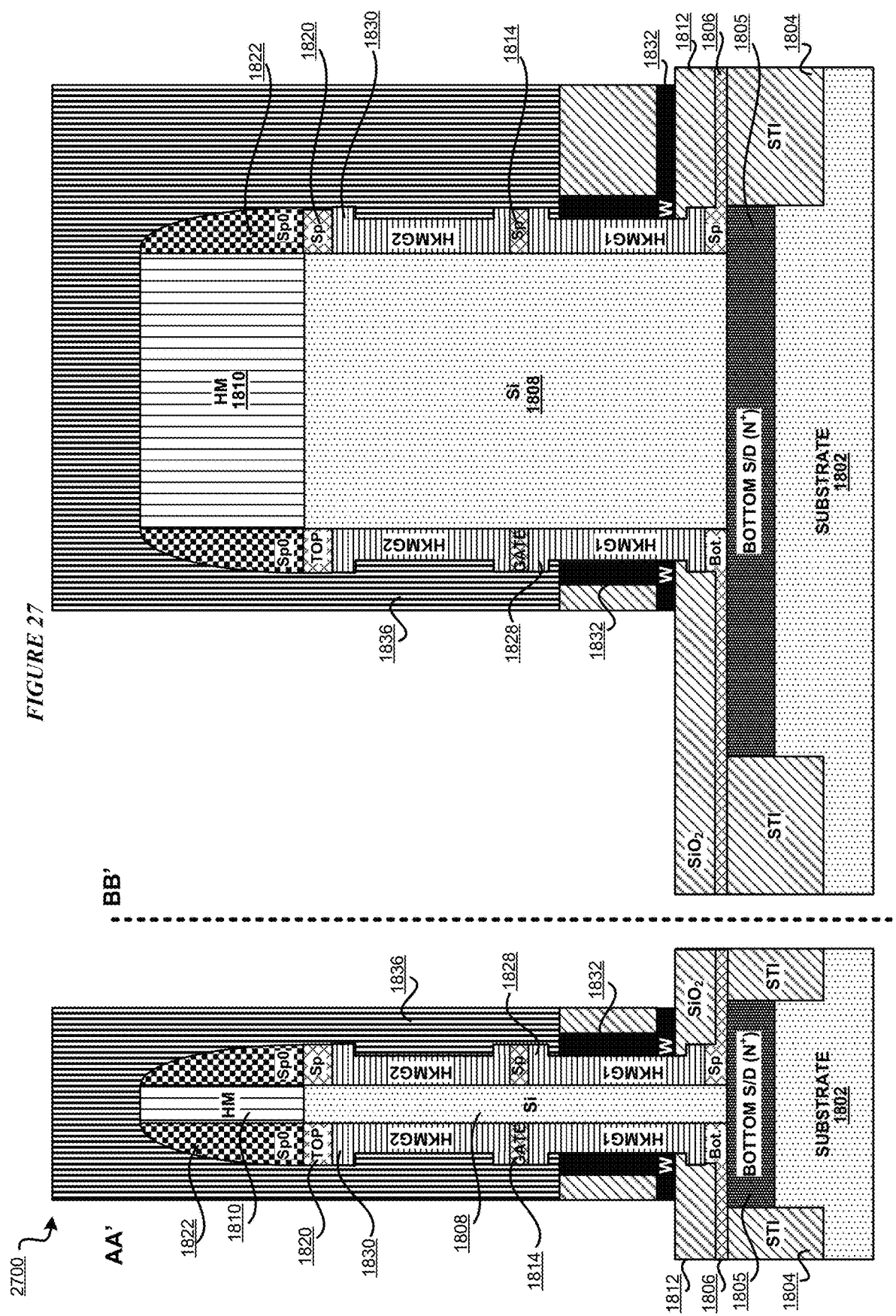
FIG. 27 depicts another portion of the process.

With reference to FIG. 27, this figure depicts a portion of the process in which a structure 2700 is formed. FIG. 27 shows a first cross section view AA' along a first cross section of structure 2700 and a second cross section view BB' along a second cross section of structure 2700. In the embodiment of FIG. 27, the fabrication system deposits a photoresist 1836 on top surface of tungsten (W) contact material 1832, a portion of first gate 1828, gate spacer 1814, second gate 1830, top spacer 1820, and sidewall spacer 1822 and performs lithographic patterning on first tungsten contact material 1832.

Figure 27A:
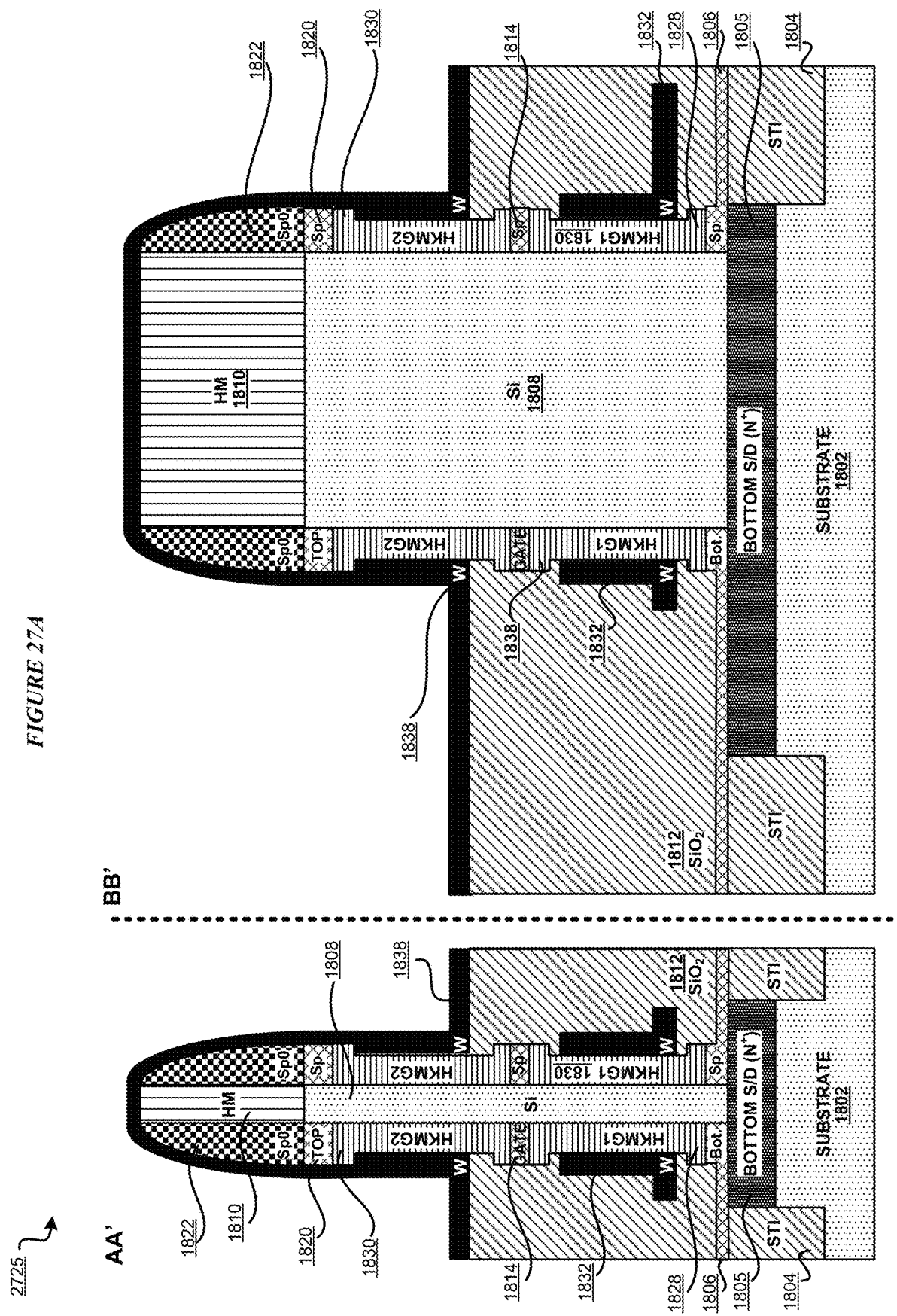
FIG. 27A depicts another portion of the process.

With reference to FIG. 27A, this figure depicts a portion of the process in which a structure 2725 is formed. FIG. 27A shows a first cross section view AA' along a first cross section of structure 2725 and a second cross section view BB' along a second cross section of structure 2725. In the embodiment of FIG. 27A, the fabrication system deposits a second tungsten contact material 1838 in contact with second gate 1830.

Figure 27B:
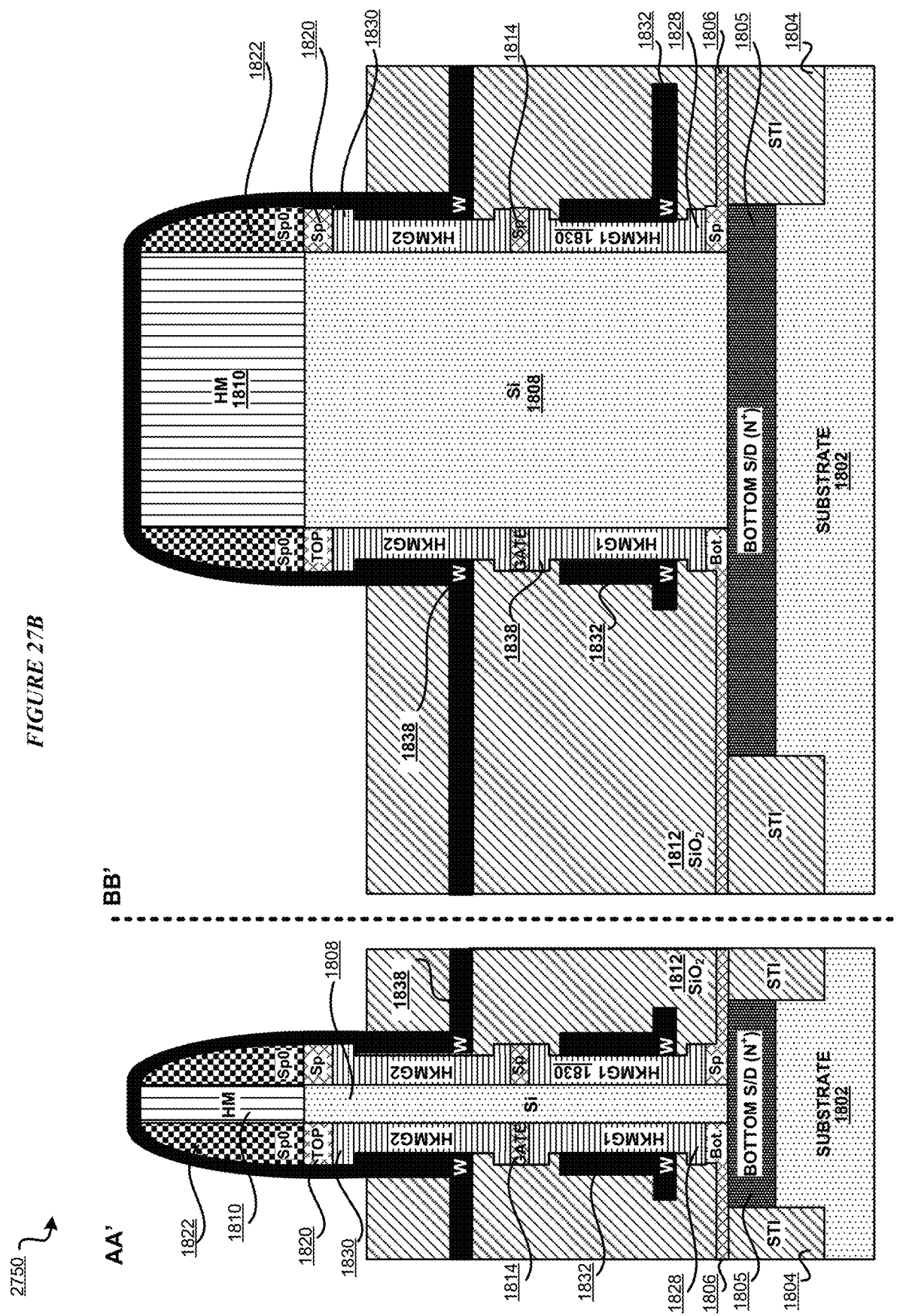
FIG. 27B depicts another portion of the process.

With reference to FIG. 27B, this figure depicts a portion of the process in which a structure 2750 is formed. FIG. 27B shows a first cross section view AA' along a first cross section of structure 2750 and a second cross section view BB' along a second cross section of structure 2750. In the embodiment of FIG. 27B, the fabrication system deposits additional first ILD 1812 upon a portion of second tungsten contact material 1838.

Figure 27C:
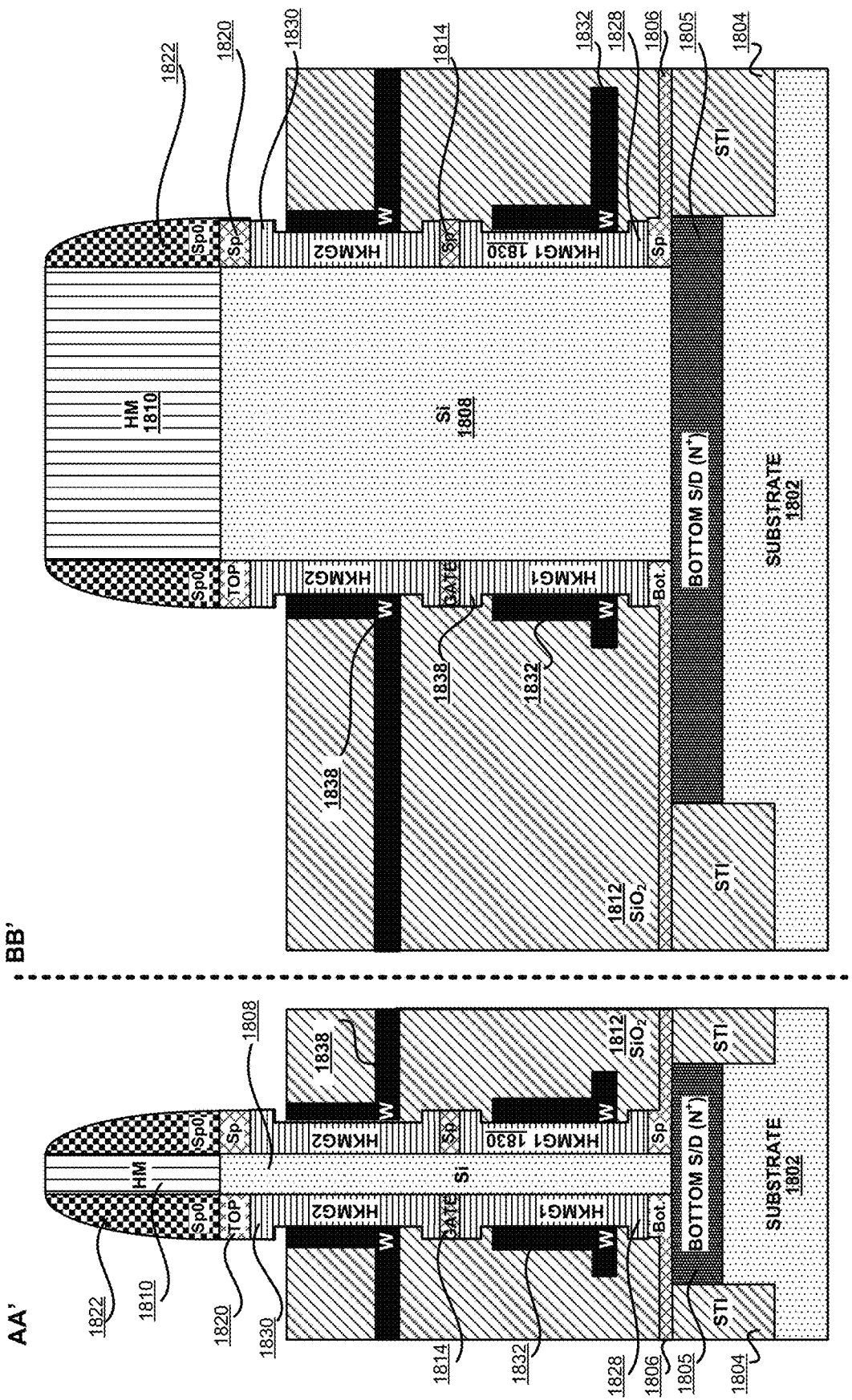
FIG. 27C depicts another portion of the process.

With reference to FIG. 27C, this figure depicts a portion of the process in which a structure 2775 is formed. FIG. 27C shows a first cross section view AA' along a first cross section of structure 2775 and a second cross section view BB' along a second cross section of structure 2775. In the embodiment of FIG. 27C, the fabrication system etches second tungsten contact material 1838 to remove a portion of second tungsten contact material 1838 from second gate 1830, top spacer 1820, and sidewall spacer 1822.

Figure 28:
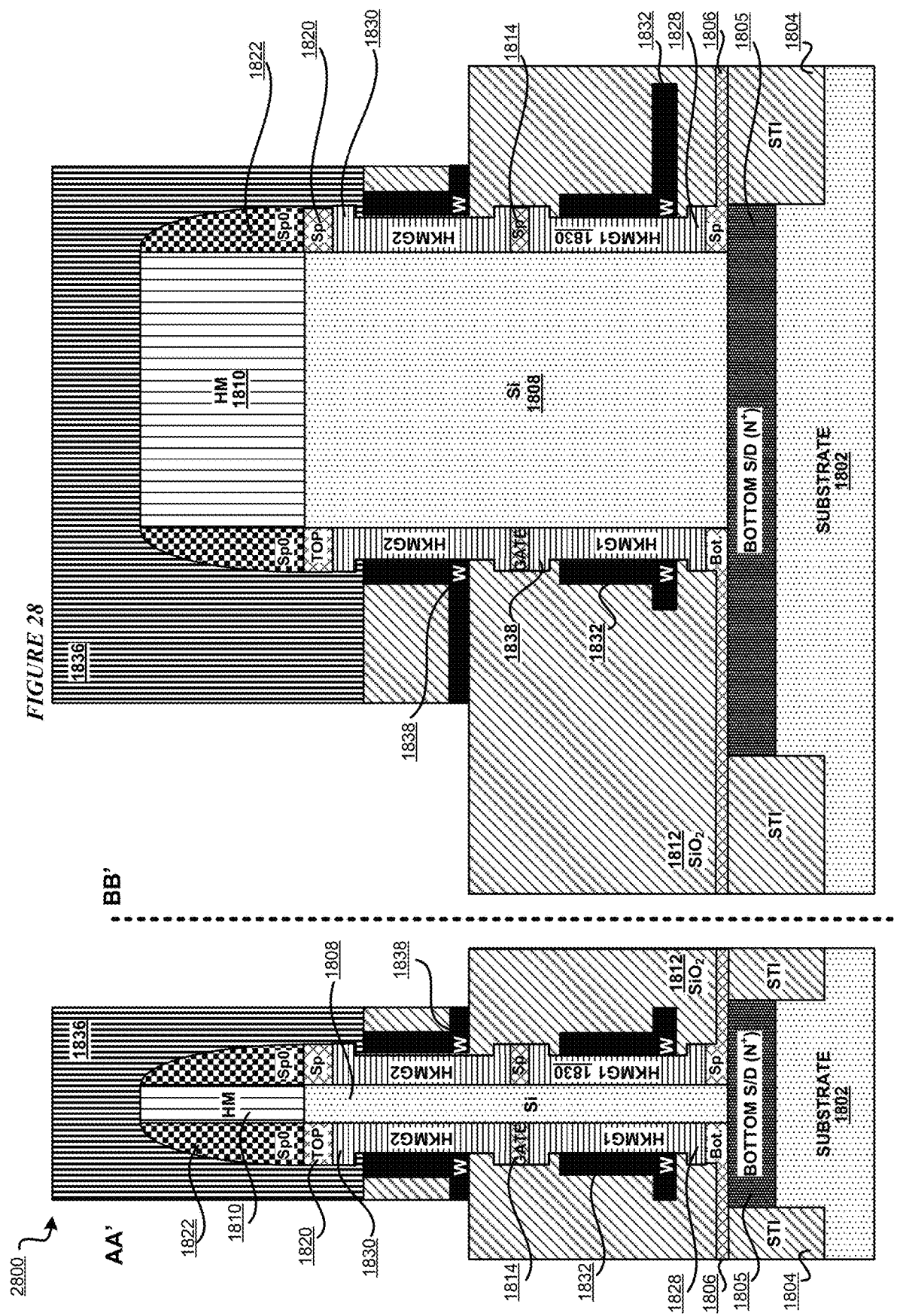
FIG. 28 depicts another portion of the process.

With reference to FIG. 28, this figure depicts a portion of the process in which a structure 2800 is formed. FIG. 28 shows a first cross section view AA' along a first cross section of structure 2800 and a second cross section view BB' along a second cross section of structure 2800. In the embodiment of FIG. 28, the fabrication system further performs lithographic patterning on second tungsten contact material 1838.

Figure 29:
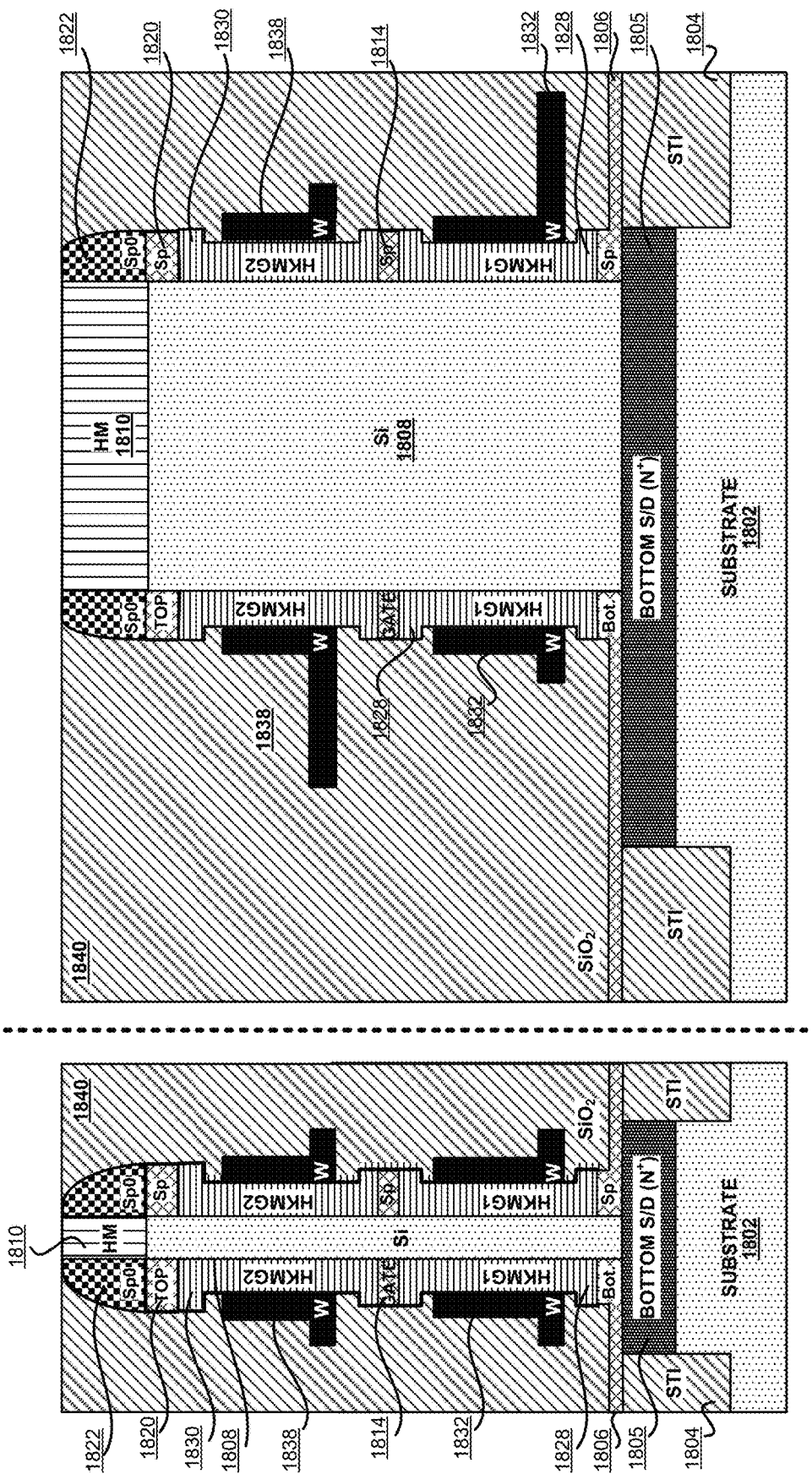
FIG. 29 depicts another portion of the process.

With reference to FIG. 29, this figure depicts a portion of the process in which a structure 2900 is formed. FIG. 29 shows a first cross section view AA' along a first cross section of structure 2900 and a second cross section view BB' along a second cross section of structure 2900. In the embodiment of FIG. 29, the fabrication system deposits a third inter-layer dielectric (ILD) 1840 to fill recesses of structure 2900 with third ILD 1840 to a top surface of hard mask 1810. In at least one embodiment, third ILD layer 1840 is formed of silicon dioxide ($SiO_2$). In the particular embodiment, the fabrication system further performs a chemical mechanical planarization (CMP) process to planarize the surface of structure 2900.

Figure 30:
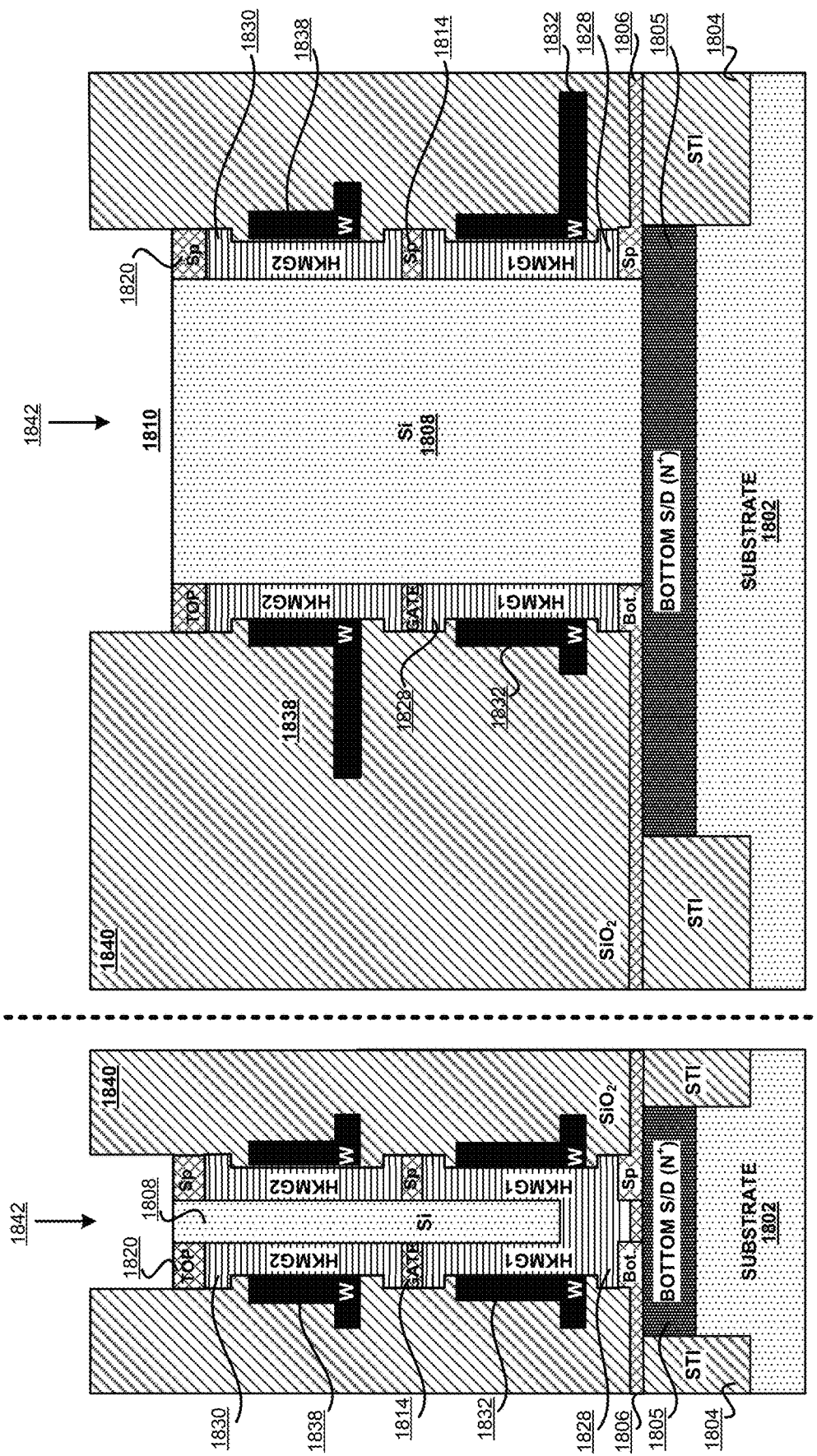
FIG. 30 depicts another portion of the process.

With reference to FIG. 30, this figure depicts a portion of the process in which a structure 3000 is formed. FIG. 30 shows a first cross section view AA' along a first cross section of structure 3000 and a second cross section view BB' along a second cross section of structure 3000. In the embodiment of FIG. 30, the fabrication system etches back hard mask 1810 and recesses sidewall spacer 1822 selectively to the top spacer 1820 to form a top S/D recess 1842.

Figure 31:
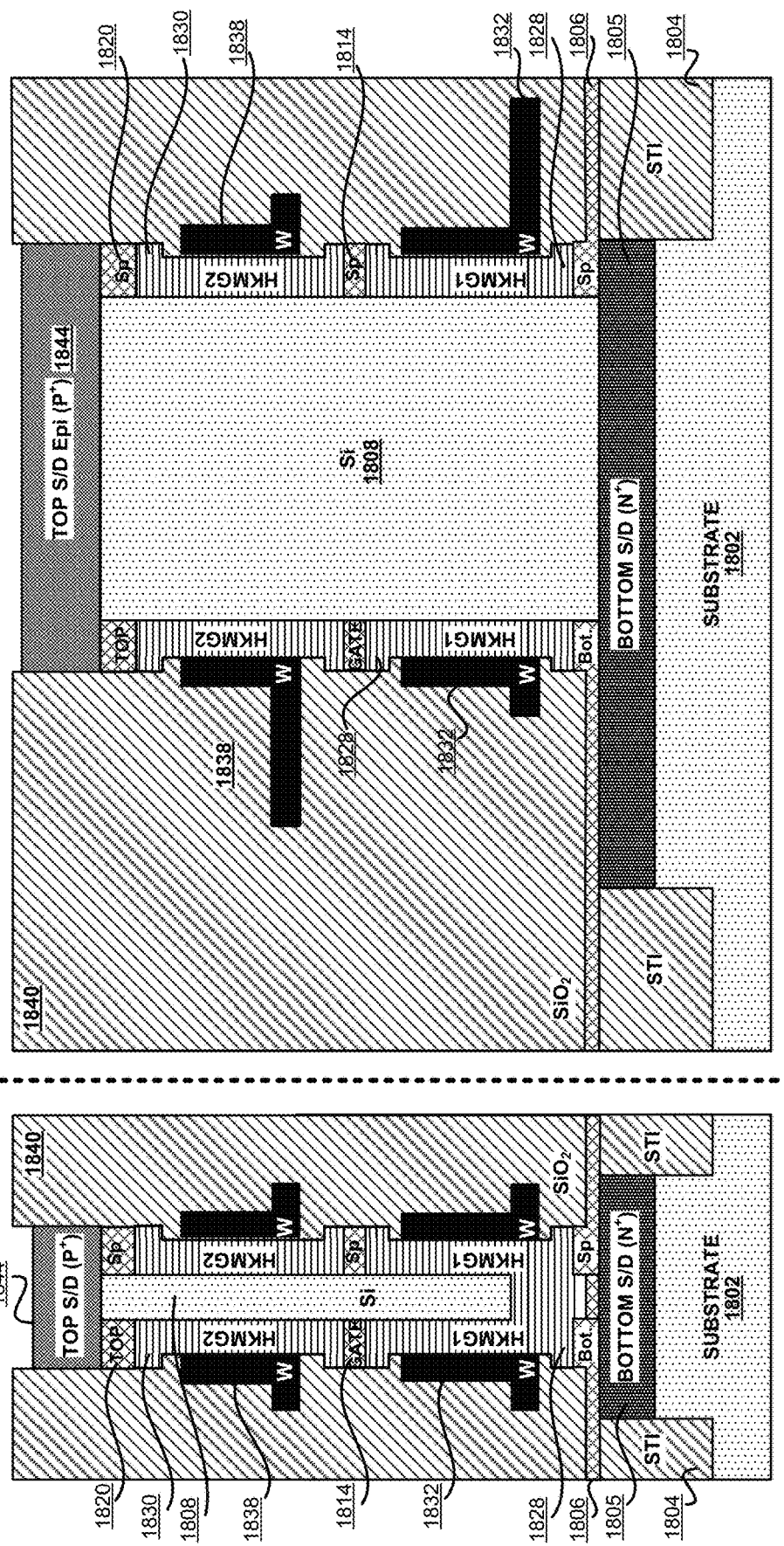
FIG. 31 depicts another portion of the process.

With reference to FIG. 31, this figure depicts a portion of the process in which a structure 3100 is formed. FIG. 31 shows a first cross section view AA' along a first cross section of structure 3100 and a second cross section view BB' along a second cross section of structure 3100. In the embodiment of FIG. 31, the fabrication system forms a top source/drain (S/D) 1844 within top spacer recess 1842. In one or more embodiments, top S/D 1844 is formed using a epitaxy process. In one or more embodiments, top S/D 1844 is formed of a p-type (p+) material.

Figure 32:
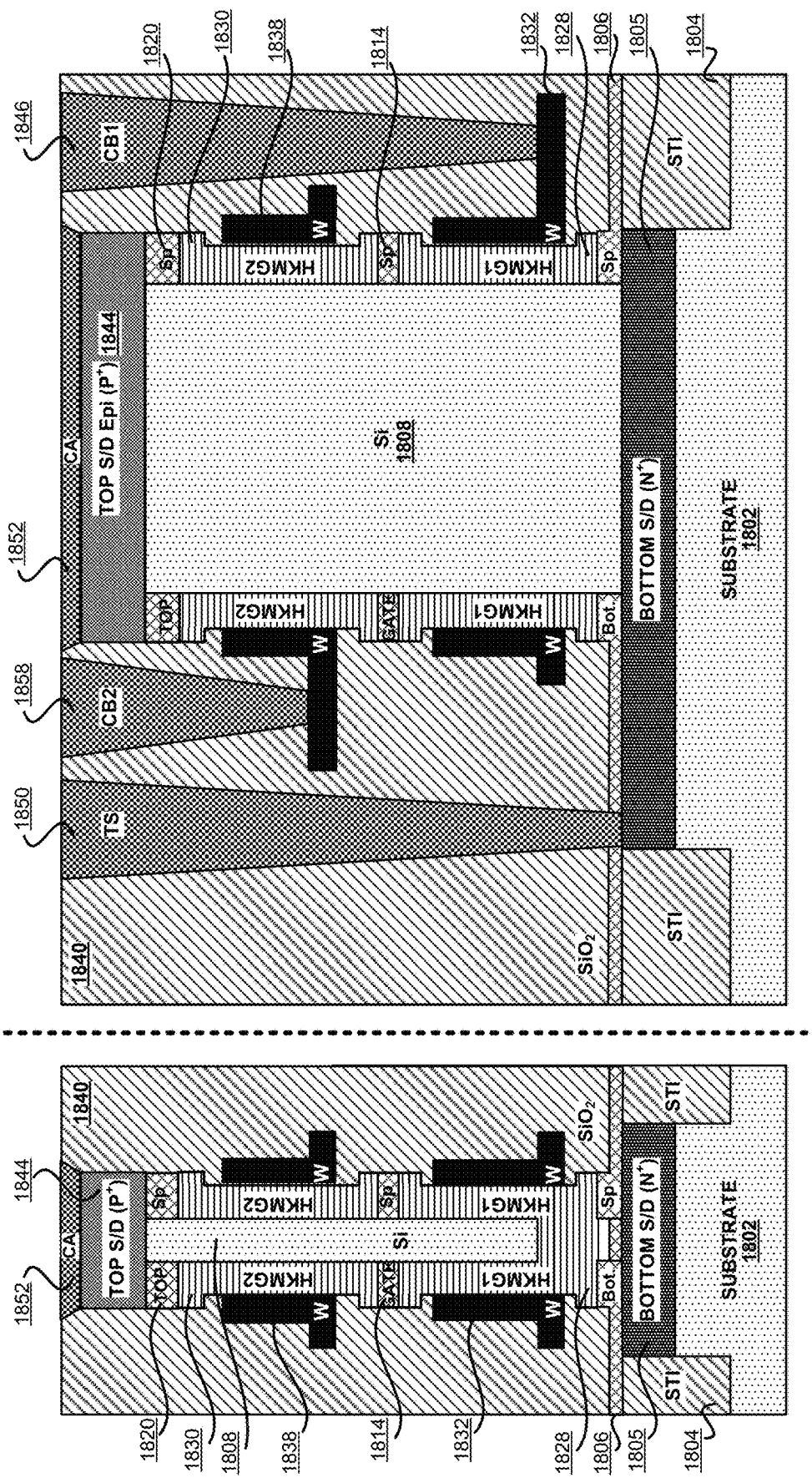
FIG. 32 depicts another portion of the process.

With reference to FIG. 32, this figure depicts a portion of the process in which a structure 3200 is formed. FIG. 32 shows a first cross section view AA' along a first cross section of structure 3200 and a second cross section view BB' along a second cross section of structure 3200. In the embodiment of FIG. 32, the fabrication system forms a first gate contact 1846, a second gate contact 1848, a bottom S/D contact 1850, and a top S/D contact 1852 within ILD 1840. First gate contact 1846 is formed in contact with first tungsten contact material 1832 and extends to a top surface of ILD 1840. Second gate contact 1858 is formed in contact with second tungsten contact material 1838 and extends to the top surface of ILD 1840. Bottom S/D contact 1850 is formed in contact with bottom S/D 1805 and extends to the top surface of ILD 1840, and top S/D contact 1852 is formed in contact with top S/D 1844 and extends to the top surface of ILD 1840. Accordingly, a VFET with dual-gate feedback loop is fabricated in accordance with an embodiment.

Figure 33:
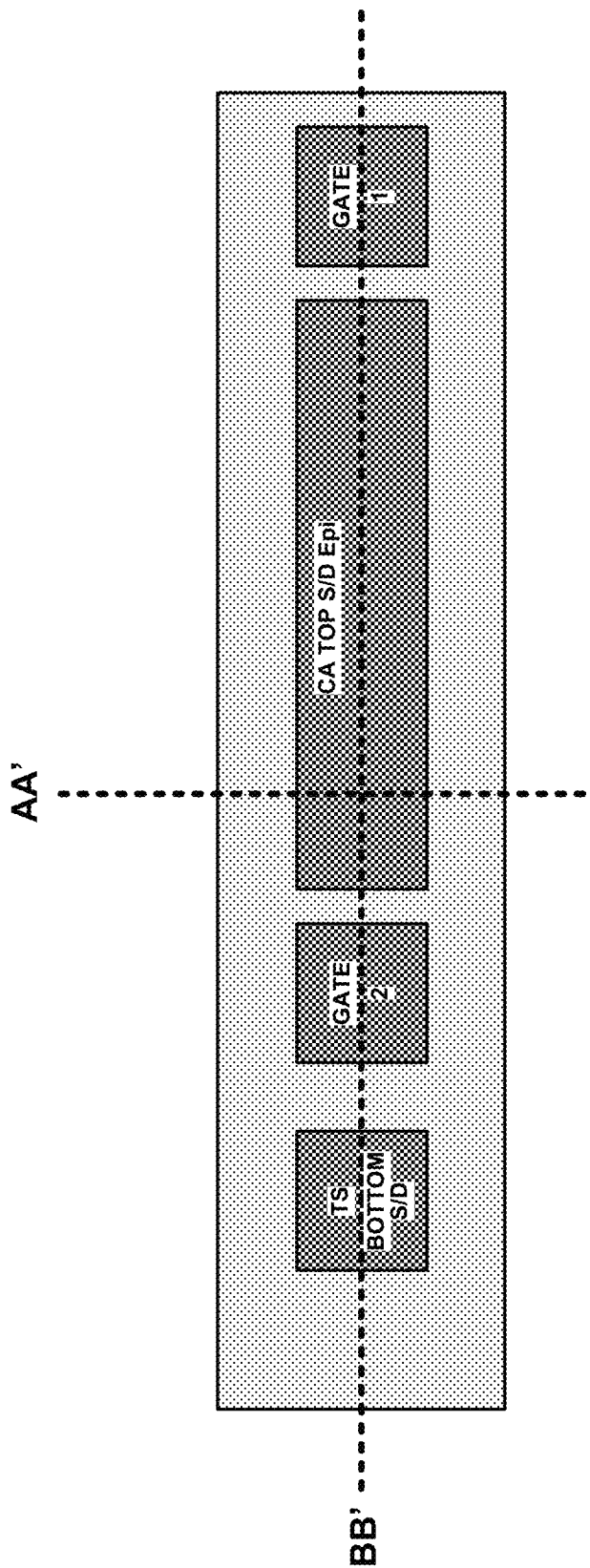
FIG. 33 depicts a top view of the VFET with dual-gate feedback loop of FIG. 32.

With reference to FIG. 33, this figure depicts a top view 3300 of the VFET with dual-gate feedback loop of FIG. 32. FIG. 33 further illustrates in a top view the first cross-section AA' line and second cross-section BB' line of FIG. 32.

Figure 34:
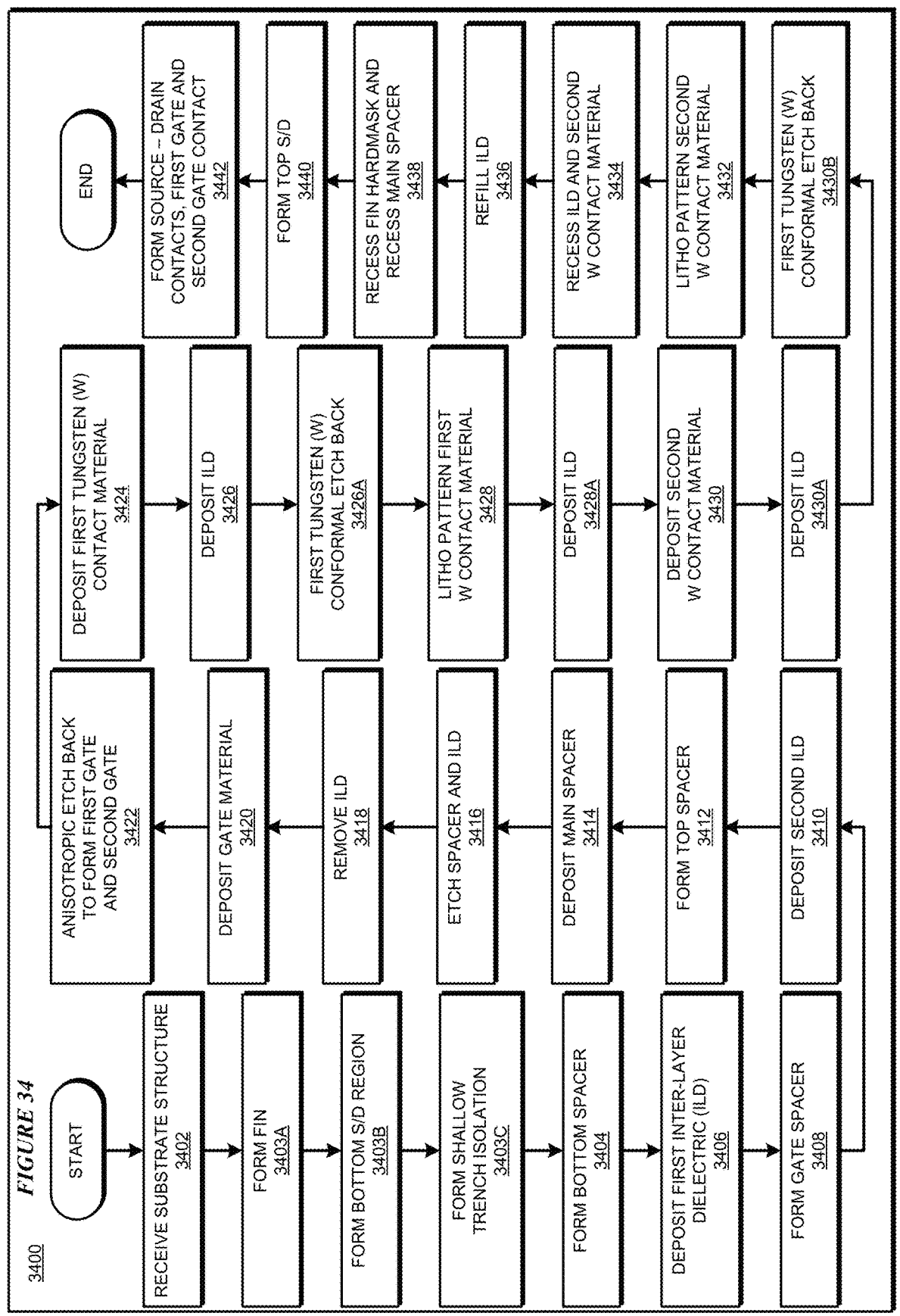
FIG. 34 depicts a flowchart of another example process for fabricating a VFET with dual-gate feedback loop in accordance with another illustrative embodiment.

With reference to FIG. 34, this figure depicts a flowchart of another example process 3400 for fabricating a VFET with dual-gate feedback loop in accordance with another illustrative embodiment. In block 3402, the fabrication system receives a semiconductor structure including a substrate 1802. In block 3403A, the fabrication system forms fin 1808 disposed vertically upon a portion of substrate 1802 and hard mask 1810 disposed upon a top of fin 1808. In block 3403B, the fabrication system forms bottom source/drain (S/D) 1805 upon substrate 1802. In one or more embodiments, bottom S/D 1805 is formed of a n-type (n+) material. In block 3403C, the fabrication system forms shallow trench isolation (STI) layer 1804 upon substrate 1802. In particular embodiments, STI layer 1804, bottom S/D 1805, fin 1808, and hard mask 1810 are formed using conventional processes that are well-known in the art. In block 3404, the fabrication system forms bottom spacer 1806 disposed upon a portion of STI 1804 and bottom S/D 1805.

In block 3406, the fabrication system deposits first ILD layer 1812 upon bottom spacer 1806. In block 3408, the fabrication system forms gate spacer layer 1814 upon first ILD layer 1812. In block 3410, the fabrication system deposits second ILD layer 1816 upon gate spacer layer 1814. In block 3412, the fabrication system forms top spacer layer 1820 upon second ILD layer 1816. In at least one embodiment, first ILD layer 1812 and second ILD layer 1816 is formed of silicon dioxide ($SiO_2$). In at least one embodiment, bottom spacer 1806, gate spacer layer 1814, and top spacer layer 1820 are formed of a low dielectric constant (low-K) material. In particular embodiments, one or more of bottom spacer 1806, first ILD layer 1812, gate spacer layer 1814, second ILD layer 1816, and top spacer 1820 are formed using an anisotropic deposition process.

In block 3414, the fabrication system forms sidewall spacer 1822 upon top spacer 1820 around an upper portion of fin 1808 and hard mask 1810 by depositing a conformal low-K dielectric material and performing an etching process on the low-K dielectric material. In a particular embodiment, the etching process is a reactive-ion etching (RIE) process. In block 3416, the fabrication system etches gate spacer 1814 and second ILD layer 1816. In block 3416, the fabrication system selectively removes the second ILD layer 1816 using an isotropic etch back process leaving gate spacer 1814 disposed along fin 1808.

In block 3420, the fabrication system deposits gate material 1826 upon bottom spacer 1806, fin 1808, gate spacer 1814, top spacer 1820, sidewall spacer 1822, and hard mask 1810. In particular embodiments, gate material 1826 includes an Interlayer Oxide (IL), a gate oxide with high dielectric constant (High-K material such as HfO2) and one or several layers of work function metals (such as TiN, TiC, . . . ). In block 3422, the fabrication system performs anistropic etch back to form first gate 1828 between bottom spacer 1806 and gate spacer 1814, and second gate 1830 between gate spacer 1814 and top spacer 1820 by removing portions of gate material 1826. In a particular embodiment, the fabrication system removes portions of gate material 1826 using an anisotropic RIE process.

In block 3424, the fabrication system further conformally deposits first tungsten (W) contact material 1832 on first ILD layer 1812, a portion of first gate 1828, gate spacer 1814, second gate 1830, top spacer 1820, and sidewall spacer 1822. In block 3426, the fabrication system deposits second ILD material 1834 upon a lower portion of first tungsten (W) contact material 1832. In a particular embodiment, ILD material 1834 is formed of $SiO_2$. In block 3426A, the fabrication system performs conformal etch back of first tungsten (W) contact material 1832.

In block 3428, the fabrication system deposits a photoresist 1836 on a top surface of tungsten (W) contact material 1832, a portion of first gate 1828, gate spacer 1814, second gate 1830, top spacer 1820, and sidewall spacer 1822. The fabrication system performs lithographic patterning on first tungsten contact material 1832. In block 3430, the fabrication system deposits second tungsten contact material 1838 in contact with second gate 1830 upon first ILD 1812. In block 3430A, the fabrication system deposits additional ILD 1812. In block 3430B, the fabrication system performs conformal etch back of first tungsten (W) contact material 1832. In block 3432, the fabrication system further performs lithographic patterning on second tungsten contact material 1838. In block 3434, the fabrication system recesses ILD 1812 and second tungsten contact material 1838 to remove a portion of second tungsten contact material 1838 from ILD 1812.

In block 3436, the fabrication system deposits third interlayer dielectric (ILD) 1840 to fill recesses of structure 2900 with third ILD 1840 to a top surface of hard mask 1810. In at least one embodiment, third ILD layer 1840 is formed of silicon dioxide ($SiO_2$). In the particular embodiment, the fabrication system further performs a chemical mechanical planarization (CMP) process to planarize the surface of the structure.

In block 3438, the fabrication system recesses hard mask 1810 and sidewall spacer (main spacer) 1822 to form a top spacer recess 1842. In block 3440, the fabrication system forms a top source/drain (S/D) 1844 within top spacer recess 1842. In one or more embodiments, top S/D 1844 is formed using a epitaxy process. In one or more embodiments, top S/D 1844 is formed of a p-type (p+) material. In block 3442, the fabrication system forms first gate contact 1846, second gate contact 1848, bottom S/D contact 1850, and top S/D contact 1852 within ILD 1840. First gate contact 1846 is formed in contact with first tungsten contact material 1832 and extends to a top surface of ILD 1840. Second gate contact 336 is formed in contact with second tungsten contact material 1838 and extends to the top surface of ILD 1840. Bottom S/D contact 1850 is formed in contact with bottom S/D 1805 and extends to the top surface of ILD 1840, and top S/D contact 1852 is formed in contact with top S/D 1844 and extends to the top surface of ILD 1840. The process then ends. Accordingly, a VFET with dual-gate feedback loop is fabricated by the process in accordance with another embodiment.

With reference to FIGS. 35-48, these figure depict another example process for fabricating a vertical field effect transistor (VFET) with dual-gate feedback loop mechanism in accordance with an embodiment. In the embodiment illustrated in FIGS. 35-48, a fabrication system (not shown) fabricates a VFET with dual-gate feedback loop using a replacement fin and gate last integration process.

Figure 35:
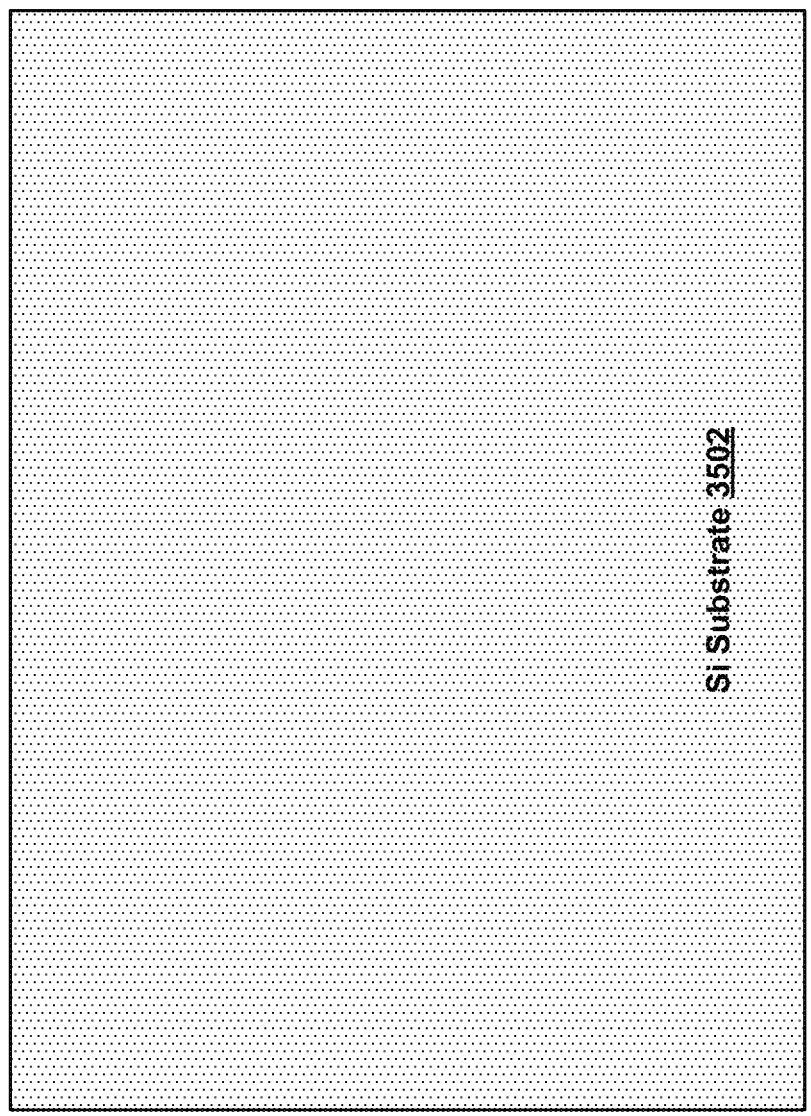
FIG. 35 depicts another example process for fabricating a vertical field effect transistor (VFET) with dual-gate feedback loop mechanism in accordance with an embodiment.

With reference to FIG. 35, this figure depicts a portion of the process in which a semiconductor structure 3500 is received. The semiconductor structure includes a silicon (Si) substrate 3502.

Figure 36:
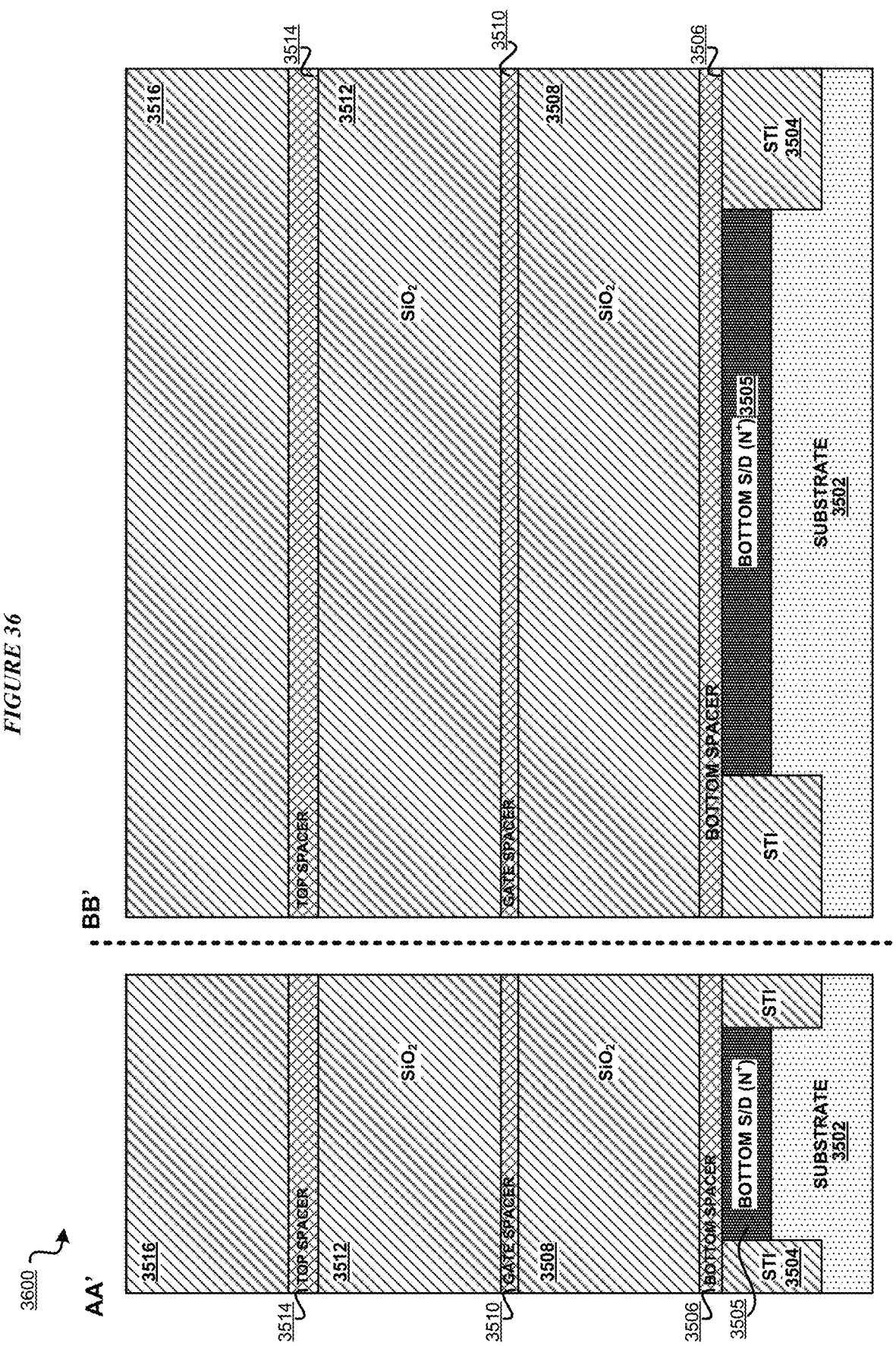
FIG. 36 depicts another portion of the process.

With reference to FIG. 36, this figure depicts a portion of the process in which a structure 3600 is formed. FIG. 36 shows a first cross section view AA' along a first cross section of structure 3600 and a second cross section view BB' along a second cross section of structure 3600. Structure 3600 includes substrate 3502 having a shallow trench isolation (STI) layer 3504 disposed upon substrate 3502. Structure 3600 further includes a bottom source/drain (S/D) 3505 disposed upon substrate 3502. In one or more embodiments, bottom S/D 3505 is formed of a n-type (n+) material. Structure 3600 further includes a bottom spacer 3506 disposed upon a portion of STI 1804 and bottom S/D 1805. In particular embodiments, STI layer 1804, bottom S/D 1805, and bottom spacer 1806 are formed using conventional processes that are well-known in the art. In the embodiment of FIG. 36, the fabrication system deposits a first ILD layer 3508 upon bottom spacer 3506, and a gate spacer layer 3510 upon first ILD layer 3508. The fabrication system further deposits a second ILD layer 3512 upon gate spacer layer 3510, and a top spacer layer 3514 upon second ILD layer 3512. The fabrication system further deposits a third ILD layer 3516 upon top spacer layer 3514. In at least one embodiment, first ILD layer 3508, second ILD layer 3512, and third ILD layer 3516 are formed of silicon dioxide (SiO$_2$). In at least one embodiment, bottom spacer 3506, gate spacer layer 3510, and top spacer layer 3514 are formed of a low dielectric constant (low-K) material. In particular embodiments, one or more of bottom spacer 3506, first ILD layer 3508, gate spacer layer 3510, second ILD layer 3512, top spacer 3514, and third ILD layer 3516 are formed using an anisotropic deposition process.

Figure 37:
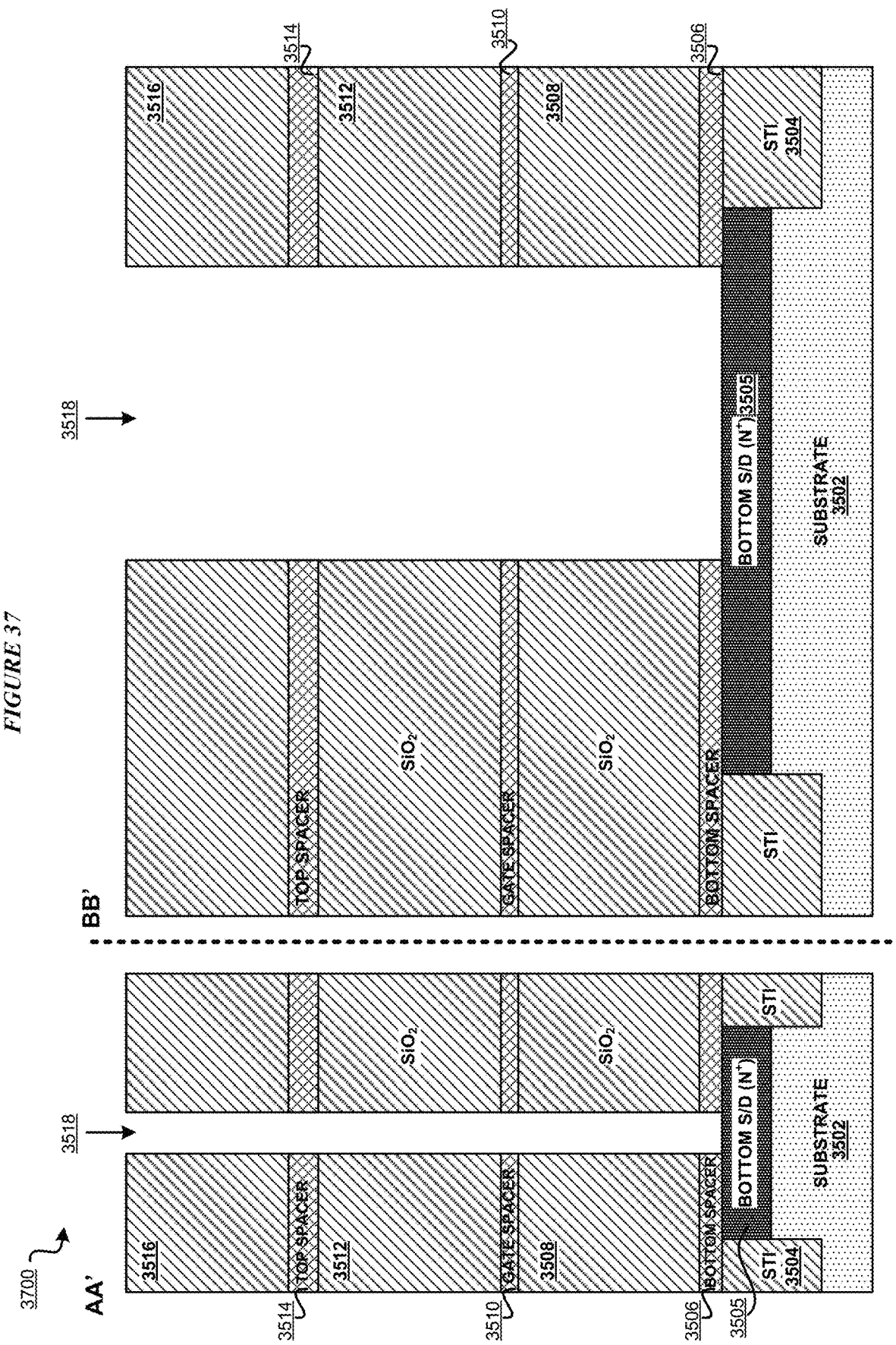
FIG. 37 depicts another portion of the process.

With reference to FIG. 37, this figure depicts a portion of the process in which a structure 3700 is formed. FIG. 37 shows a first cross section view AA' along a first cross section of structure 3700 and a second cross section view BB' along a second cross section of structure 3700. In the embodiment of FIG. 37, the fabrication system forms a fin trench 3518 through third ILD layer 3516, top spacer 3514, second ILD layer 3512, gate spacer 3510, first ILD 3508, bottom spacer 3506 to a top surface of bottom S/D 3505.

Figure 38:
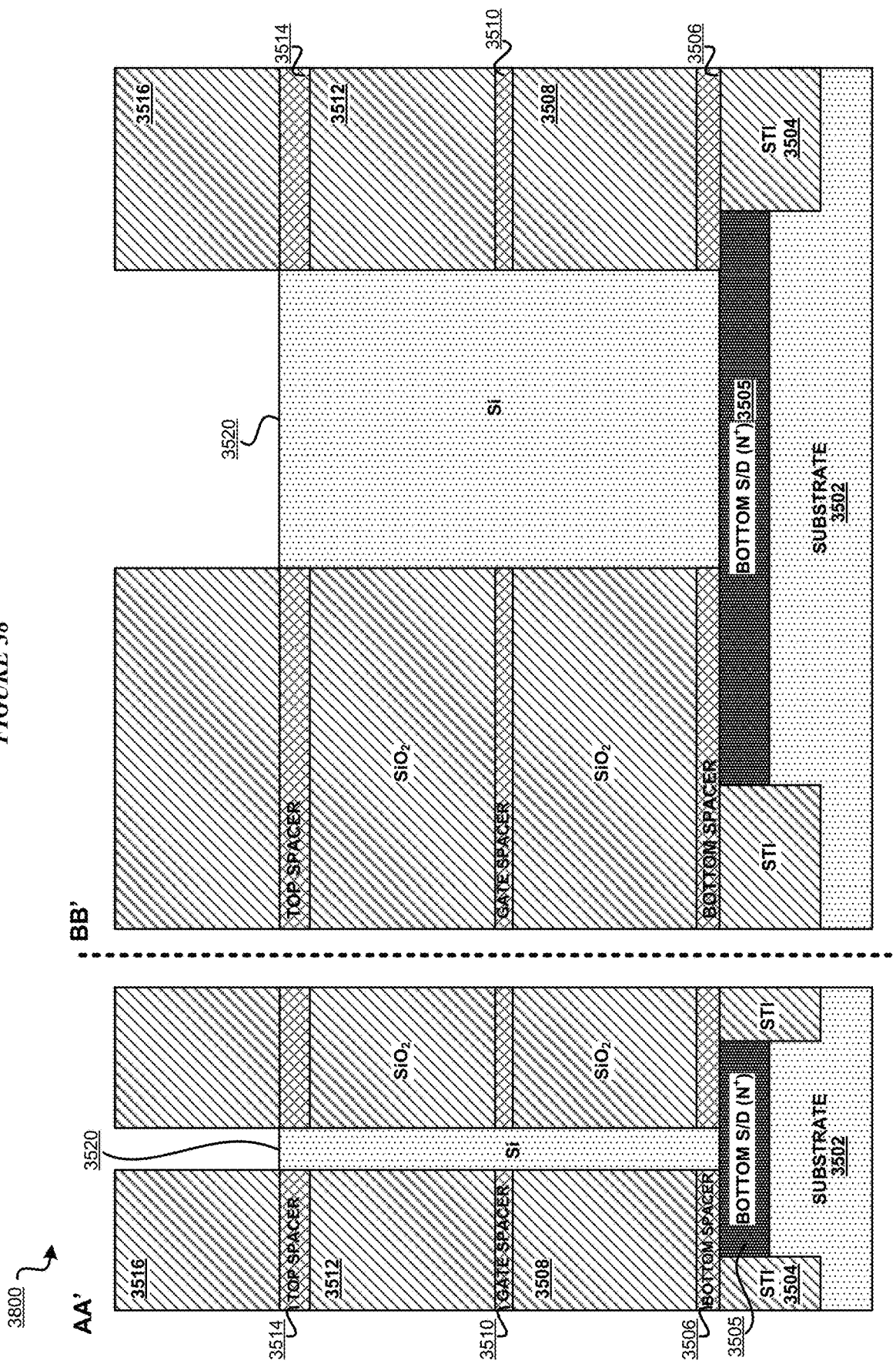
FIG. 38 depicts another portion of the process.

With reference to FIG. 38, this figure depicts a portion of the process in which a structure 3800 is formed. FIG. 38 shows a first cross section view AA' along a first cross section of structure 3800 and a second cross section view BB' along a second cross section of structure 3800. In the embodiment of FIG. 38, the fabrication system forms a fin 3520 within fin trench 3518 from the top surface of bottom S/D 3505 to approximately a top surface of top spacer 3514.

Figure 39:
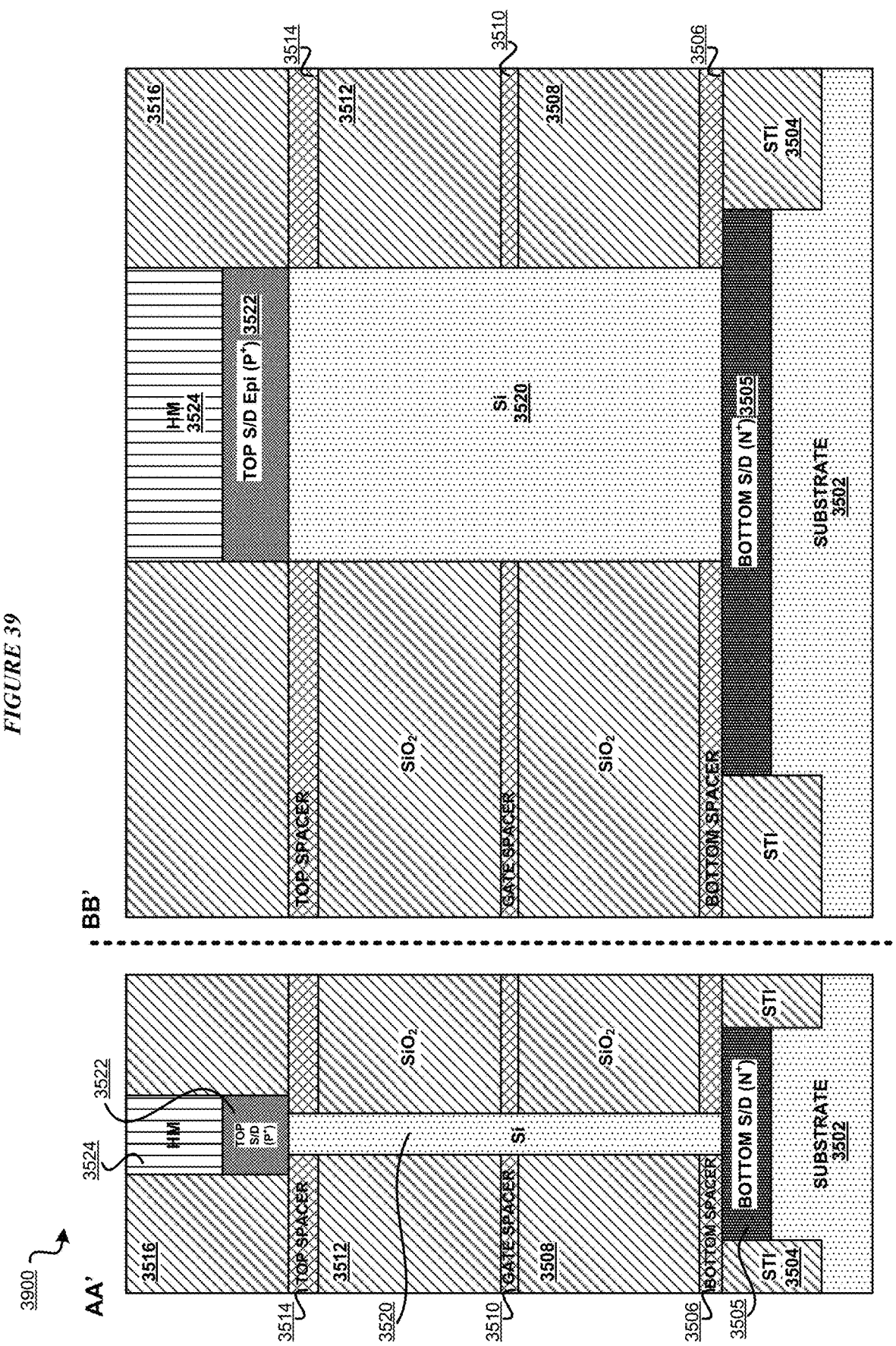
FIG. 39 depicts another portion of the process.

With reference to FIG. 39, this figure depicts a portion of the process in which a structure 3900 is formed. FIG. 39 shows a first cross section view AA' along a first cross section of structure 3900 and a second cross section view BB' along a second cross section of structure 3900. In the embodiment of FIG. 39, the fabrication system forms a top source/drain (S/D) 3522 upon fin 3520 within fin trench 3518. In one or more embodiments, top S/D 1844 is formed using a epitaxy process. In one or more embodiments, top S/D 1844 is formed of a p-type (p+) material. In the embodiment, the fabrication system forms a hard mask 3524 upon a top surface of top S/D 3522 within fin trench 3518 to a top surface of third ILD layer 3516.

Figure 40:
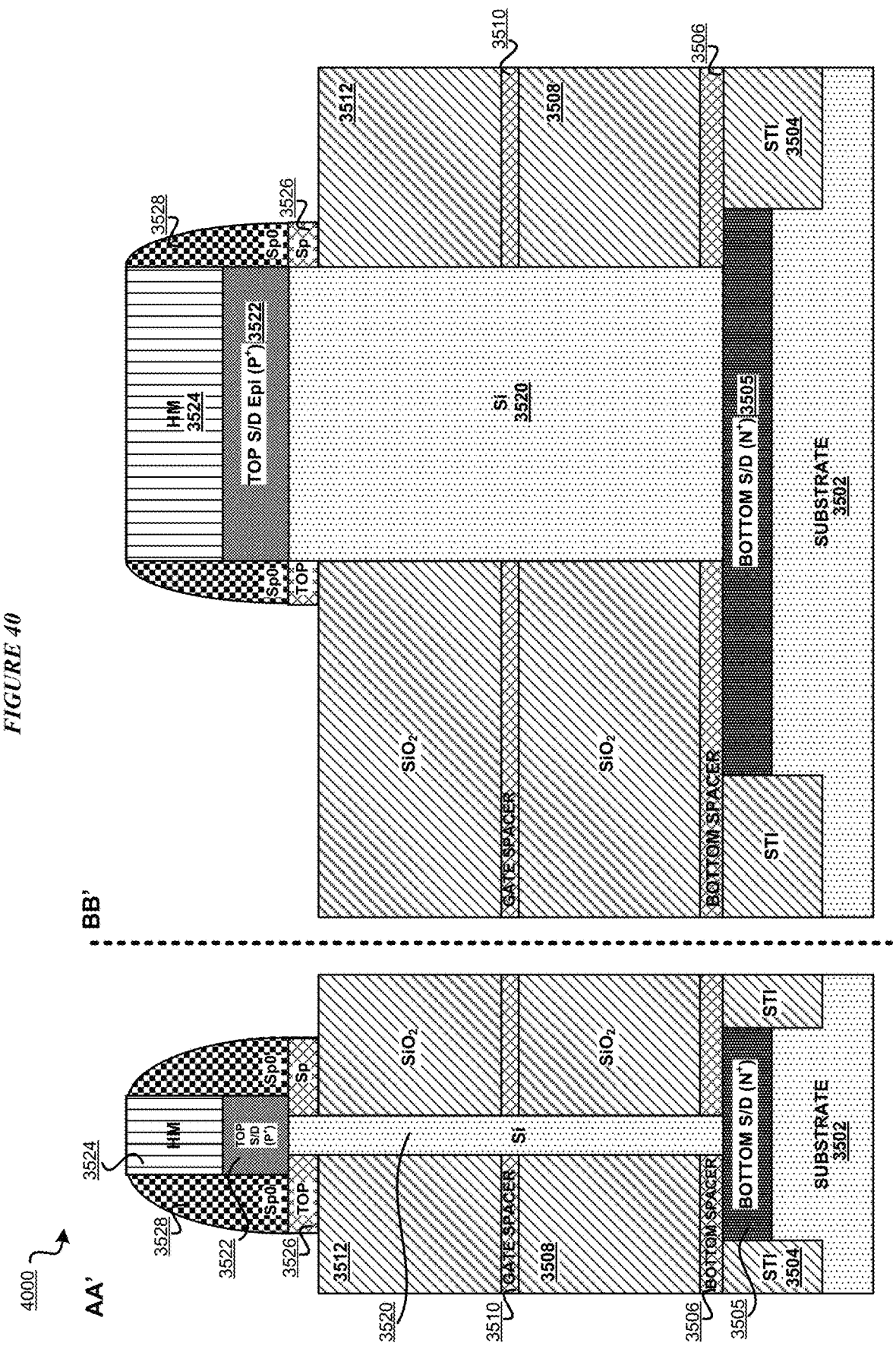
FIG. 40 depicts another portion of the process.

With reference to FIG. 40, this figure depicts a portion of the process in which a structure 4000 is formed. FIG. 40 shows a first cross section view AA' along a first cross section of structure 4000 and a second cross section view BB' along a second cross section of structure 4000. In the embodiment of FIG. 40, the fabrication system removes third ILD layer 3516, performs conformal deposition of main spacer material 3528 on spacer layer 3514, top S/D contract 3522, and hard mask 3524. The fabrication system further performs an anisotropic RIE of spacer layer 3514 and main spacer material 3528 to form top spacer 3526 and sidewall spacer (main spacer) 3528, respectively.

Figure 41:
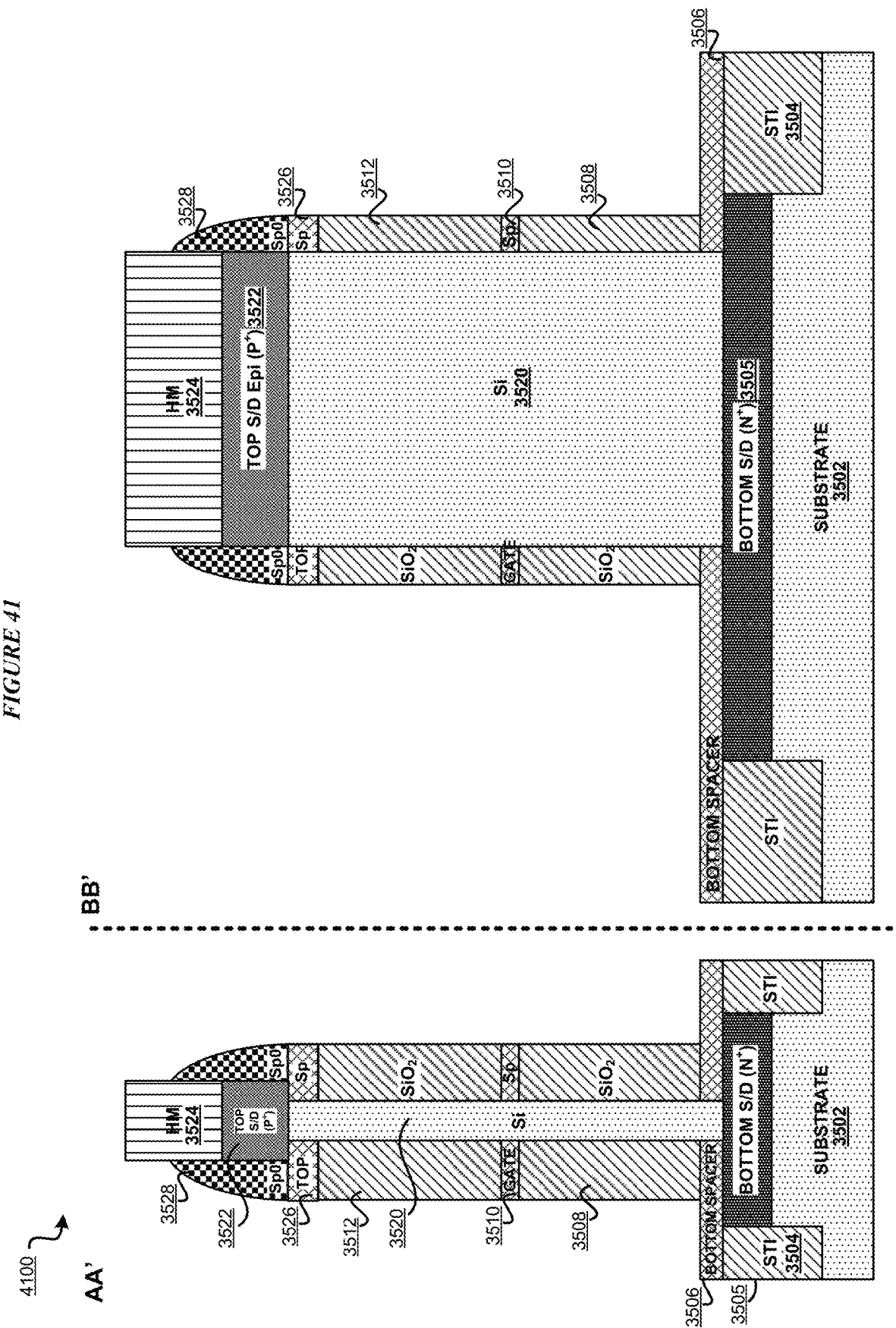
FIG. 41 depicts another portion of the process.

With reference to FIG. 41, this figure depicts a portion of the process in which a structure 4100 is formed. FIG. 41 shows a first cross section view AA' along a first cross section of structure 4100 and a second cross section view BB' along a second cross section of structure 4100. In the embodiment of FIG. 41, the fabrication system etches portions of second ILD layer 3512, gate spacer layer 3510, and first ILD layer 3508 down to the upper surface of bottom spacer 3506 to form a dummy gate. In the embodiment of FIG. 41, portions of first ILD layer 3508 disposed between bottom spacer 3506 and gate spacer 3510 remain, and portions of second ILD layer 3512 disposed between gate spacer 3510 and top spacer 3514 remain. In particular embodiments, the fabrication system etches portions of second ILD layer 3512, gate spacer layer 3510, and first ILD layer 3508 using an RIE process.

With reference to FIG. 42, this figure depicts a portion of the process in which a structure 4200 is formed. FIG. 42 shows a first cross section view AA' along a first cross section of structure 4200 and a second cross section view BB' along a second cross section of structure 4200. In the embodiment of FIG. 42, the fabrication system selectively removes the dummy gate including the remaining portions of second ILD layer 1816 and first ILD layer 3508 leaving gate spacer 3510 disposed along fin 3520. In a particular embodiment, the fabrication system removes the remaining portions of second ILD layer 1816 and first ILD layer 3508 using an isotropic etch back process.

Figure 43:
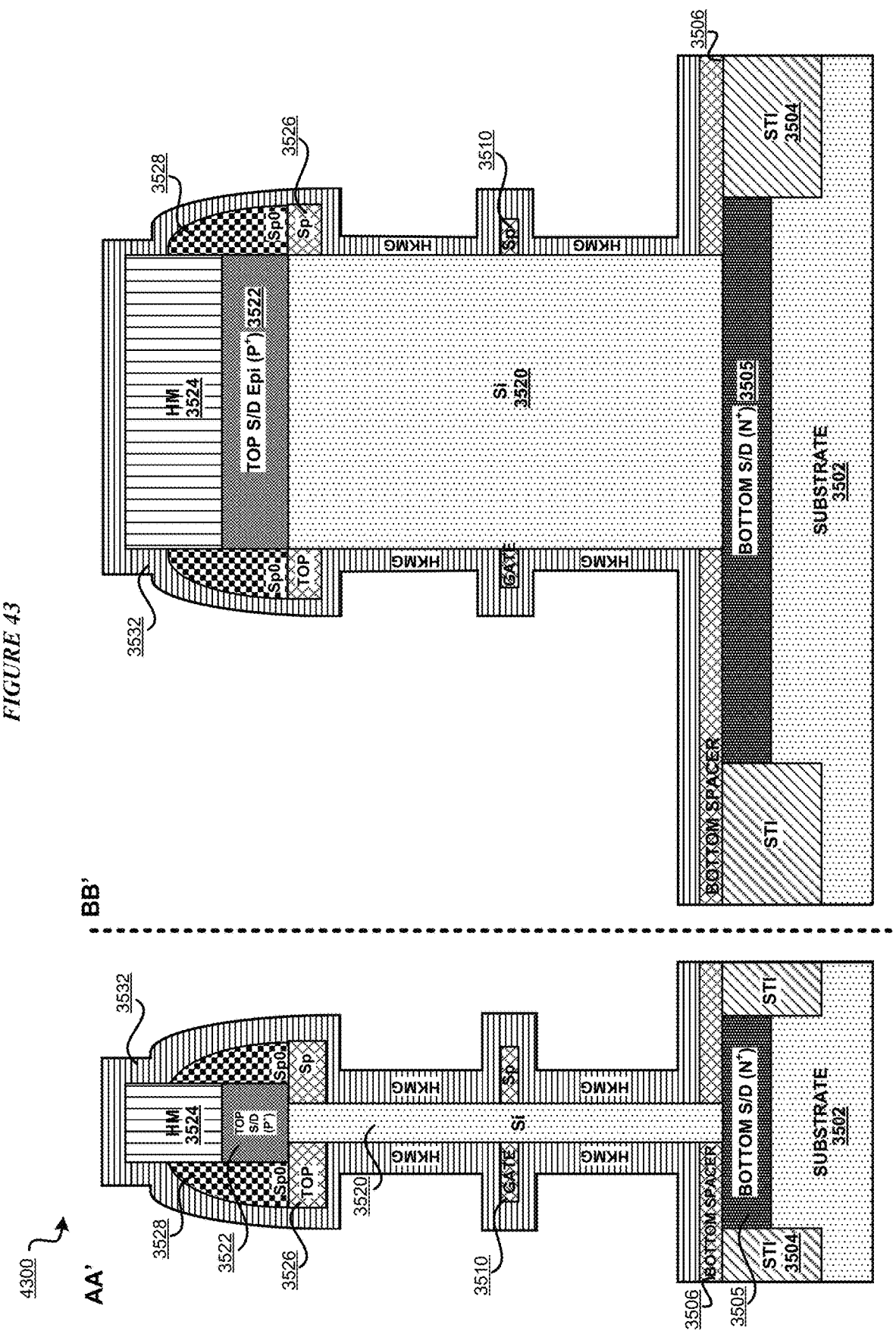
FIG. 43 depicts another portion of the process.

With reference to FIG. 43, this figure depicts a portion of the process in which a structure 4300 is formed. FIG. 43 shows a first cross section view AA' along a first cross section of structure 4300 and a second cross section view BB' along a second cross section of structure 4300. In the embodiment of FIG. 43, the fabrication system deposits a gate material 3522 upon bottom spacer 3506, fin 3508, gate spacer 3510, top spacer 3526, sidewall spacer 3528, and hard mask 3524. In a particular embodiment, gate material 1826 includes an Interlayer Oxide (IL), a gate oxide with high dielectric constant (High-K material such as HfO2) and one or several layers of work function metals (such as TiN, TiC, . . . ).

Figure 44:
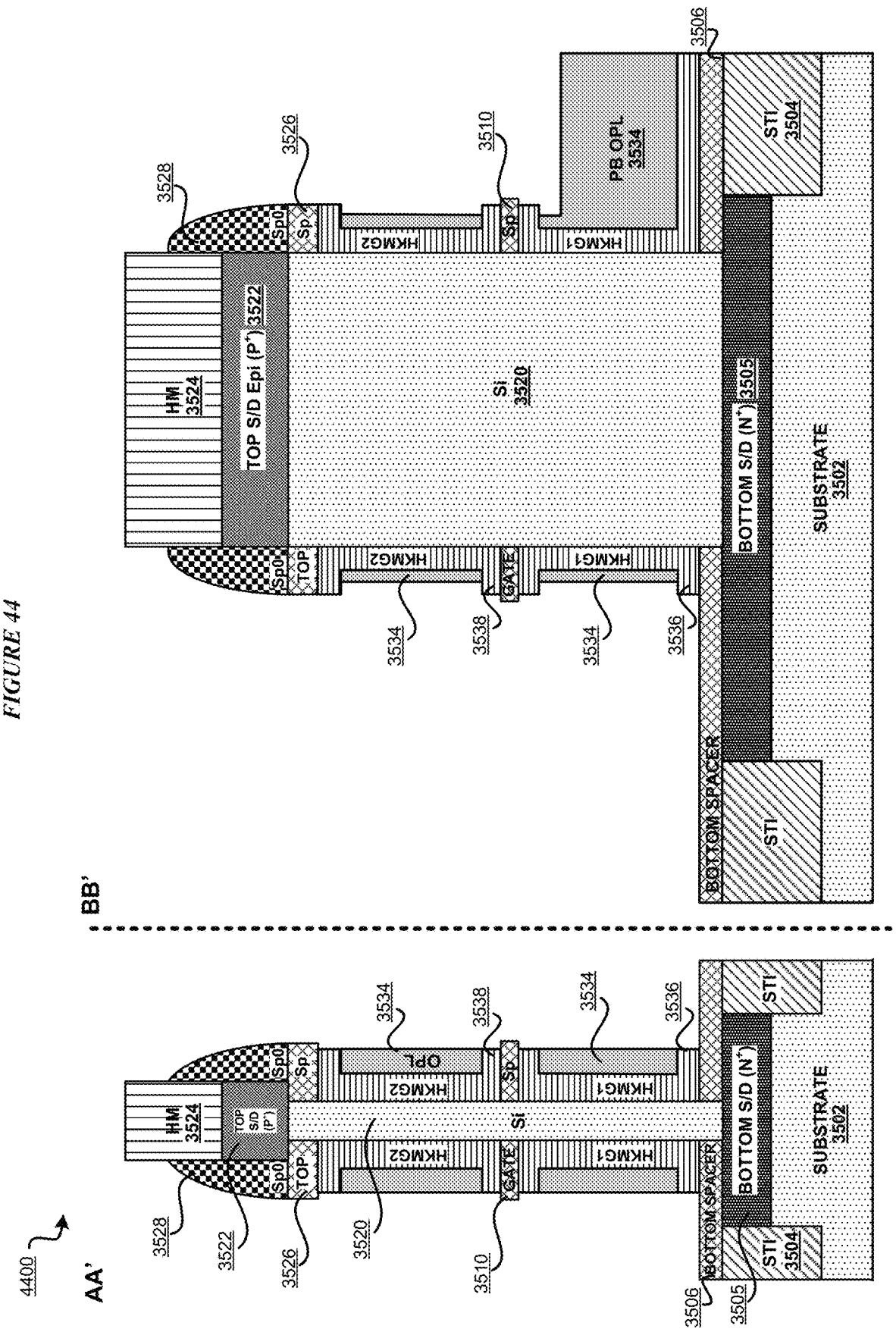
FIG. 44 depicts another portion of the process.

With reference to FIG. 44, this figure depicts a portion of the process in which a structure 4400 is formed. FIG. 44 shows a first cross section view AA' along a first cross section of structure 4400 and a second cross section view BB' along a second cross section of structure 4400. In the embodiment of FIG. 44, the fabrication system forms a first gate 3536 between bottom spacer 3506 and gate spacer 3510, and a second gate 3538 between gate spacer 3510 and top spacer 3526 by removing portions of gate material 3532. In a particular embodiment, the fabrication system removes portions of gate material 3532 using an anisotropic RIE process. In the embodiment, the fabrication system deposits an organic planarization layer (OPL) 3534 upon portions of first gate 3536 and second gate 3538, and performs lithographic patterning upon first gate 3536 and second gate 3538.

Figure 45:
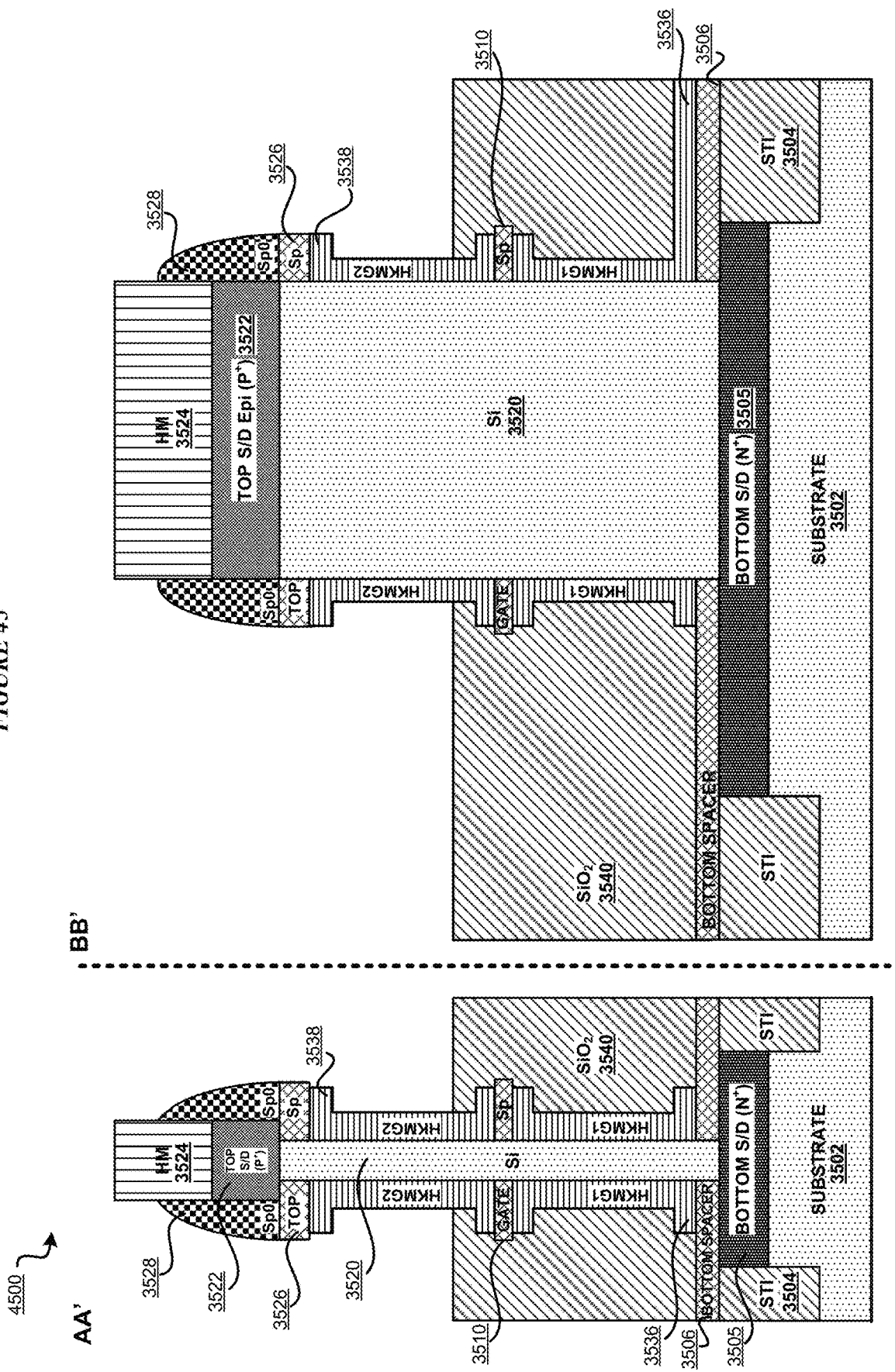
FIG. 45 depicts another portion of the process.

With reference to FIG. 45, this figure depicts a portion of the process in which a structure 4500 is formed. FIG. 45 shows a first cross section view AA' along a first cross section of structure 4500 and a second cross section view BB' along a second cross section of structure 4500. In the embodiment of FIG. 45, the fabrication system strips OPL 3534 and deposits dielectric material 3540 upon bottom spacer 3506 and a portion of first gate 3536.

Figure 46:
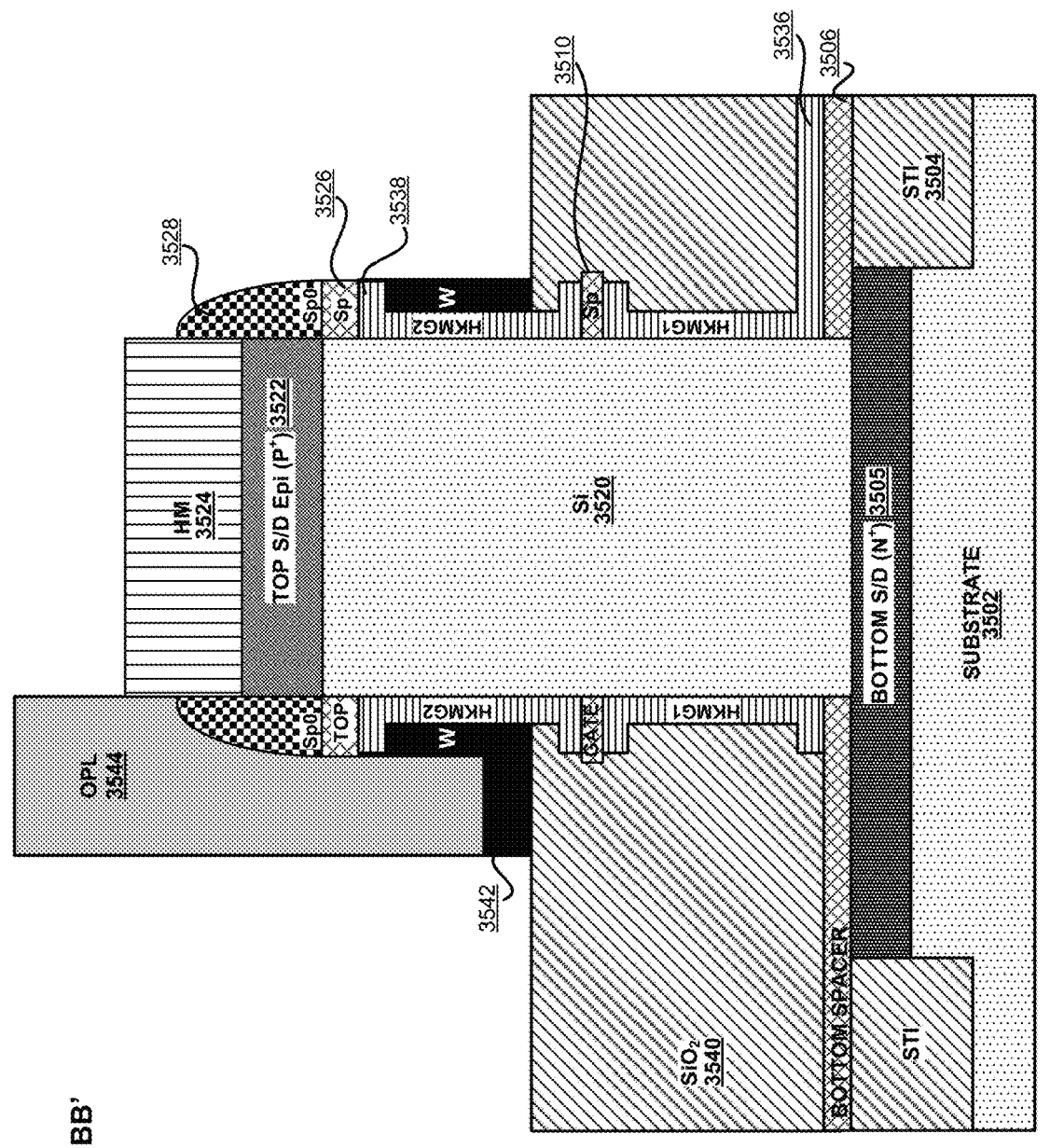
FIG. 46 depicts another portion of the process.

With reference to FIG. 46, this figure depicts a portion of the process in which a structure 4600 is formed. FIG. 46 shows a first cross section view AA' along a first cross section of structure 4600 and a second cross section view BB' along a second cross section of structure 4600. In the embodiment of FIG. 46, the fabrication system deposits tungsten contact material 3542 on dielectric material 3540 and a portion of second gate 3538. In the embodiment, the fabrication system further applies an OPL 3544 to tungsten contact material 3542 and second gate 3538 and lithographically patterns second gate 3538. The fabrication system then removes OPL 3544.

Figure 47:
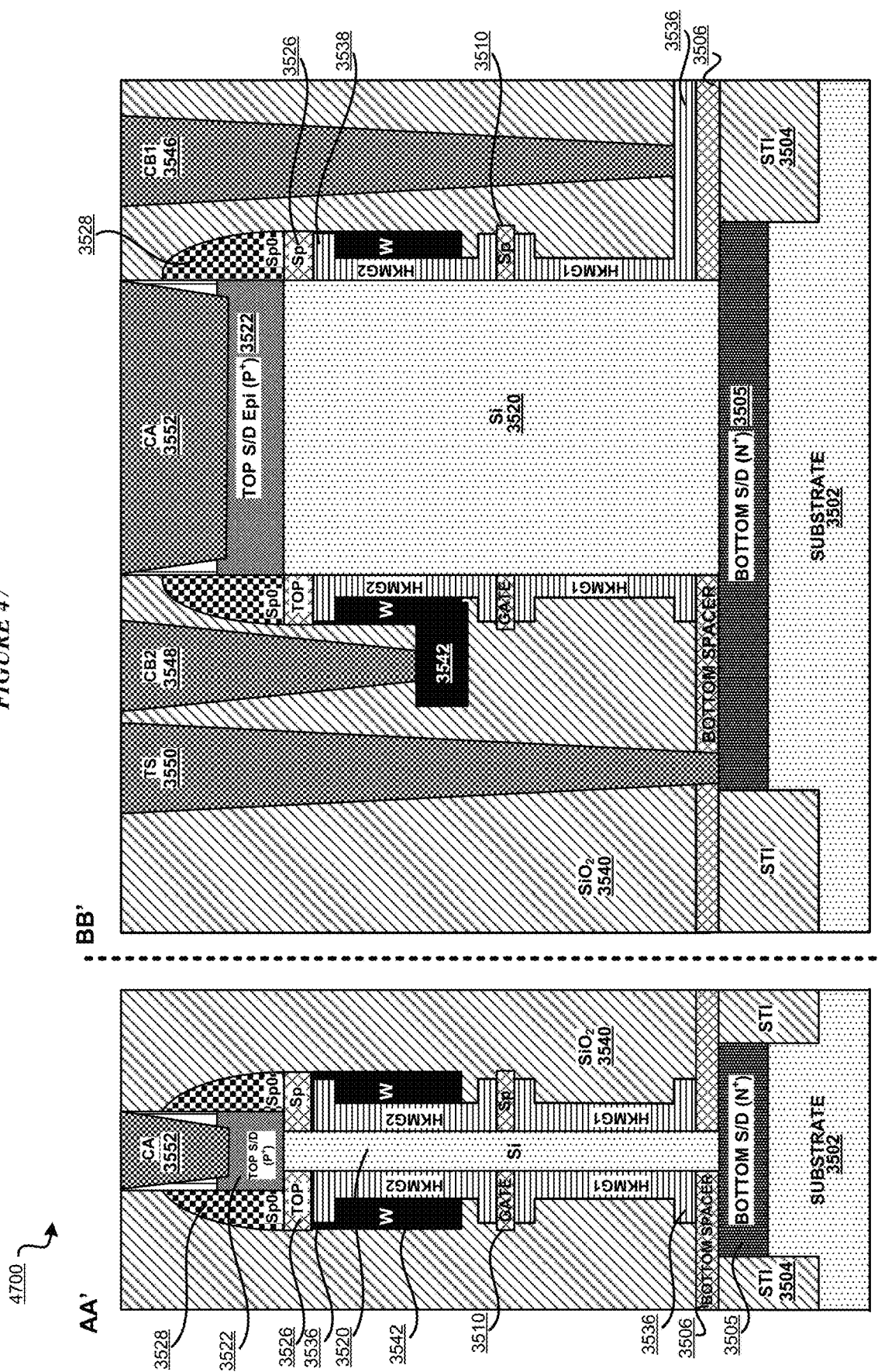
FIG. 47 depicts another portion of the process.

With reference to FIG. 47, this figure depicts a portion of the process in which a structure 4700 is formed. FIG. 47 shows a first cross section view AA' along a first cross section of structure 4700 and a second cross section view BB' along a second cross section of structure 4700. In the embodiment of FIG. 47, the fabrication system deposits additional dielectric material 3540 to fill recesses of structure 4700 to a top surface of hard mask 3524. In the embodiment, the fabrication system forms a first gate contact 3546, a second gate contact 3548, a bottom S/D contact 3550, and a top S/D contact 3552 within dielectric material 3540. First gate contact 3546 is formed in contact with first gate 3536 and extends to a top surface of dielectric material 3540. Second gate contact 3548 is formed in contact with tungsten contact material 3542 and extends to the top surface of dielectric material 3540. Bottom S/D contact 3550 is formed in contact with bottom S/D 3505 and extends to the top surface of dielectric material 3540, and top S/D contact 3552 is formed in contact with top S/D 3522 and extends to the top surface of dielectric material 3540. Accordingly, a VFET with dual-gate feedback loop is fabricated in accordance with an embodiment.

Figure 48:
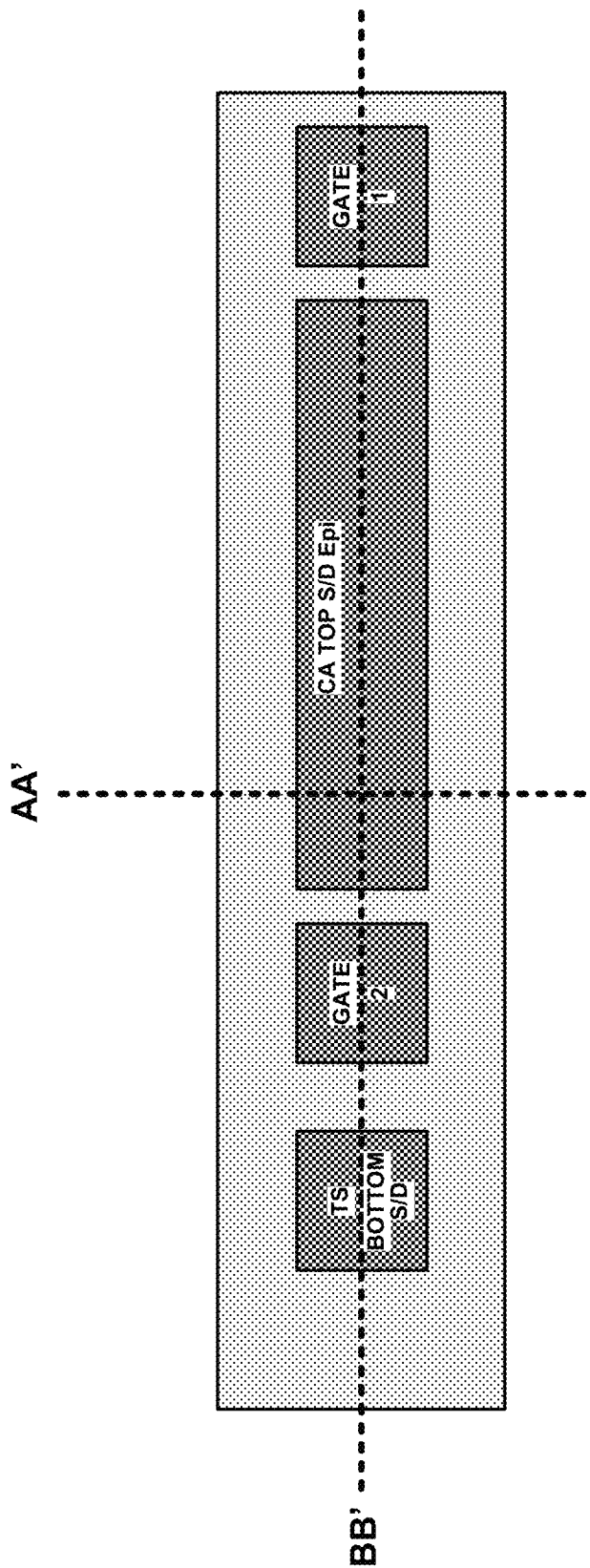
FIG. 48 depicts a top view of the VFET with dual-gate feedback loop of FIG. 47.

With reference to FIG. 48, this figure depicts a top view 4800 of the VFET with dual-gate feedback loop of FIG. 47. FIG. 48 further illustrates in a top view the first cross-section AA' line and second cross-section BB' line of FIG. 47.

Figure 49:
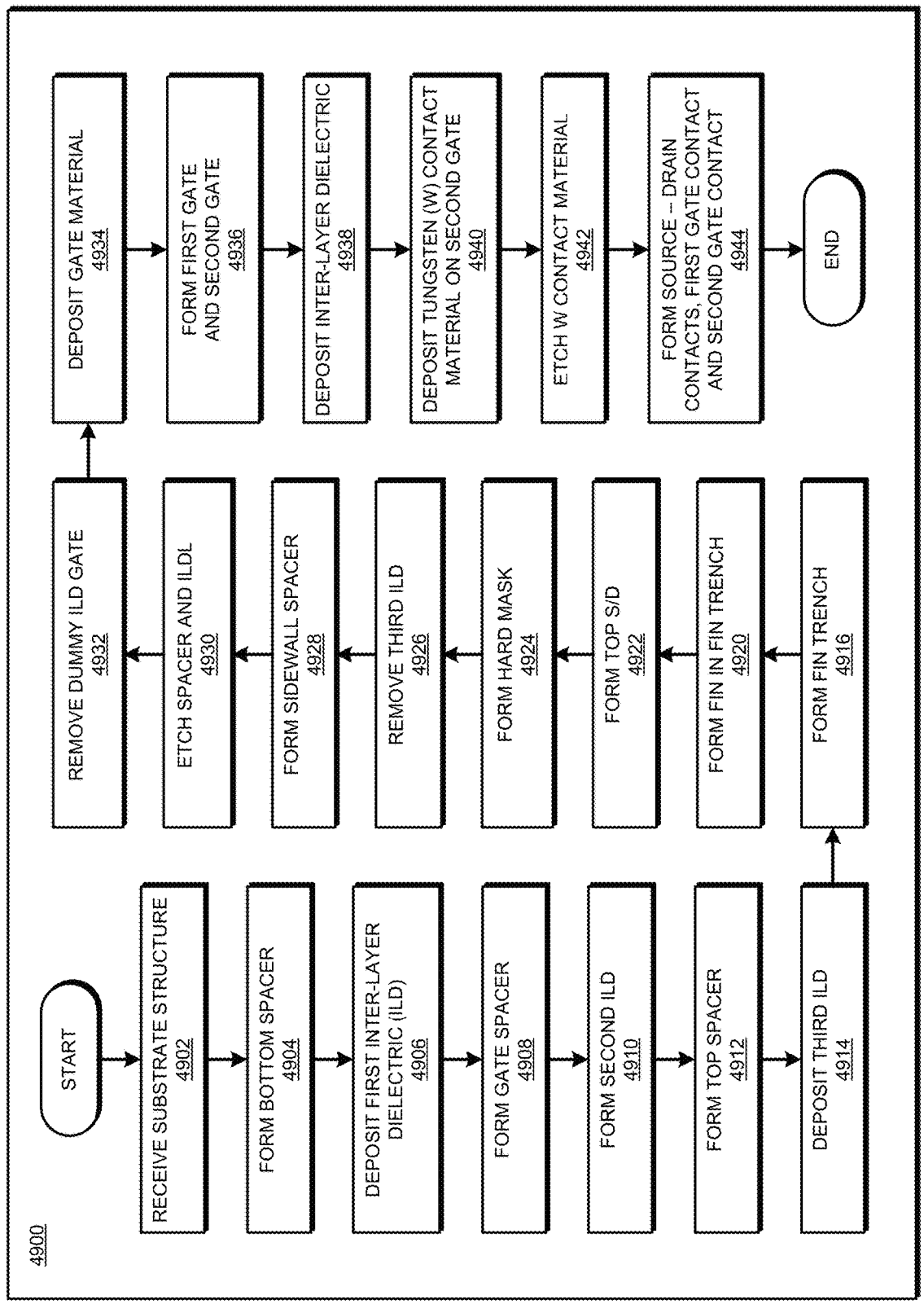
FIG. 49 depicts a flowchart of another example process for fabricating a VFET with dual-gate feedback loop in accordance with another illustrative embodiment.

With reference to FIG. 49, this figure depicts a flowchart of another example process 4900 for fabricating a VFET with dual-gate feedback loop in accordance with another illustrative embodiment. In block 4902, the fabrication system receives a semiconductor structure including a substrate 3502 and a shallow trench isolation (STI) layer 2504 disposed upon substrate 3502. The structure further includes a bottom source/drain (S/D) 3505 disposed upon substrate 3502. In one or more embodiments, bottom S/D 3505 is formed of a n-type (n+) material. In particular embodiments, STI layer 3504 and bottom S/D 3505 are formed using conventional processes that are well-known in the art. In block 4904, the fabrication system forms bottom spacer 3506 disposed upon a portion of STI 3504 and bottom S/D 3505.

In block 4906, the fabrication system deposits first ILD layer 3508 upon bottom spacer 3506. In block 4908, the fabrication system forms gate spacer layer 3510 upon first ILD layer 3508. In block 4910, the fabrication system deposits second ILD layer 3512 upon gate spacer layer 3510. In block 4912, the fabrication system forms top spacer layer 3514 upon second ILD layer 3512. In block 4914, the fabrication system further deposits third ILD layer 3516 upon top spacer layer 3514. In at least one embodiment, first ILD layer 3508, second ILD layer 3512, and third ILD layer 3516 are formed of silicon dioxide ($SiO_2$). In at least one embodiment, bottom spacer 3506, gate spacer layer 3510, and top spacer layer 3514 are formed of a low dielectric constant (low-K) material. In particular embodiments, one or more of bottom spacer 3506, first ILD layer 3508, gate spacer layer 3510, second ILD layer 3512, top spacer 3514, and third ILD layer 3516 are formed using an anisotropic deposition process.

In block 4916, the fabrication system forms fin trench 3518 through third ILD layer 3516, top spacer 3514, second ILD layer 3512, gate spacer 3510, first ILD 3508, bottom spacer 3506 to a top surface of bottom S/D 3505. In block 4920, the fabrication system forms fin 3520 within fin trench 3518 from the top surface of bottom S/D 3505 to approximately a top surface of top spacer 3514. In block 4922, the fabrication system forms a top source/drain (S/D) 3522 upon fin 3520 within fin trench 3518. In one or more embodiments, top S/D 1844 is formed using a epitaxy process. In one or more embodiments, top S/D 1844 is formed of a p-type (p+) material.

In block 4924, the fabrication system forms a hard mask 3524 upon a top surface of top S/D 3522 within fin trench 3518 to a top surface of third ILD layer 3516. In block 4926, the fabrication system removes third ILD layer 3516 and etches spacer layer 3514 to form top spacer 3526. In block 4928, the fabrication system forms sidewall spacer 2528 by depositing a conformal low-K dielectric material and etching the low-K dielectric material upon top spacer 3526 around an upper portion of fin 3520 and hard mask 3524. In a particular embodiment, the etching process is a reactive-ion etching (RIE) process.

In block 4930, the fabrication system portions of second ILD layer 3512, gate spacer layer 3510, and first ILD layer 3508 down to the upper surface of bottom spacer 3506 to form a dummy stack. In the embodiment portions of first ILD layer 3508 disposed between bottom spacer 3506 and gate spacer 3510 remain, and portions of second ILD layer 3512 disposed between gate spacer 3510 and top spacer 3514 remain. In particular embodiments, the fabrication system etches portions of second ILD layer 3512, gate spacer layer 3510, and first ILD layer 3508 using an RIE process.

In block 4932, the fabrication system selectively removes the dummy gate including the remaining portions of second ILD layer 1816 and first ILD layer 3508 leaving gate spacer 3510 disposed along fin 3520. In a particular embodiment, the fabrication system removes the remaining portions of second ILD layer 1816 and first ILD layer 3508 using an isotropic etch back process. In block 4934, the fabrication system deposits a gate material 3522 upon bottom spacer 3506, fin 3508, gate spacer 3510, top spacer 3526, sidewall spacer 3528, and hard mask 3524. In a particular embodiment, gate material 1826 includes an Interlayer Oxide (IL), a gate oxide with high dielectric constant (High-K material such as HfO2) and one or several layers of work function metals (such as TiN, TiC, . . . ).

In block 4936, the fabrication system forms a first gate 3536 between bottom spacer 3506 and gate spacer 3510, and a second gate 3538 between gate spacer 3510 and top spacer 3526 by removing portions of gate material 3532. In a particular embodiment, the fabrication system removes portions of gate material 3532 using an anisotropic RIE process. In the embodiment, the fabrication system deposits an organic planarization layer (OPL) 3534 upon portions of first gate 3536 and second gate 3538, and performs lithographic patterning upon first gate 3536 and second gate 3538.

In block 4938, the fabrication system strips OPL 3534 and deposits inter-layer dielectric (ILD) material 3540 upon bottom spacer 3506 and a portion of first gate 3536. In block 4940, the fabrication system deposits tungsten contact material 3542 on dielectric material 3540 and a portion of second gate 3538. In block 4942, the fabrication system etches a portion of tungsten contact material 3542. In the embodiment, the fabrication system further applies an OPL 3544 to tungsten contact material 3542 and second gate 3538 and lithographically patterns second gate 3538. The fabrication system then removes OPL 3544. In the embodiment, the fabrication system deposits additional dielectric material 3540 to fill recesses of structure 4700 to a top surface of hard mask 3524.

In block 4944, the fabrication system forms a first gate contact 3546, a second gate contact 3548, a bottom S/D contact 3550, and a top S/D contact 3552 within dielectric material 3540. First gate contact 3546 is formed in contact with first gate 3536 and extends to a top surface of dielectric material 3540. Second gate contact 3548 is formed in contact with tungsten contact material 3542 and extends to the top surface of dielectric material 3540. Bottom S/D contact 3550 is formed in contact with bottom S/D 3505 and extends to the top surface of dielectric material 3540, and top S/D contact 3552 is formed in contact with top S/D 3522 and extends to the top surface of dielectric material 3540. The process then ends. Accordingly, a VFET with dual-gate feedback loop is fabricated by the process in accordance with another embodiment.

Thus, a computer implemented method, system or apparatus, and computer program product are provided in the illustrative embodiments for fabricating feedback VFETs and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for fabricating a feedback field effect transistor, comprising:
   receiving a semiconductor structure including a substrate, a first source/drain disposed on the substrate, a fin disposed on the first source/drain, and a hard mask disposed on a top surface of the fin;
   forming a bottom spacer on a portion of the first source/drain;
   depositing a first dielectric layer on the bottom spacer;
   forming a gate spacer upon the first dielectric layer;
   depositing a second dielectric layer on the gate spacer;
   forming a top spacer on the second dielectric layer;
   forming a sidewall spacer on the top spacer around a portion of the hard mask;
   depositing a gate material on portions of the bottom spacer, the fin, and the gate spacer;
   forming a first gate between the bottom spacer and gate spacer by removing portions of the gate material; and
   forming a second gate between the gate spacer and the top spacer by removing portions of the gate material;
   etching the hard mask;
   forming a recess in the sidewall spacer;
   forming a second source/drain in the recess;
   depositing a first contact material in contact with the first gate;
   depositing a first dielectric material in contact with the first contact material;
   depositing a second contact material on the first dielectric material in contact with the second gate;
   forming a first gate contact within the first dielectric material and in contact with the first contact material; and
   forming a second gate contact within the first dielectric material and in contract with the second contact material.

2. The method of claim 1, wherein the first contact material includes tungsten.

3. The method of claim 1, wherein the first dielectric material includes an inter-layer dielectric material.

4. The method of claim 1, further comprising:
   forming a first source/drain contact within the first dielectric material and in contact with the first source/drain; and
   forming a second source/drain contact within the first dielectric material and in contact with the second source/drain.

* * * * *